United States Patent [19]

Sotokawa et al.

[11] Patent Number: 5,536,584

[45] Date of Patent: Jul. 16, 1996

[54] POLYIMIDE PRECURSOR, POLYIMIDE AND METALIZATION STRUCTURE USING SAID POLYIMIDE

[75] Inventors: Hideo Sotokawa; Fusaji Shoji; Fumio Kataoka, all of Yokohama, Japan

[73] Assignee: Hitachi, Ltd., Tokyo, Japan

[21] Appl. No.: 11,493

[22] Filed: Jan. 29, 1993

[30] Foreign Application Priority Data

Jan. 31, 1992 [JP] Japan ................................. 4-016670
Feb. 20, 1992 [JP] Japan ................................. 4-033150

[51] Int. Cl.[6] ......................................... B32B 15/08
[52] U.S. Cl. .................. 428/458; 428/473.5; 428/901; 528/353
[58] Field of Search .................................. 528/353, 350; 428/473.5, 901, 458

[56] References Cited

U.S. PATENT DOCUMENTS

| | | | |
|---|---|---|---|
| 4,736,012 | 4/1988 | Shoji et al. | 528/353 |
| 4,764,413 | 8/1988 | Nukii et al. | 428/901 |
| 5,037,709 | 8/1991 | Tomomura et al. | 428/901 |
| 5,059,677 | 10/1991 | Kohtoh et al. | 528/353 |
| 5,272,247 | 12/1993 | Sotokawa et al. | 528/173 |

FOREIGN PATENT DOCUMENTS

| | | |
|---|---|---|
| 57-114258 | 7/1982 | Japan . |
| 57-188853 | 11/1982 | Japan . |
| 60-221426 | 11/1985 | Japan . |
| 60-250031 | 12/1985 | Japan . |
| 61-60725 | 3/1986 | Japan . |
| 62-184025 | 8/1987 | Japan . |
| 62-231937 | 10/1987 | Japan . |
| 62-231936 | 10/1987 | Japan . |
| 62-232436 | 10/1987 | Japan . |
| 62-231935 | 10/1987 | Japan . |
| 62-265327 | 11/1987 | Japan . |
| 63-10629 | 1/1988 | Japan . |
| 2-86624 | 3/1990 | Japan . |
| 2-67320 | 3/1990 | Japan . |
| 2-60934 | 3/1990 | Japan . |
| 4-171607 | 6/1992 | Japan . |

*Primary Examiner*—Samuel A. Acquah
*Assistant Examiner*—P. Hampton-Hightower
*Attorney, Agent, or Firm*—Antonelli, Terry, Stout & Kraus

[57] ABSTRACT

A metalization structure uses a surface protective film formed of a polyimide that is produced by heating and dehydrating polyimide precursor has its molecular chain composed of recurring units represented by the following general formula (1) and recurring units represented by the following general formula (2):

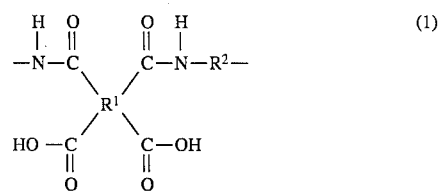

(1)

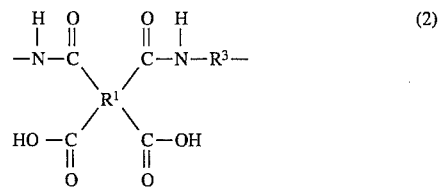

(2)

(where $R^1$ is at least one tetravalent organic group selected from among

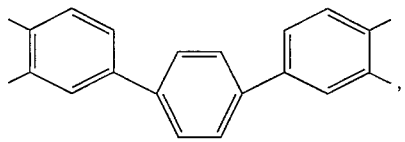

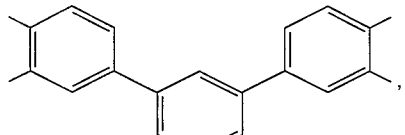

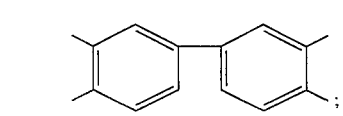

$R^2$ is at least one divalent organic group of a linear structure as selected from among (Abstract continued on next page.)

-continued
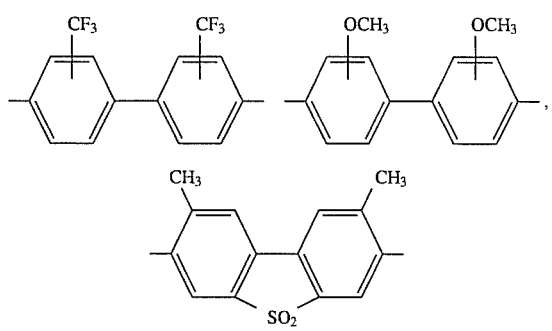
and R³ is a divalent organic group of a crooked structure that has at least two aromatic rings).
43 Claims, 11 Drawing Sheets

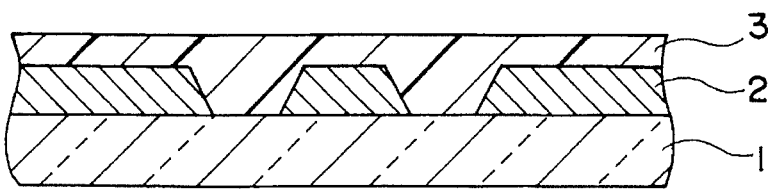
FIG. I (a)
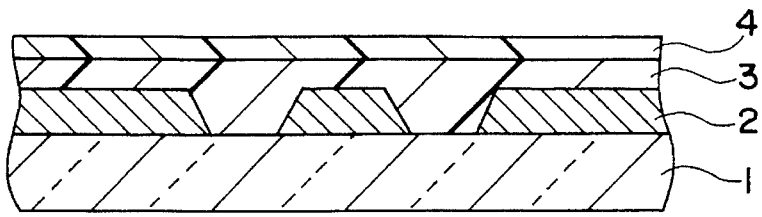
FIG. I (b)
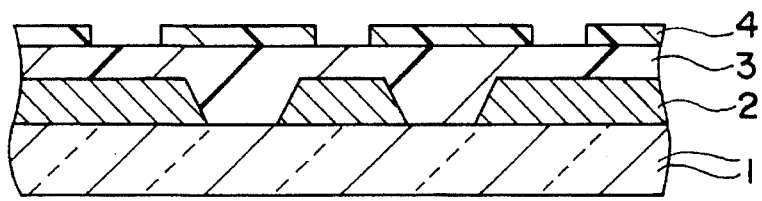
FIG. I (c)
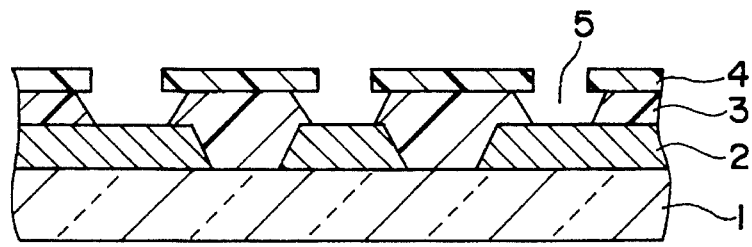
FIG. I (d)
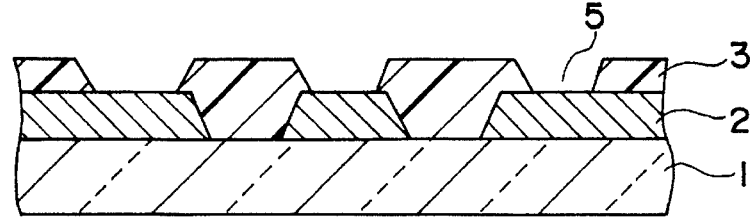
FIG. I (e)
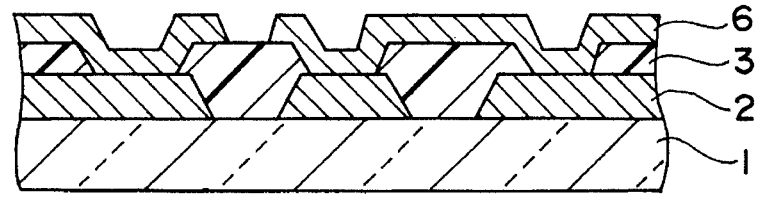
FIG. I (f)

POLYIMIDE PRECURSOR, POLYIMIDE AND METALIZATION STRUCTURE USING SAID POLYIMIDE

BACKGROUND OF THE INVENTION

1) Field of the Invention

This invention relates to a metalization structure that uses a polyimide which has low dielectric constant, low thermal expansion coefficient, high glass transition point and high heat resistance as an insulating material, in particular, a semiconductor device or a multilevel metalization structure that have a high level of integration.

In another aspect, the invention relates to a polyimide that has a low thermal expansion coefficient, a high glass transition point and high heat resistance and which is capable of strong bonding by itself through oxygen ashing. The invention also relates to a precursor of such polyimide, as well as a metalization structure that uses said polyimide as an insulating material, in particular, a semiconductor device or a multilevel metalization structure that have a high level of integration.

2) Description of the Related Art

As increasing efforts are being made to increase the number of layers and the scale of integration in recent models of electronic devices such as semiconductor devices, thereby improving their performance, it has become necessary for the insulating materials used in those devices to possess enhanced characteristics. Most of the insulating materials extensively currently being used in electronic devices are polyimides. Before the advent of polyimides, inorganic films such as SOG, PSG and silicon nitride films were used but they had the problem that it is difficult to flatten out the asperities that occur in the process of fabricating semiconductor devices. Another problem is that these inorganic films are insufficient in mechanical characteristics, particularly, elongation, and hence cracks are prone to occur in those areas where residual stress has developed between layers. To solve these problems, polyimides were introduced and have since been extensively used in the electronics industry.

Polyimides are generally manufactured by a process in which a diamine component is reacted with a tetracarboxylic dianhydride component in an organic solvent to produce a poly(amic acid), which is then cyclized by dehydration.

Polyimides known in the art that are synthesized by this general method include the following.

(A) Novel polyimides containing structural units represented by the general formula (10) or (11):

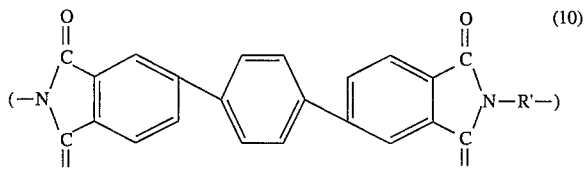

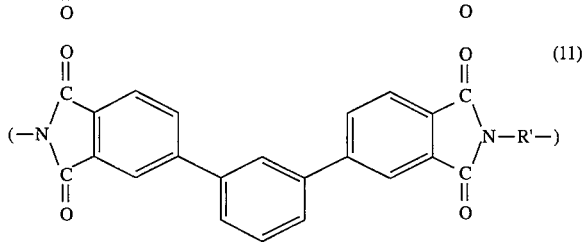

(where R' is a divalent hydrocarbon group), as well as their precursor poly(amic acid) or poly(amic acid) ester (see Unexamined Published Japanese Patent Application Nos. 265327/1987 and 10629/1988);

(B) Polyimides containing structural units represented by the general formula (12):

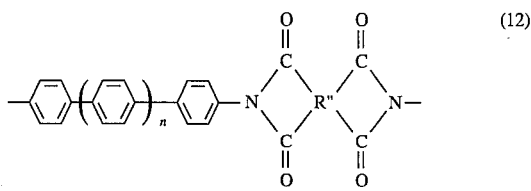

(where R" is a tetravalent aliphatic group or an aromatic group; and n is 1 or 2) (see Unexamined Published Japanese Patent Application Nos. 114258/1982, 188853/1982, 250031/1985 and 221426/1985);

(C) Polyimides containing structural units represented by the general formula (13):

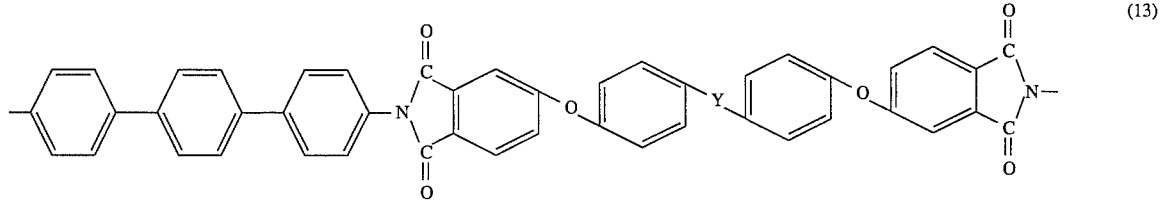

(where Y is $-C(CH_3)_2-$, $-C(CF_3)_2-$ or $-SO_2-$) (see Unexamined Published Japanese Patent Application Nos. 231935/1987, 31936/1987 and 231937/1987);

(D) Polyimides having low dielectric constant that are produced by reacting 2,2-bis(3,4-dicarboxyphenyl)propanoic dianhydride or 2,2-bis(3,4-dicarboxyphenyl)hexafluoropropanoic dianhydride with aromatic diamines such as 4,4'-bis(4-aminophenoxy)biphenyl and 4,4'-bis(4-amino-2-trifluoromethylphenoxy)biphenyl (see Unexamined Published Japanese Patent Application No. 60934/1990); and (E) Polyimides produced by reacting 2,2-bis(4-aminophenyl)hexafluoropropane and 2,2-bis(3-aminophenyl)hexafluoropropane with a mixed acid dianhydride composed of pyromellitic dianhydride and an acid dianhydride having a diarylic nucleus (see Unexamined Published Japanese Patent Application No. 67320/1990), as well as polyimides produced by reacting 2,2'-bis (3,4-dicarboxyphenyl)hexafluoropropanoic dianhydride with 2,2-bis(4- aminophenyl)hexafluoropropane and 2,2-bis(3-aminophenyl)hexafluoropropane (see Unexamined Published Japanese Patent Application No. 86624/1990).

The polyimides (A)–(E), however, have the problem that various desired characteristics including high heat resistance, low dielectric constant, low thermal expansion, good mechanical properties (in particular, high flexibility) and high glass transition point are not given equal consideration. Furthermore, the polyimides (D) and (E) which contain trifluoromethyl groups bound to alkyl chains suffer from the disadvantage of only small ability to withstand organic solvents and alkaline solutions such as electroless plating baths. Hence, the use of those polyimides in fabricating electronic devices such as semiconductor devices and multilevel metalization structures can potentially involve certain problems such as limits to the effort to improve the device performance and difficulties that may be encountered in the implementation of fabrication process.

The polyimides (A)–(C) are satisfactory in terms of heat resistance, thermal expansion and glass transition point but, on the other hand, they have a high dielectric constant in the absence of flexibility. The reason for this may be that: those polyimides have a relatively high content of imide rings in the polymer and contain structural units represented by the general formula (14):

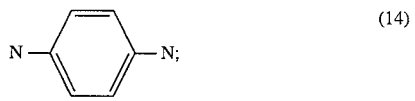

(14)

The polyimides (D) and (E) which contain both —CF$_3$ (trifluoromethyl) groups and —O— bonds are low in dielectric constant and high in flexibility but, on the other hand, they are low in heat resistance and glass transition point, high in thermal expansion coefficient and have only small capability of withstanding alkaline solutions and organic solvents.

If insulating films have high dielectric constant, the delay time of signals propagating through the metalization will increase to lower the speed of signal propagation. Further, the films will become highly hygroscopic, increasing the chance of debonding which can potentially cause corrosion in the metalized part, leading to an increased current leakage. To avoid these problems, the dielectric constant of insulating films is desirably as low as possible. If insulating films have high thermal expansion coefficient, thermal stress will develop between the metalized part and the substrate, potentially causing various problems such as bow of the substrate, separation of the insulating film, occurrence of cracks and broken metalizations. To avoid these problems, the thermal expansion coefficient of insulating films is desirably close to those of the substrate and the metalized part. If insulating films have low glass transition point, their thermal expansion coefficient is high and the temperature at which the expansion coefficient starts to deviate from the values of the metalized part and the substrate will decrease, thereby developing a greater thermal stress. To avoid this problem, the glass transition point of insulating films is desirably as high as possible. If insulating films do not have satisfactory heat resistance, the process operating temperature cannot be adequately increased. If insulating films do not have adequate flexibility or elongation, the thermal stress that may occur cannot be sufficiently absorbed to prevent the separation of insulating films, the occurrence of cracking and broken metalizations.

As the number of layers used in electronic devices increases, the thermal expansion coefficient of polyimide and other organic insulators used in the devices must accordingly be reduced. This is because the thermal expansion of organic insulating films is generally from several to several tens of times as great as that of metallic materials that form metalization or inorganic materials that provide the substrate and this thermal expansion mismatch will cause several disadvantages. First, great thermal expansion mismatch between the metalization material and the insulating material will cause stresses to develop between the two materials, causing broken metalizations or cracked insulating films, thus leading to failures or lower device reliability. Second, the great thermal expansion mismatch between the substrate material and the insulating material will cause so great a bow of the substrate under stress that patterning such as photo-etching of the upper layers cannot be accomplished very precisely and the resulting difficulties in fabrication process will lead to failures and lower device reliability.

With a view to dealing with these problems, polyimides of low thermal expansion have been proposed in Unexamined Published Japanese Patent Application Nos. 114258/1982, 188853/1982, 250031/1985 and 221426/1985. Other examples of such polyimides have been described in Unexamined Published Japanese Patent Application Nos. 60725/1986, 184025/1987 and 232436/1987. However, none of those polyimides have been given consideration for the property of "adequate adhesion" which is regarded as one of the necessary and indispensable characteristics for fabrication of electronic devices. Generally speaking, polyimides having low values of thermal expansion coefficient $\alpha$ ($\leq$20 ppm/°C.) adhere only weakly to substrates, metallic materials and the polyimides themselves compared to polyimides of high thermal expansion ($\alpha \leq$40 ppm/°C.) and, hence, debonding is likely to occur at the interface between the polyimide and the substrate, metalization material or the polyimide itself.

The polyimides of low thermal expansion just mentioned above are not given any consideration for the property of "adhesion" to the substrate, metallic material or the polyimides themselves. If the adhesion is not satisfactory, debonding is prone to occur at all kinds of interfaces and the resulting entrance of water can be a cause of corrosion of the metalized part, leading to lower device reliability or various difficulties involved in the fabrication process to render the completion of electronic devices impossible.

SUMMARY OF THE INVENTION

An object, therefore, of the present invention is to provide a polyimide that is superior to the known polyimides in many characteristics, especially in terms of thermal expansion, heat resistance and bond properties.

Another object of the present invention is to provide semiconductor devices, multilevel metalization structures and all other kinds of electronic devices that use the above-described polyimide and which have high reliability and performance.

The present invention has been accomplished as a result of the intensive studies conducted by the present inventors in order to use, in an insulating layer, a polyimide that possesses the heretofore unattainable characteristics including high heat resistance, low dielectric constant, low thermal expansion, good mechanical properties (in particular, high flexibility), high glass transition point and high alkali resistance, thereby producing a multilevel metalization construction that features short signal delay time, that has a small potential to experience delamination, cracking or broken metalizations under thermal stress, that is less likely to suffer from corrosion and which, hence, has high reliability.

The present invention has also been accomplished as a result of the intensive studies conducted by the present inventors in order to provide high bond properties for polyimides of low thermal expansion, which has heretofore been unattainable, thereby producing a multilevel metalization structure of high performance using said polyimides.

According to its first aspect, the present invention relates to a metalization structure that uses a polyimide produced by heating a precursor, whose the molecular chain of which comprises recurring units represented by the following general formula (1) and recurring units represented by the following general formula (2), in a surface protective film or an α-particle shielding film or a metalization insulating film:

$$\begin{matrix} H & O & & O & H \\ | & \| & & \| & | \\ -N-C & & & C-N-R^2- \\ & \diagdown & \diagup & \\ & & R^1 & \\ & \diagup & \diagdown & \\ HO-C & & & C-OH \\ \| & & & \| \\ O & & & O \end{matrix} \quad (1)$$

$$\begin{matrix} H & O & & O & H \\ | & \| & & \| & | \\ -N-C & & & C-N-R^3- \\ & \diagdown & \diagup & \\ & & R^1 & \\ & \diagup & \diagdown & \\ HO-C & & & C-OH \\ \| & & & \| \\ O & & & O \end{matrix} \quad (2)$$

(where $R^1$ is at least one tetravalent organic group selected from among

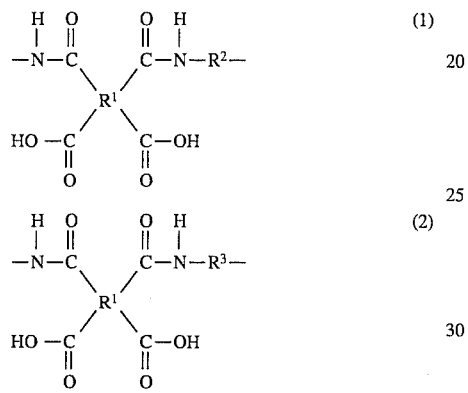

$R^2$ is at least one divalent organic group of a linear structure as selected from among

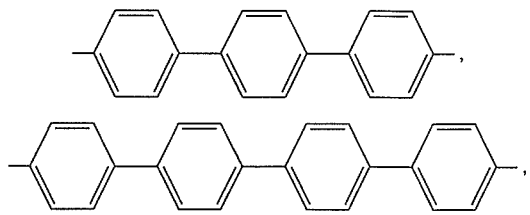

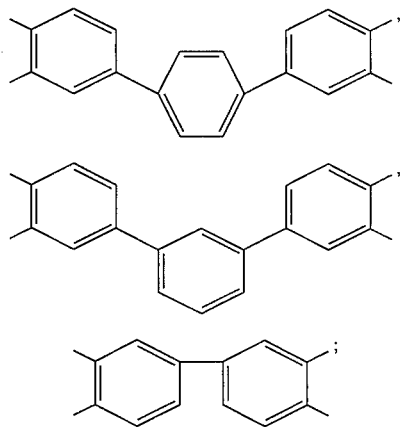

and $R^3$ is a divalent organic group of a crooked structure that has at least two aromatic rings).

According to its second aspect, the present invention provides a polyimide precursor [poly(amic acid)] that contains in the molecular chain a plurality of recurring units represented by the following general formula (21), a polyimide produced by heating the precursor, and an electronic device such as a metalization structure that uses the polyimide in an insulating film:

$$\begin{matrix} H & O & & O & H \\ | & \| & & \| & | \\ -N-C & & & C-N-R^{22}- \\ & \diagdown & \diagup & \\ & & R^{21} & \\ & \diagup & \diagdown & \\ HO-C & & & C-OH \\ \| & & & \| \\ O & & & O \end{matrix} \quad (21)$$

(where $R^{21}$ is a tetravalent organic group; $R^{22}$ is at least one divalent organic group selected from among

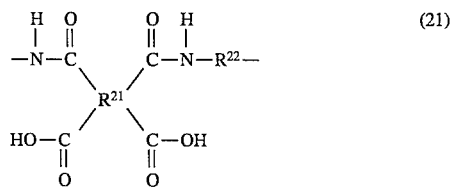

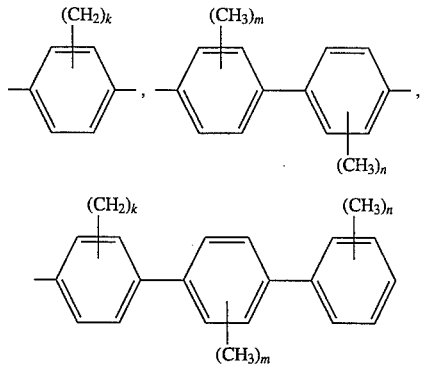

where k, m and n are each an integer of 0–4, provided that they are not zero at the same time).

BRIEF DESCRIPTION OF THE DRAWINGS

FIGS. 1(a)–(f) are cross-sectional views showing an example of the process for fabricating a multilevel metalization structure according to the present invention;

PREFERRED EMBODIMENTS OF THE INVENTION

Figure 2A:
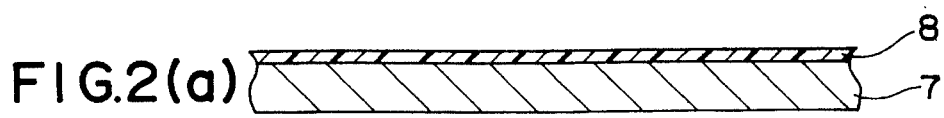
FIGS. 2(a)–(h) are sectional views showing a cross-sectional structure of a DRAM and an example of the process for its fabrication.

As regards the polyimide precursor according to the first aspect of the present invention, the number of divalent organic groups with a linear structure that are represented by $R^2$ in general formula (1) and that of divalent organic groups with a crooked structure that are represented by $R^3$ in general formula (2) are desirably in the ranges of 30–80 and 70–20, respectively, provided that the total number of two kinds of organic groups is 100. If the number of organic groups represented by $R^2$ exceeds 80 or if the number of organic groups represented by $R^3$ is less than 20, the polyimide film produced from the polyimide precursor will have only insufficient flexibility. If the number of organic groups represented by $R^2$ is less than 30 or if the number of organic groups represented by $R^3$ exceeds 70, the glass transition point Tg is undesirably low whereas the thermal expansion coefficient is unduly high. If the polyimide is to be used in multilevel metalization structure and other electronic devices that require much lower thermal expansion, it is more desirable that the number of organic groups represented by $R^2$ is in the range of 50–80 whereas the number of organic groups represented by $R^3$ is in the range of 50–20.

In a preferred embodiment of the first aspect of the present invention, there is provided a metalization structure that uses in a surface protective film or an α-particle shielding film or a metalization insulating film the polyimide that is produced by heating a polyimide precursor that comprises recurring units represented by the following general formula (1), recurring units represented by the following general formula (2) and recurring units represented by the general formula (5) also shown below:

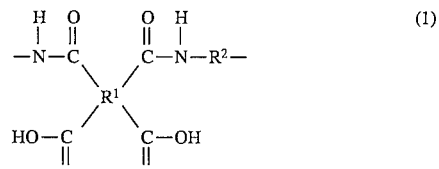 (1)

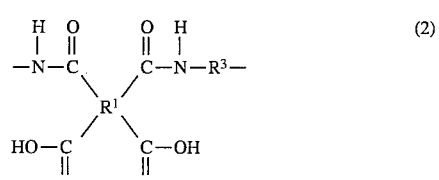 (2)

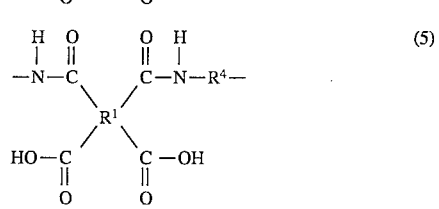 (5)

(where $R^1$ is at least one tetravalent organic group selected from among

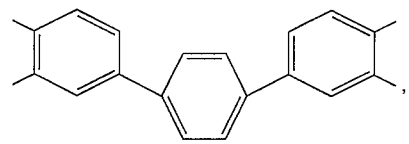,

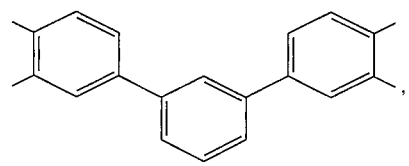,

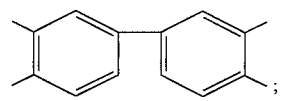;

$R^2$ is at least one divalent organic group of a linear structure as selected from among

,

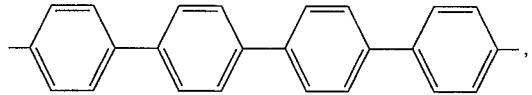,

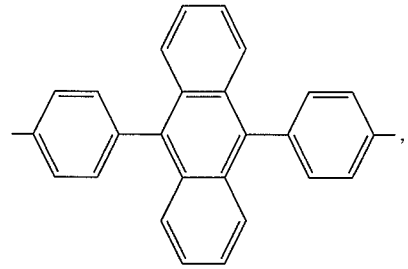,

-continued

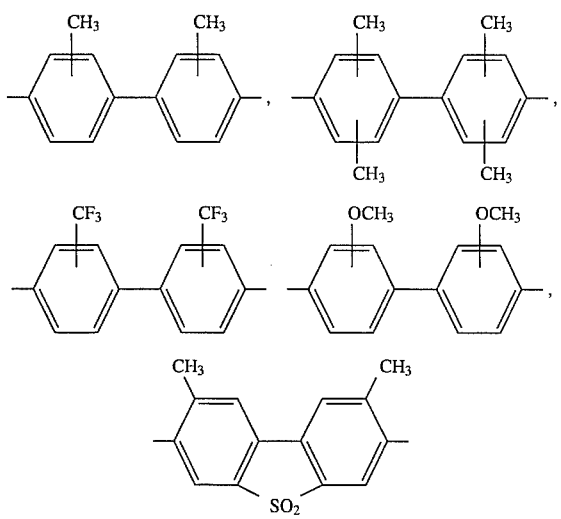

$R^3$ is at least one divalent organic group of a crooked structure that has at least two aromatic rings; $R^4$ is a hydrocarbon group containing one or more silicon atoms that is represented by the following general formula (6) when it is at a terminal end of the polymer or by the following general formula (7) when it is in the polymer backbone:

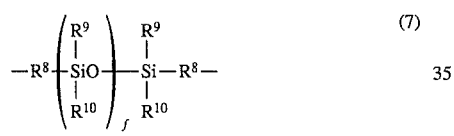

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one group selected from among alkyl, alkoxyalkyl and trialkylsilyl groups that group have 1–5 carbon atoms; $R^9$ and $R^{10}$ are each at least one group selected from among alkyl groups having 1–3 carbon atoms and aryl groups having 1–9 carbon atoms; n is an integer of 0–3; and f is a 1 or 2).

The term "metalization structure" as used in the present invention includes semiconductor integrated circuit devices, discrete transistors and thin-film multilevel wiring boards that may be used in computers, etc.

As regards the polyimide precursor described above, the number of divalent organic groups with a linear structure that are represented by $R^2$ in general formula (1), the number of divalent organic groups with a crooked structure that are represented by $R^3$ in general formula (2) and that of silicon-containing hydrocarbon groups represented by $R^4$ in general formula (2) are desirably in the ranges of 30–80, 70–20 and 0.1–10, respectively, provided that the total number of three kinds of groups is 100. The desirable ranges of the numbers of organic groups represented by $R^2$ and $R^3$ are the same as already specified for the polyimide precursor according to the first general aspect of the present invention. In the particular case under consideration, Si containing hydrocarbon groups represented by $R^4$ are introduced in order to provide improved bond properties. If the content of those groups is less than 0.1%, their effectiveness in improving the bond properties is limited. If their content exceeds 10%, they will cause adverse effects on heat resistance and mechanical properties. More preferably, the proportion of Si containing hydrocarbons represented by $R^4$ is in the range of 0.5–5%.

The polyimide precursor described above can be prepared by the following method which comprises basically reacting a tetracarboxylic dianhydride with at least two diamine components. Stated more specifically, a tetracarboxylic dianhydride component represented by general formula (15):

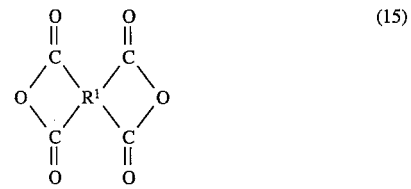

(where $R^1$ is at least one tetravalent organic group selected from among

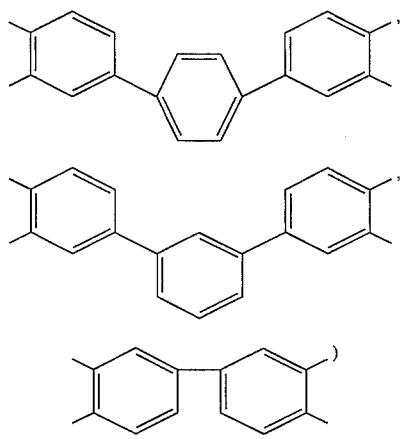

and the following diamine components which are assumed to be used in such amounts that the sum of their moles is 100: 1) 30–80 moles of a diamine component represented by the general formula: $H_2N-R^2-NH_2$ (where $R^2$ is at least one divalent organic group with a linear structure as selected from among

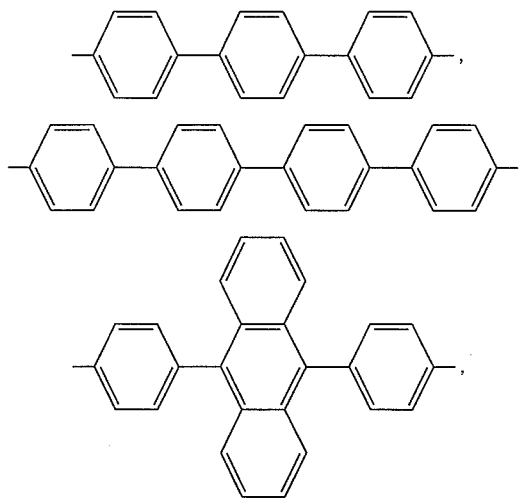

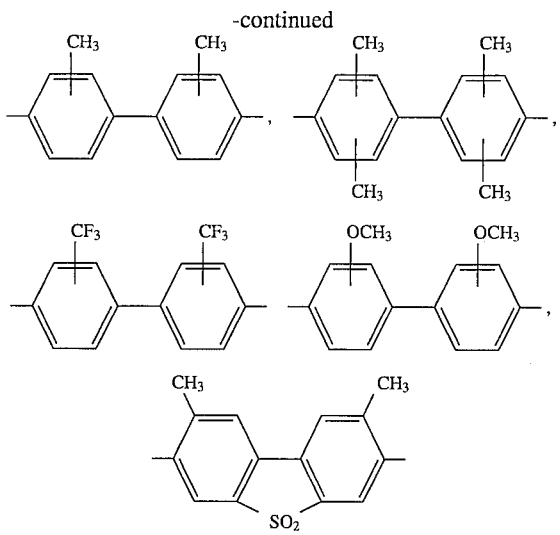

2) 70–20 moles of a diamine component represented by the general formula: $H_2N-R^3-NH_2$ (where $R^3$ is at least one divalent organic group with a crooked structure that contains at least two aromatic groups); and 3) an optional diamine component comprising 0.1–10 moles of an aminosilane compound represented by the general formula (16):

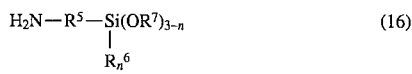

or siloxanediamine represented by the general formula (17):

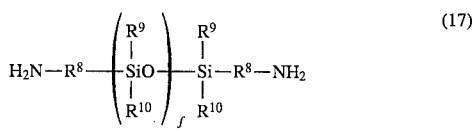

(where $R^5$ and $R^8$ are each a hydrocarbon group having 1–9 carbon atoms or a saturated alkyl group of 1–7 carbon atoms containing an ether bond; $R^6$ is a hydrocarbon group having 1–3 carbon atoms; $R^7$ is at least one group selected from among alkyl, alkoxyalkyl and trialkylsilyl groups that group have 1–5 carbon atoms; $R^9$ and $R^{10}$ are each at least one group selected from among alkyl groups having 1–3 carbon atoms and aryl groups having 1–9 carbon atoms; n is an integer of 0–3; and f is a 1 or 2) are polymerized in an aprotic polar solvent at a temperature of 0°–30° C. and the reactants are further heated at 50°–80° C. under stirring to produce the polyimide precursor.

The resulting polyimide precursor is heated to cure at a temperature of 100° C. and above, yielding a cured polyimide.

The present inventors found by experimentation that the polyimide film formed of the cured product of the polyimide precursor prepared in accordance with the first aspect of the present invention satisfied most effectively the various requirements at issue such as high heat resistance, low dielectric constant, low thermal expansion, good mechanical properties (in particular, high flexibility) and high glass transition point. It was also found that electronic devices such as semiconductor integrated circuit devices and multilevel metalization structures that used the polyimide film as an insulating film had high reliability and exhibited high performance.

The method of preparing the polyimide precursor to be used in the first aspect of the present invention and the process for fabricating metalization structures using that precursor are described below more specifically.

The tetracarboxylic dianhydride component to be used in preparing the polyimide precursor according to the first aspect of the present invention may be p-terphenyl-3,3",4,4"-tetracarboxylic dianhydride (TPDA), or m-terphenyl-3,3",4,4"-tetracarboxylic dianhydride (m-TPDA) or biphenyl-3,3'-4,4'-tetracarboxylic dianhydride (BPDA). The diamine component represented by the general formula $H_2N-R^2-NH_2$ which is to be used in the present invention is selected from among 4,4"-diamino-p-terphenyl, 4,4'''-diamino-p-quaterphenyl, 9,10-bis(p-aminophenyl) anthracene, 2,2'-dimethyl-4,4'-diaminobiphenyl (2,2'-Me$_2$-DABP), 3,3'-dimethyl-4,4'-diaminobiphenyl (3,3'-Me$_2$-DABP), 3,5,3',5'-tetramethyl-4,4'-diaminobiphenyl (3,5,3',5'-Me$_4$-DABP), 2,2'-di(trifluoromethyl)-4,4'-diaminobiphenyl (2,2'-FMe$_2$-DABP), 3,3'-di(trifluoromethyl)-4,4'-diaminobiphenyl (3,3'-FMe$_2$ DABP), 2,2'-dimethoxy-4,4'-diaminobiphenyl (2,2'-(MeO)$_2$-DABP) 3,3'-dimethoxy-4,4'-diaminobiphenyl (3,3'-(MeO)$_2$-DABP) and 3,7-diamino-2,8-dimethyl-dibenzothiophene-5,5-dioxide (o-Tolidine sulfone, TSN) and at least one of those compounds may be employed.

Examples of the diamine component that is represented by the general formula $H_2N-R^3-NH_2$ include the following:

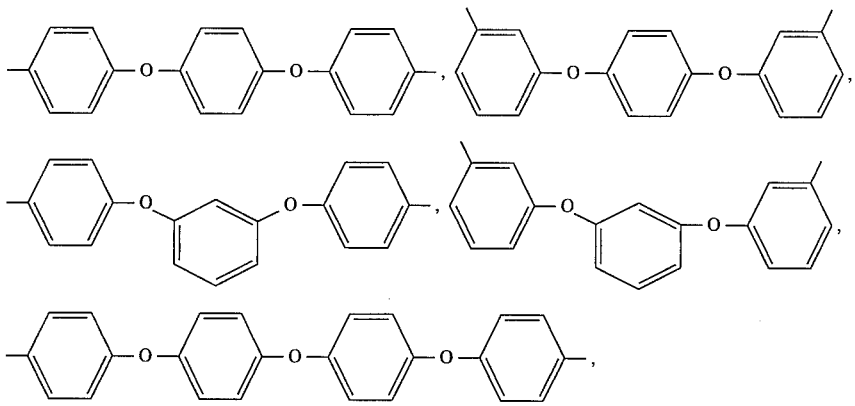

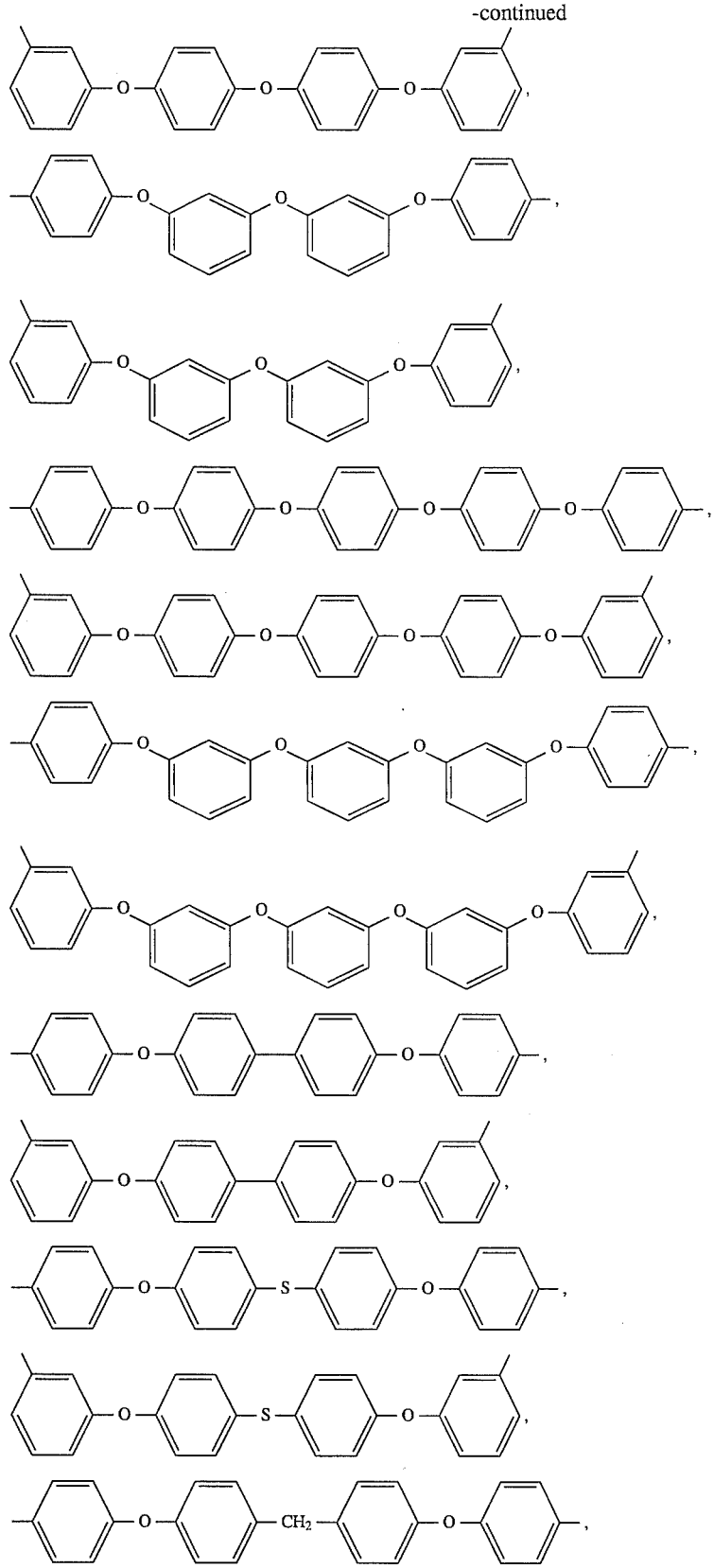

-continued
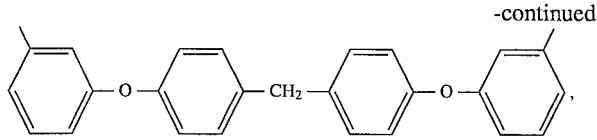
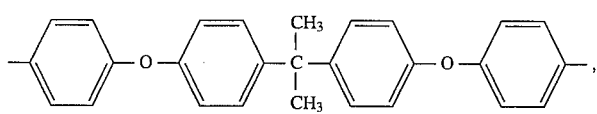
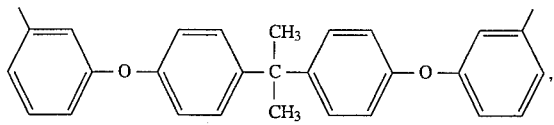
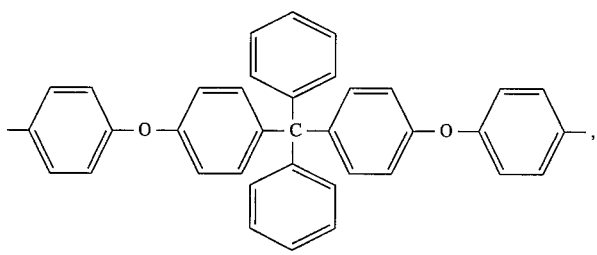
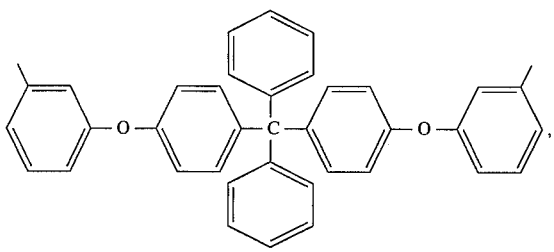
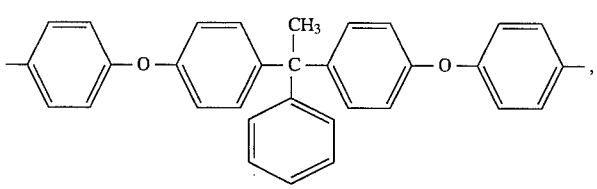
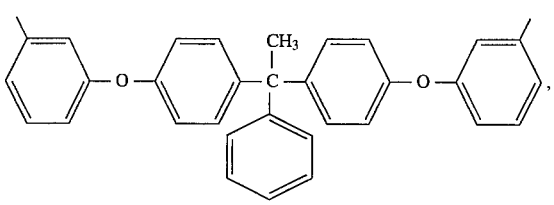
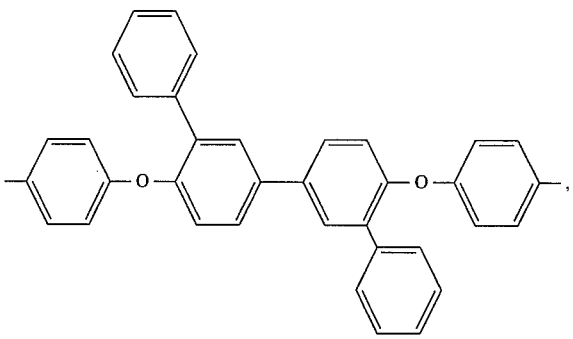

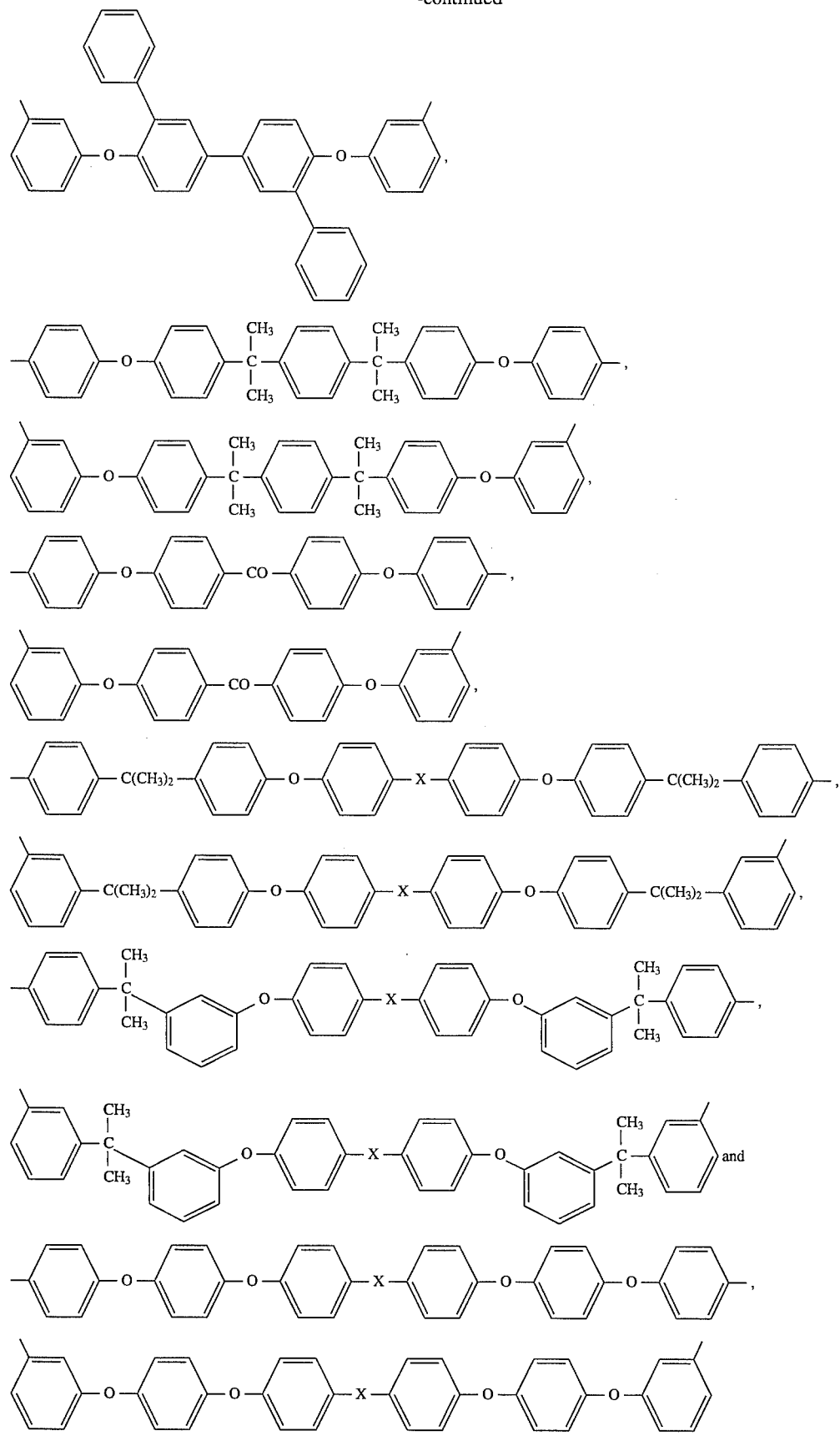

(where X is at least one member selected from among —O—, —S—, —C(CH$_3$)$_2$—, —CH$_2$—, —C(CF$_3$)$_2$—, —C(C$_6$H$_5$)$_2$—, —C(C$_6$H$_5$)(CH$_3$)—, —CO—). One or more of the compounds listed above may be used.

If desired, other diamines may be used for the purpose of controlling certain of the desired characteristics such as heat resistance, dielectric constant, thermal expansion, glass transition point, mechanical properties and flexibility. Exemplary compounds that can be used for this purpose are those diamines represented by the general formula: H$_2$N—R$^{11}$—NH$_2$ where R$^{11}$ is at least one group selected from among the following:

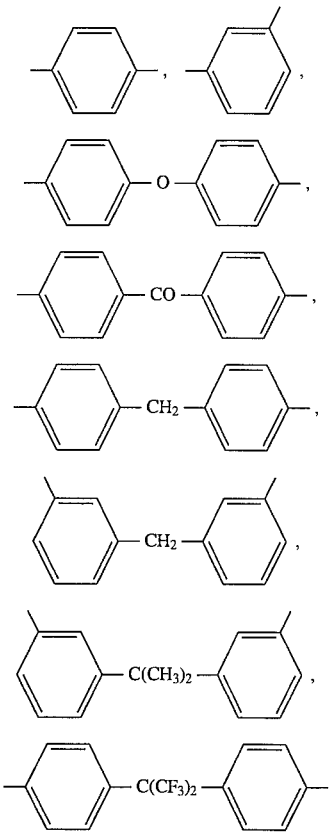

The aminosilane compound to be used in preparing the polyimide precursor according to the first aspect of the present invention is selected from among monoaminosilane compounds represented by the general formula (16):

(where R$^5$ is a hydrocarbon group having 1–9 carbon atoms or a saturated alkyl group of 1–7 carbon atoms containing an ether bond; R$^6$ is a hydrocarbon group having 1–3 carbon atoms; R$^7$ is at least one group selected from among alkyl, alkoxyalkyl and trialkylsilyl groups that group have 1–5 carbon atoms; and n is an integer of 0–3). Such monoaminosilane compounds may be exemplified by:

3-aminopropyltrimethylsilane;
3-aminopropyldialkylalkoxysilane,
3-aminopropylalkyldialkoxysilane,
3-aminopropyltrialkoxysilane,
3-(4-aminophenoxy)propyldialkylalkoxysilane,
3-(4-aminophenoxy)propylalkyldialkoxysilane,
3-(4-aminophenoxy)propyltrialkoxysilane,
3-(3-aminophenoxy)propyldialkylalkoxysilane,
3-(3-aminophenoxy)propylalkyldialkoxysilane and
3-(3-aminophenoxy)propyltrialkoxysilane such as
3-aminopropyldimethylmethoxylsilane,
3-aminopropylmethyldimethoxysilane,
3-aminopropyltrimethoxysilane,
3-aminopropyldimethylethoxysilane,
3-aminopropylmethyldiethoxysilane,
3-aminopropyltriethoxysilane,
3-aminopropyldimethylpropoxysilane,
3-aminopropylmethyldipropoxysilane,
3-aminopropyltripropoxysilane,
3-aminopropyldimethylbutoxysilane,
3-aminopropylmethylbutoxysilane and
3-aminopropyltributoxysilane;
4-aminobutyldialkylalkoxysilane,
4-aminobutylalkyldialkoxysilane and
4-aminobutyltrialkoxysilane such as
4-aminobutyldimethylethoxysilane,
4-aminobutylmethyldiethoxysilane and
4-aminobutyltriethoxysilane;
3-aminopropyltris(trimethylsiloxy)silane;
meta-aminophenyldialkylalkoxysilane,
meta-aminophenylalkyldialkoxysilane and
meta-aminophenyltrialkoxysilane such as
meta-aminophenyldimethylmethoxysilane,
meta-aminophenylmethyldimethoxysilane,
meta-aminophenyltrimethoxysilane,
meta-aminophenyldimethylethoxysilane,
meta-aminophenylmethyldiethoxysilane,
meta-aminophenyltriethoxysilane,
meta-aminophenyldimethylpropoxysilane,
meta-aminophenylmethyldipropoxysilane and
meta-aminophenyltripropoxysilane;
para-aminophenyldialkylalkoxysilane,
para-aminophenylalkyldialkoxysilane and
para-aminophenyltrialkoxysilane such as
para-aminophenyldimethylmethoxysilane,
para-aminophenylmethyldimethoxysilane,
para-aminophenyltrimethoxysilane,
para-aminophenyldimethylethoxysilane,
para-aminophenylmethyldiethoxysilane,
para-aminophenyltriethoxysilane,
para-aminophenyldimethylpropoxysilane,
para-aminophenylmethyldipropoxysilane and
para-aminophenyltripropoxysilane;
meta-aminobenzyldialkylalkoxysilane,
meta-aminobenzylalkyldialkoxysilane and
meta-aminobenzyltrialkoxysilane such as
meta-aminobenzyldimethylethoxysilane,
meta-aminobenzylmethyldiethoxysilane,
meta-aminobenzyltriethoxysilane,
meta-aminobenzyldimethylpropoxysilane,
meta-aminobenzylmethyldipropoxysilane,
meta-aminobenzyltripropoxysilane,
meta-aminobenzyldimethylpropoxysilane,
meta-aminobenzylmethyldipropoxysilane and
meta-aminobenzyltripropoxysilane;
para-aminobenzyldialkylalkoxysilane,
para-aminobenzylalkyldialkoxysilane and
para-aminobenzyltrialkoxysilane such as
para-aminobenzyldimethylpropoxysilane,
para-aminobenzylmethyldipropoxysilane and
para-aminobenzyltripropoxysilane;
para-aminophenethyldialkylalkoxysilane,
para-aminophenethylalkyldialkoxysilane and
para-aminophenethyltrialkoxysilane such as
para-aminophenethyldimethylmethoxysilane, para-aminophenethylmethyldimethoxysilane and
para-aminophenethyltrimethoxysilane; and hydrogenation products of the above-mentioned meta- and para-forms of benzyl and phenethyl compounds.

The diaminosiloxane compound to be used in preparing the polyimideprecursor according to the first aspect of the present invention is selected from among diaminosiloxane compounds represented by the general formula (17):

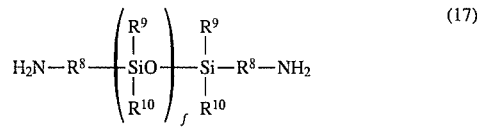

(where $R^8$ is a hydrocarbon group having 1–9 carbon atoms; $R^9$ and $R^{10}$ are each at least one group selected from among alkyl groups having 1–3 carbon atoms and aryl groups having 1–9 carbon atoms; and f is a 1 or 2), as exemplified by the following:

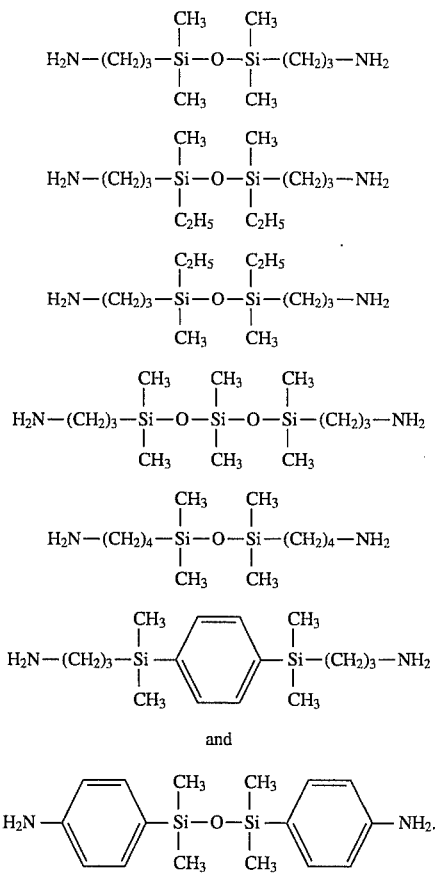

The monoaminosilane compound (16) or diaminosiloxane compound (17) is added in order to provide better bond properties. The monoaminosilane component or diaminosiloxane component is used typically in an amount of 0.1–10%, preferably 0.5–5%, with the total amount of diamine components being taken as 100%. If the content of the monoaminosilane component or diaminosiloxane component is less than 0.1%, their effectiveness in improving the bond properties is limited; if their content exceeds 10%, they will cause adverse effects on heat resistance or mechanical properties.

Various solvents may be used in preparing the polyimide precursor and the polyimide in accordance with the first aspect of the present invention and they include, for example, N-methyl-2-pyrrolidone, N,N-dimethylacetamide, N,N-dimethylformamide, dimethyl sulfoxide, hexamethylphosphoramide, tetramethylenesulfone, parachlorophenol and para-bromophenol. At least one of these compounds may be used as a solvent.

In the practice of the present invention, the polyimide precursor may be prepared in the following manner. First, the diamine components are dissolved in a suitable aprotic polar solvent; then, terphenyl-3,3",4,4"-tetracarboxylic dianhydride is added and the mixture is stirred for ca. 6 h with the temperature held at 0°–30° C. The reaction proceeds gradually, causing the viscosity of varnish to rise and yielding a polyimide precursor. By further agitation at a controlled temperature of 50°–80° C., the viscosity of varnish is adjusted to the proper value. The reduced viscosity of the polyimide precursor may desirably be adjusted to 0.5 dl/g and above as measured in a solvent N-methyl-2-pyrrolidone at a concentration of 0.1 g/100 ml and at a temperature of 25° C.

The process for fabricating a metalization structure according to the first aspect of the present invention is described below with reference to FIGS. 1(a)–(f).

The process starts with forming a predetermined pattern of conductor layer 2 on a substrate 1 by a known photoetching technique. Then, the polyimide precursor [poly(amic acid) varnish] of the present invention is coated and cured thermally to form a polyimide resin layer 3 (FIG. 1a). Subsequently, a photoresist 4 is coated over the polyimide resin layer 3 and dried (FIG. 1b). The photoresist 4 is exposed to light through a predetermined photomask and subsequently developed, rinsed and dried to give a predetermined pattern (FIG. 1c). Thereafter, the polyimide resin layer 3 is removed selectively in predetermined areas by etching with the photoresist pattern being used as a mask, thereby forming through-holes 5 in which the conductor layer 2 is exposed (FIG. 1d). Then, the photoresist 4 is stripped with the aid of a resist stripper (FIG. 1e). If through-holes 5 are formed in the polyimide resin layer 3 by laser working such as by an excimer laser, the steps involving the use of photoresist 4 as shown in FIGS. 1b–1d can be omitted and the process can go directly from FIG. 1a to FIG. 1e. In the case where the polyimide resin layer 3 is to be used as a surface protective layer or an α-particle shielding film, the through-holes 5 may be used to establish electrical connection to the circuit exterior to the substrate. For instance, they may be used to provide access to bonding pads for gold metalization or areas to be connected by soldering. When forming a multilevel metalization structure, the conductor layer 2 is used as a lower conductor layer and the metalization layer formed by the procedure described above may in turn be overlaid with an upper conductor layer 6. Stated more specifically, the upper conductor layer 6 is deposited over the entire surface of the substrate by a suitable technique such as vacuum evaporation, sputtering or plating and patterned by photoetching or an otherwise known technique, with electrical connection to the lower conductor layer 2 being established in those areas of the polyimide resin layer 3 where through-holes 5 are formed, whereby a two-level metalization structure is produced (FIG. 1f). By repeating this procedure more than once, three- to higher-level metalization structures can be fabricated.

As described on the foregoing pages, metalization structures in which signals could propagate with a shorter delay time and which yet had high moisture resistance to exhibit high reliability in performance without bow of the substrate, broken metalizations or cracking could be fabricated using the polyimide and its precursor [poly(amic acid)] according to the first aspect of the present invention which had low dielectric constant, low thermal expansion coefficient, high heat resistance, high glass transition point, good mechanical properties (high flexibility) and good bond properties. The polyimide according to the first aspect of the present invention contains many linearly bound aromatic rings but has a relatively low content of imide rings which will otherwise increase the dielectric constant and, consequently, the polyimide at issue satisfies all of the important requirements, i.e., low dielectric constant, low thermal expansion coefficient, high heat resistance and high glass transition point. Furthermore, the polyimide has good mechanical properties (in particular, high flexibility) since part of the diamine components used has a flexible (crooked) structure. These factors may have combined with one another to provide a metalization structure of high performance and reliability.

Having described the first aspect of the present invention, we would now like to refocus our discussion on the second aspect of the invention. According to its second aspect, the present invention provides a polyimide precursor poly(amic acid)] that contains in the molecular chain a plurality of recurring units represented by the following general formula (21), a polyimide produced by heating said precursor, and an electronic device such as a metalization structure that uses said polyimide in an insulating film:

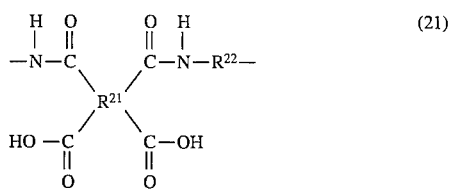

(where $R^{21}$ is a tetravalent organic group; $R^{22}$ is at least one divalent organic group selected from among

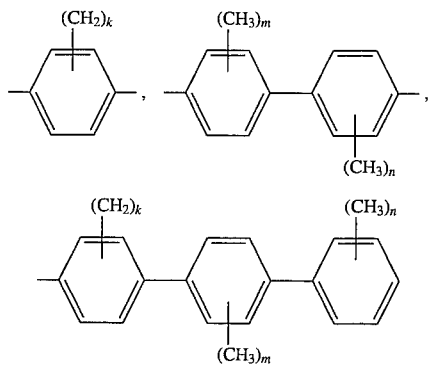

where k, m and n are each an integer of 0–4, provided that they are not zero at the same time).

The polyimide precursor according to the second aspect of the present invention may further contain in the molecular chain at least one of the organosilicon groups represented by the following general formulas (23) and (24):

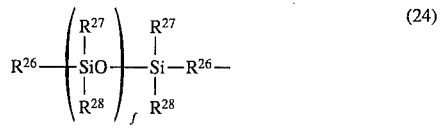

(where $R^{23}$ and $R^{26}$ are each a hydrocarbon group having 1–9 carbon atoms or a saturated alkyl group of 1–7 carbon atoms containing an ether bond; $R^{24}$ is a hydrocarbon group having 1–3 carbon atoms; $R^{25}$ is at least one group selected from among alkyl, alkoxyalkyl and trialkylsilyl groups that have 1–5 carbon atoms; $R^{27}$ and $R^{28}$ are each at least one group selected from among alkyl groups having 1–3 carbon atoms and aryl groups having 1–9 carbon atoms; n is an integer of 0–3; and f is a 1 or 2).

The polyimide precursor under consideration contains in its molecular chain those methyl groups which are bound to aromatic rings. As will be demonstrated in the examples that are given later in this specification, those methyl groups have the advantage that if the polyimide produced by heating said precursor is subjected to ashing with oxygen gas, a large number of oxygen atoms can be attached to the surface of the polyimide. The oxygen thus introduced is very active and creates strong bonds with a polyimide film or a metalization material or a molding resin that are to be superposed on that polyimide, thereby imparting good bond properties to the interface of the two members. To attain such good bond properties, the recurring units represented by the general formula (21) are desirably contained in an amount of at least 10% by weight of the total solids content of the polyimide precursor.

When preparing the polyimide precursor under consideration, the organosilicon group represented by the general formula (23) or (24) is introduced in order to provide a better bond to the substrate or metallic materials for use in metalization. Such organosilicon groups are desirably introduced in amounts ranging from 0.1% to 10% of the total weight of the polyimide precursor. If the content of the organosilicon groups is less than 0.1%, their effectiveness in improving the bond properties is limited; if their content exceeds 10%, they will cause adverse effects on heat resistance and mechanical properties (such as elongation and flexibility).

The polyimide precursor described above can be prepared by the following method which comprises basically reacting a tetracarboxylic dianhydride with at least one diamine component. Stated more specifically, a tetracarboxylic dianhydride component represented by general formula (25):

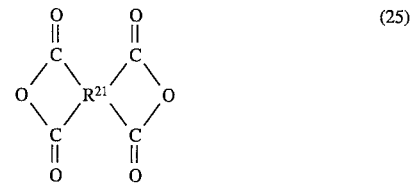

(where $R^{21}$ is at least one tetravalent organic group selected from among

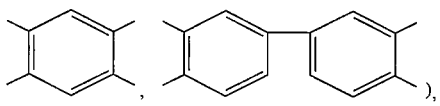

a diamine component represented by general formula: $H_2N—R^{22}—NH_2$ (where $R^{22}$ is at least one divalent organic group selected from among

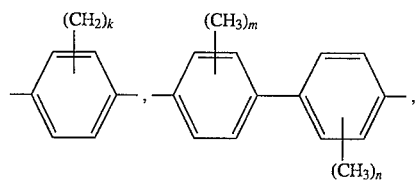

-continued

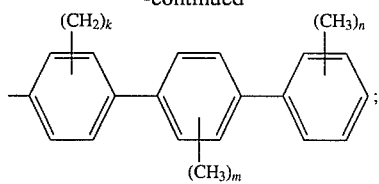

where k, m and n are each an integer of 0–4, provided that they are not zero at the same time), optionally an aminosilane compound represented by general formula (27):

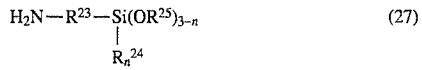

or a siloxanediamine compound represented by general formula (28):

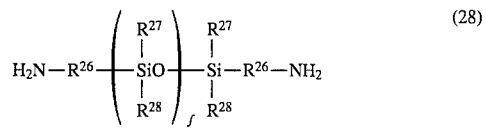

(where $R^{23}$ and $R^{26}$ are each a hydrocarbon group having 1–9 carbon atoms or a saturated alkyl group of 1–7 carbon atoms containing an ether bond; $R^{24}$ is a hydrocarbon group having 1–3 carbon atoms; $R^{25}$ is at least one group selected from among alkyl, alkoxyalkyl and trialkylsilyl groups that group have 1–5 carbon atoms; $R^{27}$ and $R^{28}$ are each at least one group selected from among alkyl groups having 1–3 carbon atoms and aryl groups having 1–9 carbon atoms; n is an integer of 0–3; and f is a 1 or 2), and optionally another diamine are subjected to polymerization reaction in an aprotic polar solvent, on the condition that the diamine represented by general formula: $H_2N-R^{22}-NH_2$ and the amine compound represented by general formula (27) or (28) be used in proportions that are the same as those already specified above for the first aspect of the present invention. The acid dianhydride component and all the amine components are desirably mixed in such proportions that their amounts are almost equal from a stoichiometric viewpoint. When the polymerization reaction starts, the viscosity of the reaction solution will rise gradually, yielding the polyimide precursor [poly(amic acid)] as varnish. Subsequently, viscosity of the varnish may be adjusted to the proper value by further agitation at an elevated temperature of 50°–80° C.

The resulting polyimide precursor is heated to cure at a temperature of 100° C. and above, yielding a cured polyimide.

The tetracarboxylic dianhydride component to be used in preparing the polyimide precursor according to the second aspect of the present invention may be exemplified by, but by no means limited to, pyromellitic dianhydride (PMDA) and biphenyl-3,3',4,4'-tetracarboxylic anhydride (BPDA).

Examples of the diamine that is represented by the general formula $H_2N-R^{22}-NH_2$ and which may be used in the second aspect of the present invention include the following:

2-methyl-1,4-diaminobenzene (2-Me-PDA),
2,3-dimethyl-1,4-diaminobenzene (2,3-Me$_2$-PDA),
2,5-dimethyl-1,4-diaminobenzene (2,5-Me$_2$-PDA),
2,6-dimethyl-1,4-diaminobenzene (2,6-Me$_2$-PDA),
2,3,5-trimethyl-1,4-diaminobenzene (2,3,5-Me$_3$-PDA),
2-methyl-4,4'-diaminobiphenyl (2-Me-DABP),
3-methyl-4,4'-diaminobiphenyl (3-Me-DABP),
2,2'-dimethyl-4,4'-diaminobiphenyl (2,2'-Me$_2$-DABP),
3,3'-dimethyl-4,4'-diaminobiphenyl (3,3'-Me$_2$-DABP),
2,5,2',5'-tetramethyl-4,4'-diaminobiphenyl (2,5,2',5'-Me$_4$-DABP),
2,6,2',6'-tetramethyl-4,4'-diaminobiphenyl (2,6,2',6'-Me$_4$-DABP),
3,5,3',5'-tetramethyl-4,4'-diaminobiphenyl (3,5,3',5'-Me$_4$-DABP),
3,6,3',6'-tetramethyl-4,4'-diaminobiphenyl (3,6,3',6'-Me$_4$-DABP),
2,7-diamino-3,6-dimethyldibenzothiophene-9,9-dioxide (TSN),
2-methyl-4,4''-diamino-p-terphenyl (2-Me-DATP),
3-methyl-4,4''-diamino-p-terphenyl (3-Me-DATP),
2'-methyl-4,4''-diamino-p-terphenyl (2'-Me-DATP),
2,2''-dimethyl-4,4''-diamino-p-terphenyl (2,2''-Me$_2$-DATP),
3,3''-dimethyl-4,4''-diamino-p-terphenyl (3,3''-Me$_2$-DATP),
2',3'-dimethyl-4,4''-diamino-p-terphenyl (2',3'-Me$_2$-DATP),
2',5'-dimethyl-4,4''-diamino-p-terphenyl (2',5'-Me$_2$-DATP),
2',6'-dimethyl-4,4''-diamino-p-terphenyl (2',6'-Me$_2$-DATP),
2,6,2'',6''-tetramethyl-4,4''-diamino-p-terphenyl (2,6,2'',6''-Me$_4$-DATP),
3,5,3'',5''-tetramethyl-4,4''-diamino-p-terphenyl (3,5,3'',5''-Me$_4$-DATP),
2',3',5',6'-tetramethyl-4,4''-diamino-p-terphenyl (2',3',5',6'-Me$_4$-DATP), etc. However, these are not the sole examples of the diamine to be used in the second aspect of the present invention. It should also be noted that the diamines listed above may be mixed with other diamines.

The aminosilane compound to be used in preparing the polyimide precursor according to the second aspect of the present invention is selected from among monoaminosilane compounds represented by the general formula (27):

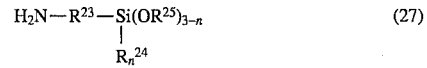

(where $R^{23}$ is a hydrocarbon group having 1–9 carbon atoms or a saturated alkyl group of 1–7 carbon atoms containing an ether bond; $R^{24}$ is a hydrocarbon group having 1–3 carbon atoms; $R^{25}$ is at least one group selected from among alkyl, alkoxyalkyl and trialkylsilyl groups that group have 1–5 carbon atoms; and n is an integer of 0–3). Such monoaminosilane compounds may be exemplified by:

3-aminopropyltrimethylsilane;
3-aminopropyldialkylalkoxysilane,
3-aminopropylalkyldialkoxysilane,
3-aminopropyltrialkoxysilane,
3-(4-aminophenoxy)propyldialkylalkoxysilane,
3-(4-aminophenoxy)propylalkyl-dialkoxysilane,
3-(4-aminophenoxy)propyltrialkoxysilane,
3-(3-aminophenoxy)propyldialkylalkoxysilane,
3-(3-aminophenoxy)propylalkyldialkoxysilane and
3-(3-aminophenoxy)propyltrialkoxysilane such as
3-aminopropyldimethylmethoxysilane,
3-aminopropylmethyldimethoxysilane,
3-aminopropyltrimethoxysilane,
3-aminopropyldimethylethoxysilane,
3-aminopropylmethyldiethoxysilane,
3-aminopropyltriethoxysilane,
3-aminopropyldimethylpropoxysilane,
3-aminopropylmethyldipropoxysilane,
3-aminopropyltripropoxysilane,
3-aminopropyldimethylbutoxysilane,
3-aminopropylmethylbutoxysilane and
3-aminopropyltributoxysilane;
4-aminobutyldialkylalkoxysilane, 4-aminobutylalkyldialkoxysilane and
4-aminobutyltrialkoxysilane such as
4-aminobutyldimethylethoxysilane,
4-aminobutylmethyldiethoxysilane and
4-aminobutyltriethoxysilane;
3-aminopropyltris(trimethylsiloxy)silane;
meta-aminophenyldialkylalkoxysilane,
meta-aminophenylalkyldialkoxysilane and
meta-aminophenyltrialkoxysilane such as
meta-aminophenyldimethylmethoxysilane,
meta-aminophenylmethyldimethoxysilane,
meta-aminophenyltrimethoxysilane,
meta-aminophenyldimethylethoxysilane,
meta-aminophenylmethyldiethoxysilane,
meta-aminophenyltriethoxysilane,
meta-aminophenyldimethylpropoxysilane,
meta-aminophenylmethyldipropoxysilane and
meta-aminophenyltripropoxysilane;
para-aminophenyldialkylalkoxysilane,
para-aminophenylalkyldialkoxysilane and
para-aminophenyltrialkoxysilane such as
para-aminophenyldimethylmethoxysilane,
para-aminophenylmethyldimethoxysilane,
para-aminophenyltrimethoxysilane,
para-aminophenyldimethylethoxysilane,
para-aminophenylmethyldiethoxysilane,
para-aminophenyltriethoxysilane,
para-aminophenyldimethylpropoxysilane,
para-aminophenylmethyldipropoxysilane and
para-aminophenyltripropoxysilane;
meta-aminobenzyldialkylalkoxysilane,
meta-aminobenzylalkyldialkoxysilane and
meta-aminobenzyltrialkoxysilane such as
meta-aminobenzyldimethylethoxysilane,
meta-aminobenzylmethyldiethoxysilane,
meta-aminobenzyltriethoxysilane,
meta-aminobenzyldimethylpropoxysilane,
meta-aminobenzylmethyldipropoxysilane,
meta-aminobenzyltripropoxysilane,
meta-aminobenzyldimethylpropoxysilane,
meta-aminobenzylmethyldipropoxysilane and
meta-aminobenzyltripropoxysilane;
para-aminobenzyldialkylalkoxysilane,
para-aminobenzylalkyldialkoxysilane and
para-aminobenzyltrialkoxysilane such as
para-aminobenzyldimethylpropoxysilane,
para-aminobenzylmethyldipropoxysilane and
para-aminobenzyltripropoxysilane;
para-aminophenethyldialkylalkoxysilane,
para-aminophenethylalkyldialkoxysilane and
para-aminophenethyltrialkoxysilane such as
para-aminophenethyldimethylmethoxysilane,
para-aminophenethylmethyldimethoxysilane and
para-aminophenethyltrimethoxysilane; and hydrogenation products of the above-mentioned meta- and para-forms of benzyl and phenethyl compounds.

The diaminosiloxane compound to be used in preparing the polyimide precursor according to the second aspect of the present invention is selected from among diaminosiloxane compounds represented by the general formula (28):

$$H_2N-R^{26}-\left(\begin{array}{c}R^{27}\\|\\SiO\\|\\R^{28}\end{array}\right)_f\begin{array}{c}R^{27}\\|\\Si-R^{26}-NH_2\\|\\R^{28}\end{array} \quad (28)$$

(where $R^{26}$ is a hydrocarbon group having 1-9 carbon atoms; $R^{27}$ and $R^{28}$ are each at least one group selected from among alkyl groups having 1-3 carbon atoms and aryl groups having 1-9 carbon atoms; and f is 1 or 2), as exemplified by the following:

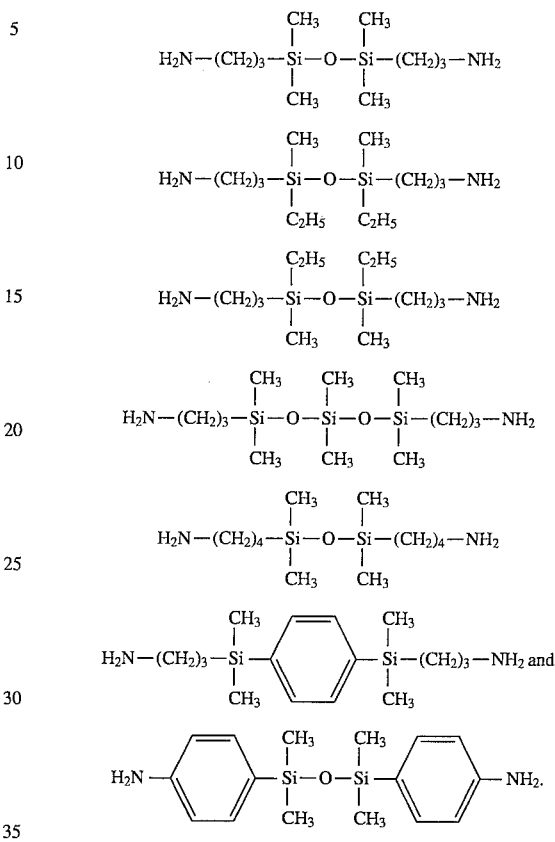

Various solvents may be used in preparing the polyimide precursor and the polyimide in accordance with the second aspect of the present invention and they include, for example, N-methyl-2-pyrrolidone, N,N-dimethylacetamide, N,N-dimethylformamide, dimethyl sulfoxide, hexamethylphosphoramide, tetramethylenesulfone, parachlorophenol and para-bromophenol. At least one of these compounds may be used as a solvent.

The process for fabricating a metalization structure according to the second aspect of the present invention is described below with reference to FIGS. 7(a)–(f).

Figure 7:
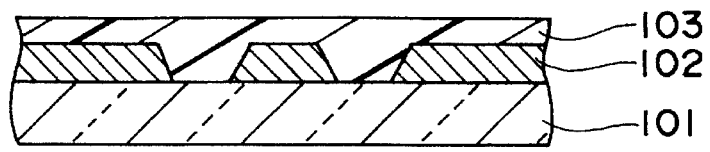
FIGS. 7(a)–(f) are sectional views showing another example of the process for fabricating a multilevel metalization structure according to the present invention.
Figure 7:
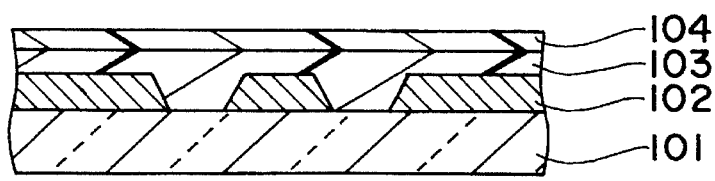
Figure 7:
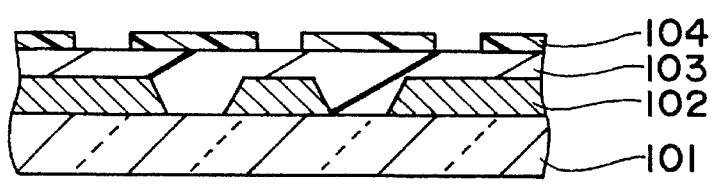
Figure 7:
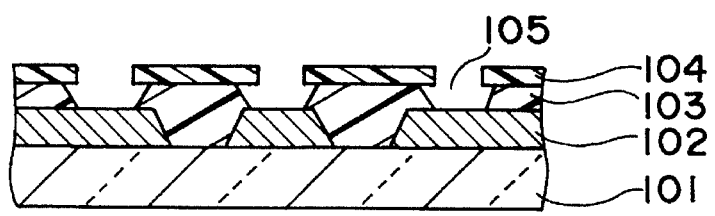
Figure 7:
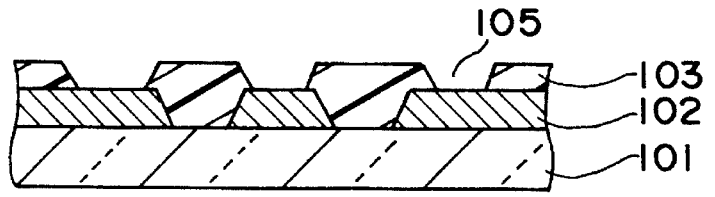
Figure 7:
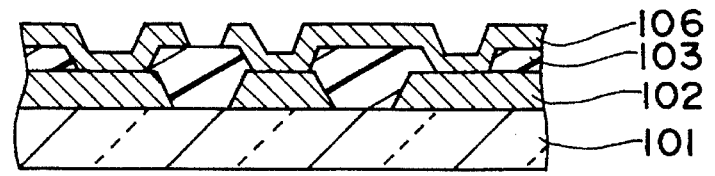

The process starts with forming a predetermined pattern of conductor layer 102 on a substrate 101 by a known photoetching technique. Then, the polyimide precursor poly(amic acid) varnish] of the present invention is coated and cured thermally to form a polyimide resin layer 103 (FIG. 7a). Subsequently, a photoresist 104 having resistance to oxygen plasma is coated over the polyimide resin layer 103 and dried (FIG. 7b). The photoresist 104 is exposed to light through a predetermined photomask and subsequently developed, rinsed and dried to give a predetermined pattern (FIG. 7c). Thereafter, the polyimide resin layer 103 is removed selectively in predetermined areas by etching with the photoresist pattern being used as a mask, thereby forming through-holes 105 in which the conductor layer 102 is exposed (FIG. 7d). Then, the photoresist 104 is stripped with the aid of a resist stripper (FIG. 7e). If through-holes 105 are formed in the polyimide resin layer 103 by laser working such as by an excimer laser, the steps involving the use of photoresist 104 as shown in FIGS. 7b–7d can be omitted and the process can go directly from FIG. 7a to FIG. 7e. When forming a multilevel metalization structure, the conductor layer 102 is used as a lower conductor layer and the metalization layer formed by the procedure described above may in turn be overlaid with an upper conductor layer, except that the polyimide resin layer 103 is subjected to ashing with oxygen gas. Thereafter, the upper conductor layer 106 is deposited over the entire surface of the substrate by a suitable technique such as vacuum evaporation, sputtering or plating and patterned by a known photoetching technique, producing a two-level metalization structure in which electrical connection to the lower conductor layer 102 is established in those areas of the polyimide resin layer 103 where through-holes 105 are formed (FIG. 7*f*). By repeating this procedure more than once, three- to higher-level metalization structures can be fabricated.

As described on the foregoing pages, the polyimide of low thermal expansion according to the second aspect of the present invention has such a nature that it will develop a good bond not only to metalization materials but also to the polyimide itself. Using this polyimide, the present inventors were capable of fabricating a metalization structure of high performance that was not only free from bow of the substrate, broken metalizations and cracks in the insulating film but which also experienced no delamination. This may be explained as follows: the polyimide contains methyl groups bound to aromatic rings and they are so highly susceptible to oxidation by oxygen ashing that the polyimide will eventually contain a large number of active oxygen atoms in the surface, thus creating strong bonds to the material which is to be superposed on the polyimide film. Furthermore, the polyimide under consideration contains organosilicon atoms which will develop a strong bond to substrate materials such as silicon, glass and ceramics and, hence, it insures high reliability in adhesion to various substrates. This is why multilevel metalization structures of high reliability could be fabricated using the polyimide in accordance with the second aspect of the present invention.

The following examples are provided for the purpose of further illustrating the present invention but are in no way limiting.

Synthesis 1

Bis [4-(4-aminophenoxy)phenyl] ether (2.842 g, 7.393 mmol, 50 mol % of the diamine components) and 4,4"-diamino-p-terphenyl (1.924 g, 7.393 mmol, 50 mol % of the diamine components) were dissolved in 53.6 g of a solvent system composed of a 1:1 mixture of N,N-dimethylacetamide (DMAc) and N-methyl-2-pyrrolidone (NMP) with stirring in a nitrogen stream at room temperature. Subsequently, 5.475 g (14.78 mmol) of p-terphenyl-3,3", 4,4"-tetracarboxylic dianhydride (TPDA) was dissolved in the prepared solution with stirring in a nitrogen stream (to a solids content of 16%), whereupon the temperature of the solution rose to about 30° C. at a viscosity of 150 poises. The solution was given further heat in the temperature range 55°–65° C. for about 5 h to adjust the viscosity to 56 poises. The thus prepared poly(amic acid) varnish was whirl-coated on a glass wafer and heated first at 200° C. for 30 min, then at 350° C. for 30 min to produce a polyimide film. The film had the following characteristics: $\epsilon=2.7$; Tg=390° C.; $\alpha=21$ ppm/°C.; and elongation=17%.

Syntheses 2–12, 20 and 147–150

Using the components listed in Table 1, additional samples of poly(amic acid) varnish were synthesized by the same method as used in Synthesis 1. The relevant data of solids content and viscosity are also given in Table 1. Polyimide films were produced from those samples of poly(amic acid) varnish by the same method as used in Synthesis 1 and they had the following characteristics: $\epsilon=2.7$; Tg=360°–410° C.; $\alpha=14°25$ ppm/°C.; and elongation=11–18%.

TABLE 1-1

Polymer Composition for Examples 1–27 and 147–150

| Varnish No. | Acid dianhydride component | Diamine component | Solvent | Solids content (final viscosity and reduced viscosity in parentheses in that order) |
|---|---|---|---|---|
| 1 | TPDA 5.475 g (14.78 mmol) | 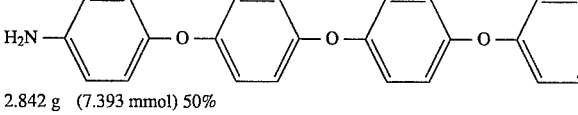 2.842 g (7.393 mmol) 50% <br><br> 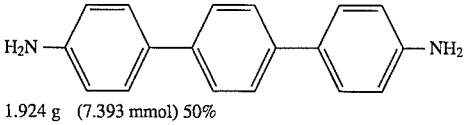 1.924 g (7.393 mmol) 50% | Mixture of NMP (26.8 g) DMAc (26.8 g) | 16.0% (56.0 P) (1.78 dl/g) |
| 2 | TPDA 4.083 g (11.03 mmol) | 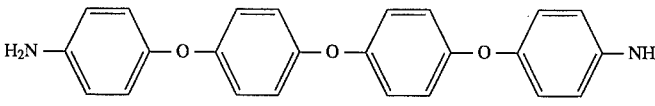 1.695 g (4.409 mmol) 40% <br><br> H₂N—⌬—⌬—⌬—NH₂ 1.722 g (6.614 mmol) 60% | Mixture of NMP (19.1 g) DMAc (19.7 g) | 16.0% (48.3 P) (1.71 dl/g) |

TABLE 1-1-continued

Polymer Composition for Examples 1–27 and 147–150

| Varnish No. | Acid dianhydride component | Diamine component | Solvent | Solids content (final viscosity and reduced viscosity in parentheses in that order) |
|---|---|---|---|---|
| 3 | TPDA 5.678 g (15.33 mmol) | 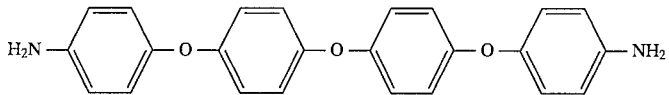 1.768 g (4.599 mmol) 30%<br>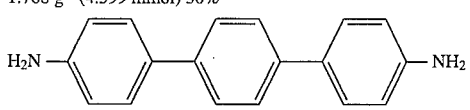 2.794 g (10.733 mmol) 70% | Mixture of NMP (25.0 g) DMAc (25.0 g) | 17.0% (39.0 P) (1.57 dl/g) |
| 4 | TPDA 5.539 g (14.96 mmol) | 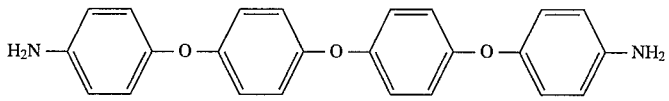 2.755 g (7.478 mmol) 50%<br>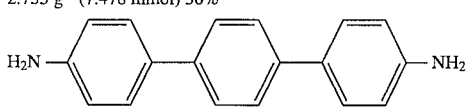 1.947 g (7.478 mmol) 50% | Mixture of NMP (31.5 g) DMAc (31.5 g) | 14.0% (43.3 P) (1.78 dl/g) |
| 5 | TPDA 4.121 g (11.13 mmol) | 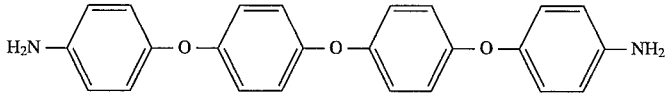 1.640 g (4.451 mmol) 40%<br>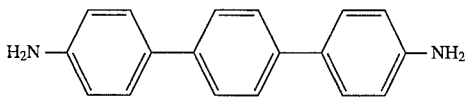 1.738 g (6.676 mmol) 60% | Mixture of NMP (19.7 g) DMAc (19.7 g) | 16.0% (42.3 P) (1.68 dl/g) |
| 6 | TPDA 4.188 g (11.31 mmol) | 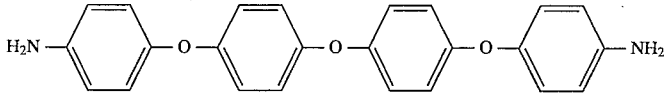 1.250 g (3.393 mmol) 30%<br> 2.061 g (7.917 mmol) 70% | Mixture of NMP (18.3 g) DMAc (18.3 g) | 17.0% (48.7 P) (1.64 dl/g) |

TABLE 1-2

Polymer Composition for Examples 1–27

| Varnish No. | Acid dianhydride component | Diamine component | Solvent | Solids content (final viscosity and reduced viscosity in parentheses in that order) |
|---|---|---|---|---|
| 7 | TPDA 4.121 g (11.13 mmol) | 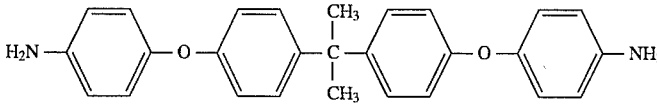 2.285 g (5.565 mmol) 50% <br>  1.449 g (5.565 mmol) 50% | Mixture of NMP (22.3 g) DMAc (22.3 g) | 15.0% (46.3 P) (1.70 dl/g) |
| 8 | TPDA 4.121 g (11.13 mmol) | 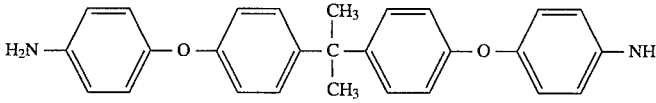 1.828 g (4.452 mmol) 40% <br>  1.739 g (6.678 mmol) 60% | Mixture of NMP (21.8 g) DMAc (21.8 g) | 15.0% (52.3 P) (1.79 dl/g) |
| 9 | TPDA 4.121 g (11.13 mmol) | 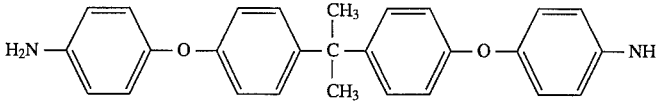 1.371 g (3.339 mmol) 30% <br>  2.028 g (7.791 mmol) 70% | Mixture of NMP (21.5 g) DMAc (21.5 g) | 15.0% (48.7 P) (1.73 dl/g) |
| 10 | TPDA 4.000 g (10.80 mmol) | 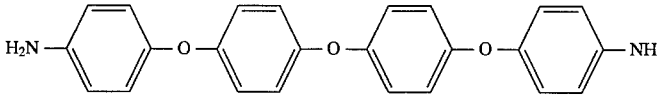 1.661 g (4.321 mmol) 40% <br>  1.575 g (6.048 mmol) 56% <br> $H_2N-(CH_2)3-Si(OC_2H_5)_2-CH_2$ <br> 0.165 g (0.864 mmol) 4% | Mixture of NMP (18.1 g) DMAc (18.1 g) | 17.0% (38.0 P) (1.50 dl/g) |
| 11 | m-TPDA 4.083 g (11.03 mmol) | 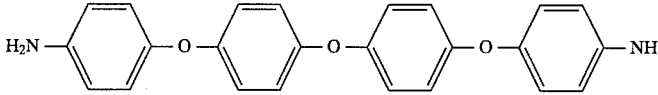 1.695 g (4.409 mmol) 40% <br> 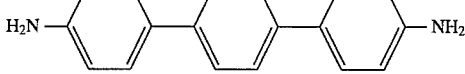 1.722 g (6.614 mmol) 60% | Mixture of NMP (19.7 g) DMAc (19.7 g) | 16.0% (48.8 P) (1.73 dl/g) |

TABLE 1-2-continued

Polymer Composition for Examples 1–27

| Varnish No. | Acid dianhydride component | Diamine component | Solvent | Solids content (final viscosity and reduced viscosity in parentheses in that order) |
|---|---|---|---|---|
| 12 | m-TPDA 4.083 g (11.03 mmol) | 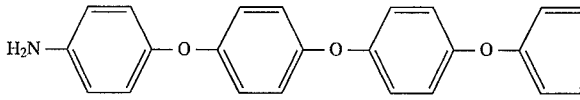<br>1.695 g (4.409 mmol) 40%<br><br>1.722 g (6.614 mmol) 60% | Mixture of NMP (19.7 g) DMAc (19.7 g) | 16.9% (49.1 P) (1.78 dl/g) |
| 20 | TPDA 4.083 g (11.03 mmol) 50% BPDA 3.245 g (11.03 mmol) 50% | 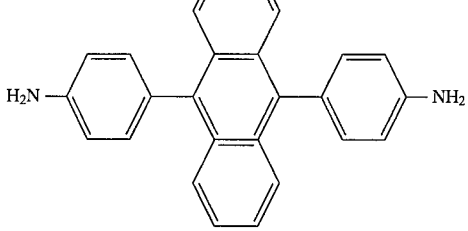<br>3.392 g (8.824 mmol) 40%<br><br>3.447 g (13.24 mmol) 60% | Mixture of NMP (35.0 g) DMAc (35.0 g) | 16.8% (49.4 P) (1.77 dl/g) |
| 147 | p-TPDA 8.0 g (21.61 mmol) | 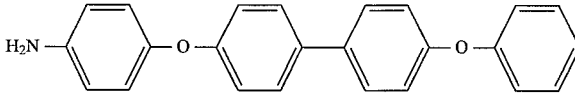<br>2.39 g (6.48 mmol) 30%<br>3,3'-Me$_2$—DABP<br>3.21 g (15.12 mmol) 70% | Mixture of NMP (55.0 g) DMAc (55.0 g) | 11.0% (68.3 P) (1.71 dl/g) |
| 148 | p-TPDA 8.0 g (21.61 mmol) | 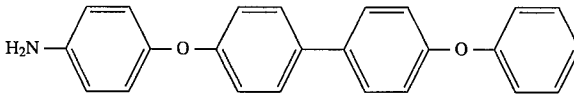<br>2.39 g (6.48 mmol) 30%<br>2,2'-FMe$_2$—DABP<br>4.84 g (15.12 mmol) 70% | Mixture of NMP (40.0 g) DMAc (40.0 g) | 16.0% (54.0 P) (1.55 dl/g) |
| 149 | p-TPDA 8.0 g (21.61 mmol) | 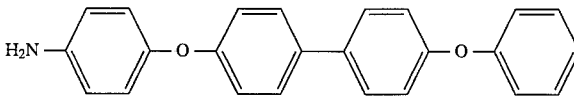<br>3.18 g (8.64 mmol) 40%<br>3,3'-(MeO)$_2$—DABP<br>3.17 g (12.96 mmol) 60% | Mixture of NMP (44.0 g) DMAc (44.0 g) | 14.0% (72.0 P) (1.61 dl/g) |
| 150 | p-TPDA 8.0 g (21.61 mmol) | 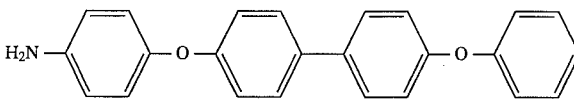<br>3.18 g (8.64 mmol) 40%<br>TSN<br>3.56 g (12.96 mmol) 60% | Mixture of NMP (36.0 g) DMAc (36.0 g) | 17.0% (66.0 P) (1.53 dl/g) |

Example 1

Figure 2B:
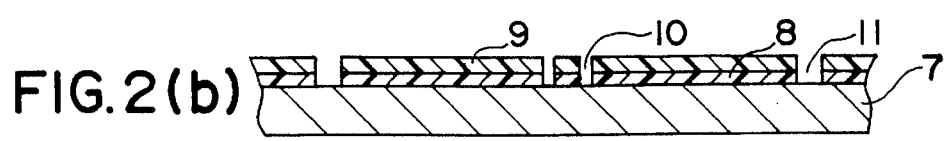
Figure 2C:
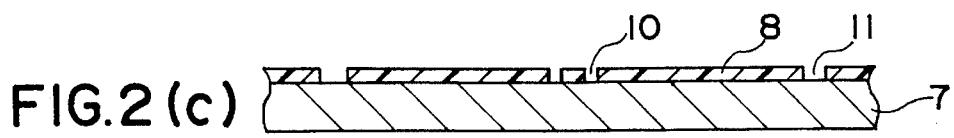
Figure 2D:
Figure 2E:
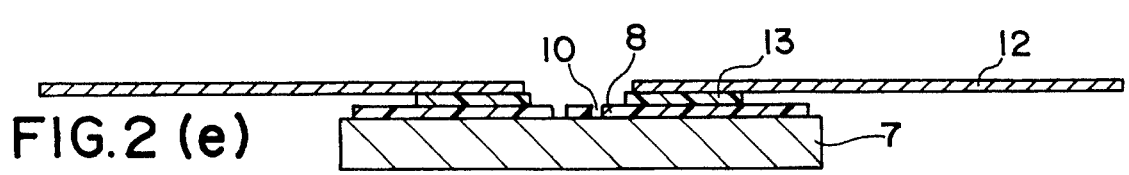
Figure 2F:
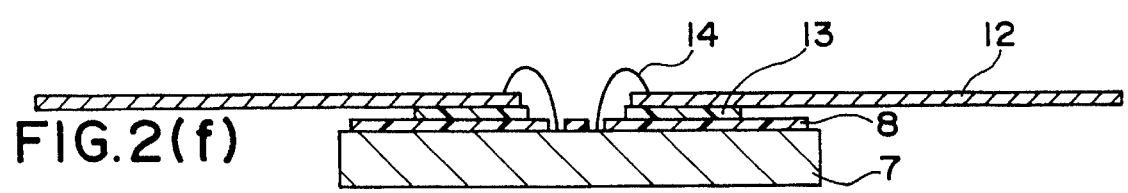
Figure 2G:
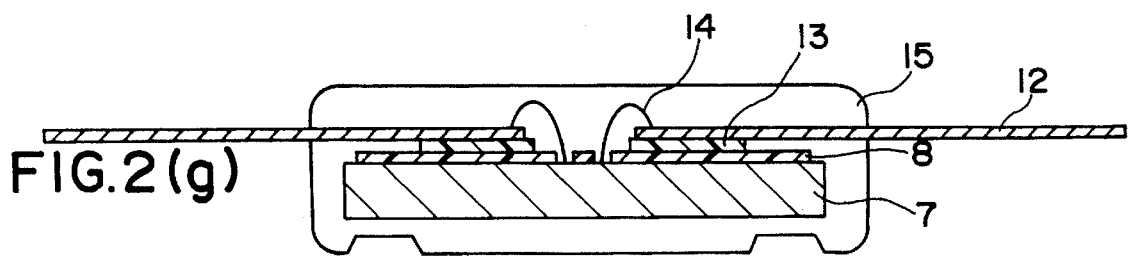
Figure 2H:
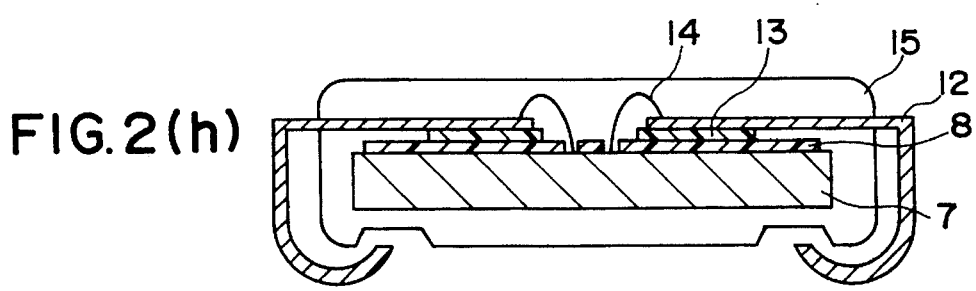

A cross section of a dynamic random-access memory (DRAM) fabricated in accordance with the first aspect of the present invention and the process scheme are shown in FIGS. 2(a)–(h). Poly(amic acid) varnish (sample No. 1 in Table 1) was whirl-coated on a silicon wafer 7 having device regions and metalization layers fabricated therein and heated first at 200° C. for 30 min, then at 350° C. for 30 min to be cured to a polyimide film 8. The polyimide film had a thickness of 10 μm (FIG. 2a). Then, a plasma-resistant positive-acting photoresist 9 (RU-1600P of Hitachi Chemical Co., Ltd.) was coated on the polyimide resin layer 8 and dried. The photoresist was exposed to light through a photomask and subsequently developed, rinsed and dried to form a predetermined pattern. Thereafter, with the photoresist pattern 9 being used as mask, the polyimide resin layer 8 was selectively removed in bonding pads 10 and scribing regions 11 by means of reactive ion etching using oxygen gas ($O_2$-RIE) (FIG. 2b). Then, the photoresist was removed with a resist stripper (S502A of Tokyo Ohka Kogyo Co., Ltd.) (FIG. 2c). The thus prepared polyimide film 8 having the substrate exposed in bonding pads 10 and scribing regions 11 was used as an α-particle shield. Subsequently, the wafer was sliced into individual chips by cutting in the scribing regions (FIG. 2d). External terminals 12 supported on polyimide films 13 having a polyamideimideether adhesive layer on the underside were thermocompressed to the surface of each chip at 400° C. (FIG. 2e). Thereafter, the bonding pads 10 were connected to the external terminals 12 by gold wires 14 using a wire bonder (FIG. 2f) and the assembly was molded in a silica-containing epoxy sealant at a temperature of 180° C. and at a pressure of 70 kg/cm$^2$ to form a resin package 15 (FIG. 2g). In the last step, the external terminals were bent in a predetermined shape to yield a completed form of DRAM (FIG. 2h). No cracks were found in the polyimide film of the thus fabricated DRAM. The device had high reliability as evidenced by the absence of failures both in a heat cycle test in which the device was subjected to alternate cycles of exposure to −55° C. and 150° C. and in a heat resistance test in which the device was subjected to several cycles of heating at 260° C., each cycle lasting for 10 sec.

Examples 2–5

Additional DRAMs were fabricated by repeating the procedure of Example 1 except that poly(amic acid) varnish was prepared from the components listed for Nos. 2, 4, 8 and 10 in Table 1. Each of the devices had high reliability as evidenced by the absence of failures in a heat cycle test and a heat resistance test.

Examples 6–11

Additional DRAMs were fabricated by repeating the procedure of Example 1 except on the following points: to enhance the strength of adhesion between the polyimide layer and the underlying layer, silicon wafer 7 was coated with a solution of 1% aluminum monoethyl acetate diisopropylate and heated at 350° C. in an oxygen atmosphere; and poly(amic acid) varnish was prepared from the components listed for Nos. 3, 5, 6, 7, 9 and 20 in Table 1. Each of the devices had high reliability as evidenced by the absence of failures in a heat cycle test and a heat resistance test.

Example 12

Figure 3:
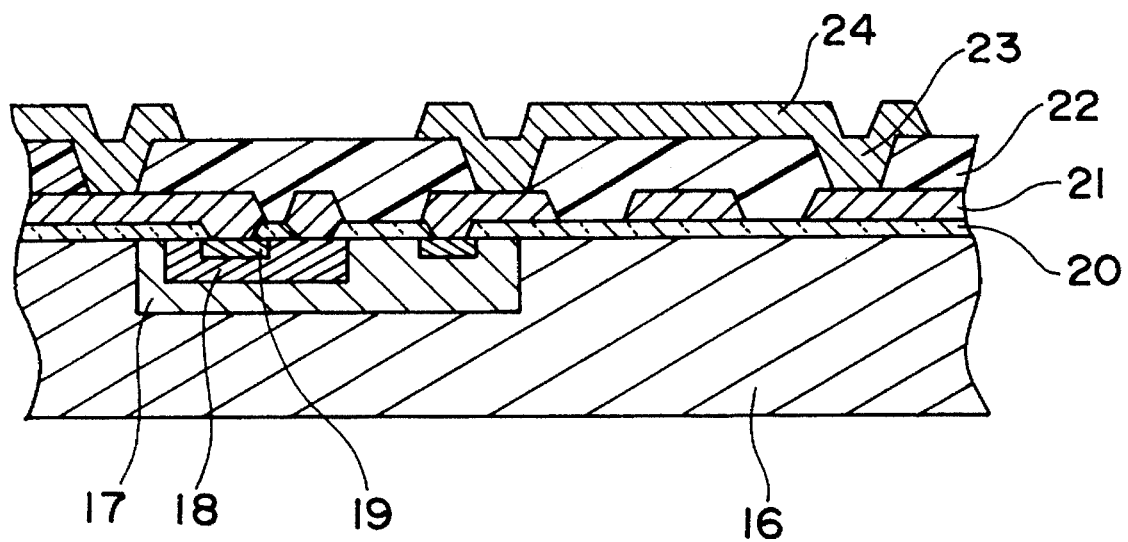
FIG. 3 is a sectional view showing a cross-sectional structure of a linear IC according to the present invention.

FIG. 3 shows a cross section of a linear IC that was fabricated as a two-level metalization structure in accordance with the first aspect of the present invention. The fabrication process is described below. A collector region 17, a base region 18 and an emitter region 19 were fabricated in a silicon wafer 16. In preparation for the formation of the respective electrodes, through-holes were formed in a $SiO_2$ layer 20. As a conductor for the first level of metalization, Al 21 was deposited to a thickness of 2 μm by vacuum evaporation and patterned by a known photoetching technique. To enhance the strength of adhesion between polyimide layer and the underlying layer, the substrate was coated with a solution of 1% aluminum monoethyl acetate diisopropylate and heated at 350° C. in an oxygen atmosphere for 5 min. Then, poly(amic acid) varnish (No. 1) was whirl-coated and heated first at 200° C. for 30 min, then at 350° C. for 30 min to be cured to a polyimide film 22. This polyimide film (inter-level insulator) had a thickness of 2.5 μm. Then, a plasma-resistant positive-acting photoresist (RU-1600P of Hitachi Chemical Co., Ltd.) was coated on the polyimide resin layer 22 and dried. The photoresist was exposed to light through a photomask and subsequently developed, rinsed and dried to form a predetermined pattern. Thereafter, predetermined areas 23 in which through-holes were to be formed in the polyimide resin layer 22 were selectively removed by reactive ion etching using oxygen gas ($O_2$-RIE), with the photoresist pattern being used as a mask. Subsequently, the photoresist was removed with the aid of a resist stripper (S502A of Tokyo Ohka Kogyo Co., Ltd.). Then, the substrate was treated with an aqueous solution of sulfamic acid in order to remove the oxide layer from the surface of the Al layer which was at the first level of metalization and exposed in the through-holes; subsequently, the substrate was treated with a liquid Al etchant for a short time to produce a fresh Al surface, followed by washing with water. After drying the substrate, an Al layer 24 as a conductor for the second level of metalization was deposited to a thickness of 2 μm by vacuum evaporation and patterned by a known photoetching technique. The inter-level insulator 22 in the thus fabricated two-level metalization structure had no observable cracks or defects. The substrate was cut to individual chips and external terminals were attached to each chip, followed by bonding with Au wires and resin molding. The final devices thus completed were subjected to reliability tests as in Example 1 but no failures occurred.

Examples 13–16

Additional linear ICs of a two-level metalization structure were fabricated by repeating the procedure of Example 12 except that the poly(amic acid) varnish was prepared from the components listed for Nos. 3, 5, 8 and 11 in Table 1. None of the devices had observable cracks or defects in the inter-level insulator 22 which was the cured product (polyimide) of the poly(amic acid) varnish. Each device had high reliability as evidenced by the absence of failures in a heat cycle test and a heat resistance test.

Example 17

Figure 4:
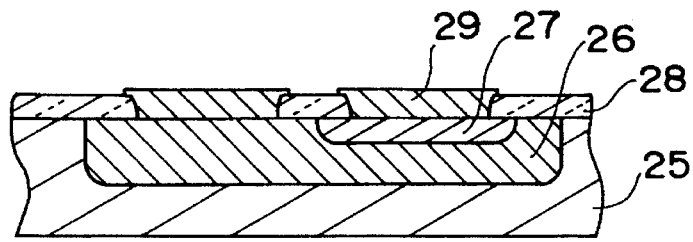
FIG. 4 are sectional views showing a cross-sectional structure of a discrete transistor according to the present invention.
Figure 4:
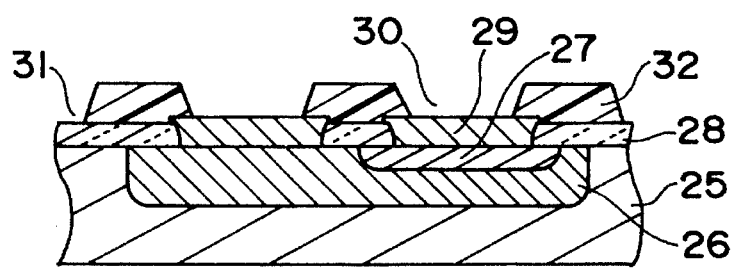
Figure 4C:
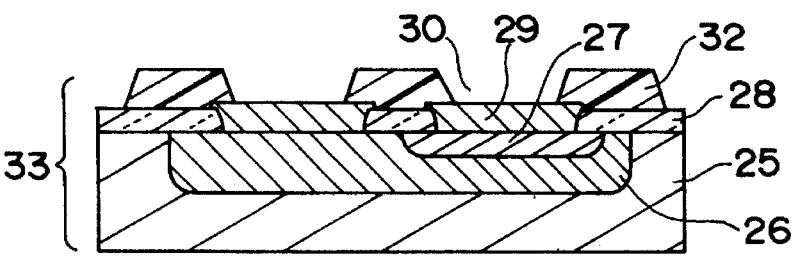
Figure 4:
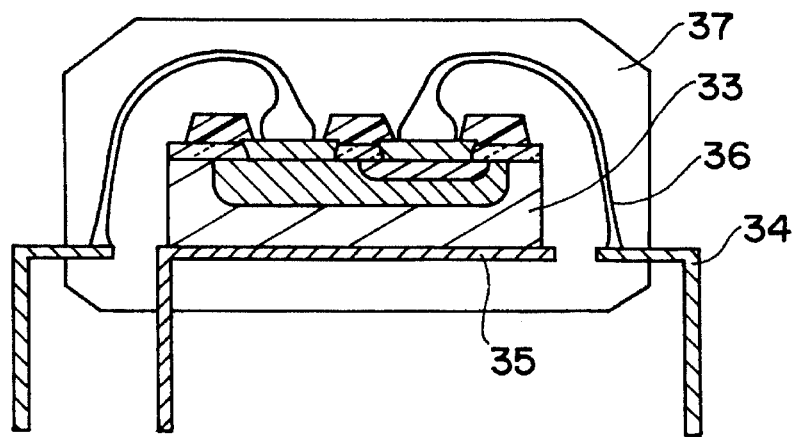

A cross section of a discrete transistor fabricated in accordance with the first aspect of the present invention and the process scheme are shown in FIGS. 4(a)–(d). A base region 26 and an emitter region 27 were fabricated in a silicon wafer 25 (also serving as a collector). In preparation for the formation of the respective electrodes, through-holes were formed in a $SiO_2$ layer 28. To make a conductor layer for bonding pads, Al 29 was deposited to a thickness of 2 μm by vacuum evaporation and patterned by a known photoetching technique (FIG. 4a). To enhance the strength of adhesion between the polyimide layer and the underlying layer, the substrate was coated with a solution of 1% aluminum monoethyl acetate diisopropylate and heated at 350° C. for 5 min in an oxygen atmosphere. Then, poly(amic acid) varnish (No. 5) was whirl-coated and heated first at 200° C. for 35 min, then at 350° C. for 30 min to be cured to a polyimide film 32. This polyimide film (inter-level insulator) had a thickness of 2.5 μm. Then, a plasma-resistant positive-acting photoresist (RU-1600P of Hitachi Chemical Co., Ltd.) was coated on the polyimide resin layer 32 and dried. The photoresist was exposed to light through a photomask and subsequently developed, rinsed and dried to form a predetermined pattern. Thereafter, bonding pads 30 which would provide through-holes in the polyimide resin layer 32 were selectively removed by reactive ion etching using oxygen gas ($O_2$-RIE), with the photoresist pattern being used as a mask. Subsequently, the photoresist was removed with the aid of a resist stripper (S502A of Tokyo Ohka Chemical Co., Ltd.) (FIG. 4b). Then, the substrate was treated with an aqueous solution of sulfamic acid in order to remove the oxide layer from the surface of the Al layer of metalization which was exposed in the bonding pads 30; subsequently, the substrate was treated with a liquid Al etchant for a short time to produce a fresh Al surface, followed by washing with water. Subsequently, the wafer was sliced into individual chips 33 by cutting in scribing regions 31 (FIG. 4c). Each chip was mounted on a leadframe 35 also serving as external terminals and, thereafter, the bonding pads were connected to external terminals 34 by gold wires 36 using a wire bonder and the assembly was molded in a silica-containing epoxy sealant at a temperature of 180° C. and at a pressure of 70 kg/cm$^2$ to form a resin package 37. In the last step, the resin sealed chip was cut out of the leadframe and the external terminals were bent in a predetermined shape to yield a completed discrete transistor (FIG. 4d). No cracks or debonding was found in the polyimide film of the thus fabricated discrete transistor. The device had high reliability as evidenced by the absence of failures both in a heat cycle test in which the device was subjected to alternate cycles of exposure to −55° C. and 150° C. and in a heat resistance test in which the device was subjected to several cycles of heating at 260° C., each cycle lasting for 10 sec.

Examples 18–22

Additional discrete transistors were fabricated by repeating the procedure of Example 17 except that the poly(amic acid) varnish was prepared from the components listed for Nos. 1, 7, 10 and 12 in Table 1. None of the devices had observable cracks or defects in the protective polyimide film, nor did it experience any debonding. Each device had high reliability as evidenced by the absence of failures in a heat cycle test and a heat resistance test.

Example 23

Figure 5:
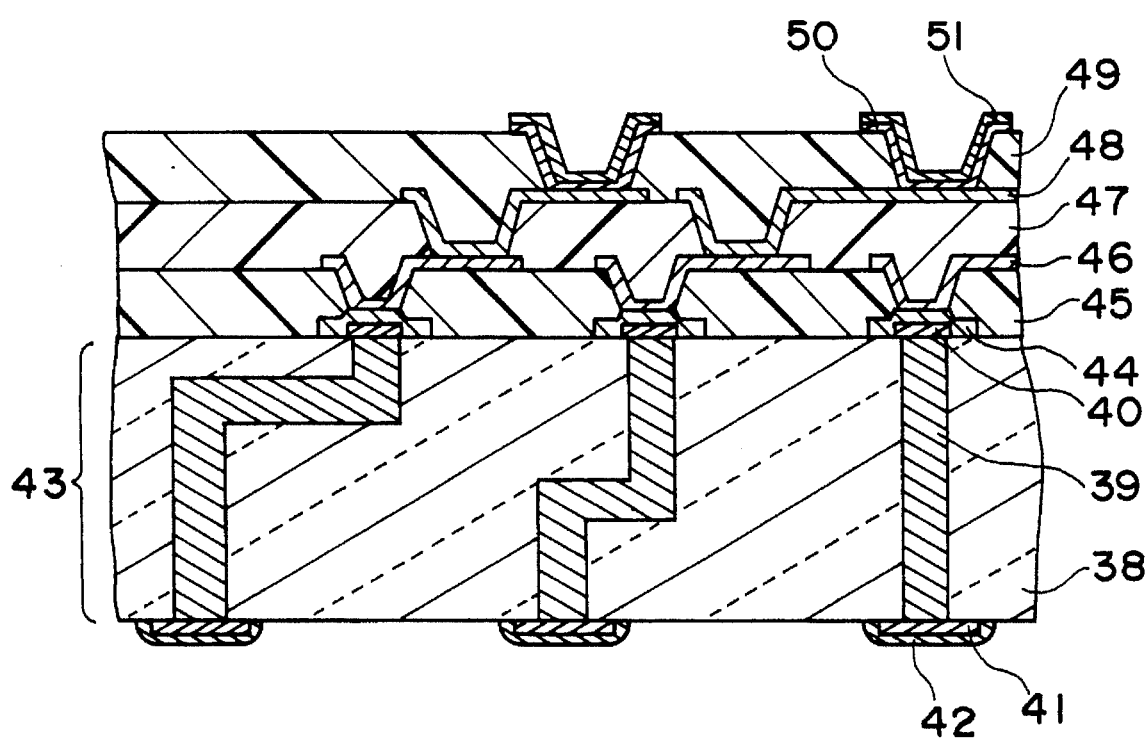
FIG. 5 is a sectional view showing a cross-sectional structure of a thin-film multilevel wiring board according to the present invention.

FIG. 5 shows schematically a cross section of a thin-film multilevel wiring board for computers that was fabricated as a multilevel metalization structure in accordance with the first aspect of the present invention. The fabrication process is described below. A square ceramic substrate 43 (10 mm per side and 1 mm thick) was provided with tungsten conductor paths 39 through the ceramic layer 38; each tungsten conductor path had a nickel layer 40 plated on its top provided as an upper electrode whereas it had a nickel layer 41 and a gold layer 42 plated on the bottom provided as lower electrodes. A conductive Al layer was deposited to a thickness of 3 μm by vacuum evaporation on the ceramic substrate 43 and processed by a known photoetching technique to produce a predetermined Al pattern 44 covering the nickel layer 40. Then, poly(amic acid) varnish (No. 2 in Table 1) was whirl-coated on the substrate and heated in an oven first at 200° C. for 30 min, then at 350° C. for 30 min to be cured to a polyimide film 45. This polyimide film (interlevel insulator) had a thickness of 7 μm. Then, the polyimide resin layer 45 was overlaid with a mask of predetermined pattern and exposed to pulsed light from an excimer laser (LNDEX 200K of Lumonics Inc.; KrF, 248 nm; pulse width, 16 ns) to form through-holes 70 μm in diameter. The energy density of the laser beam was 0.4 J/cm$^2$ and 60 pulses were applied at the "just etch" time (neither overetch nor underetch). Thereafter, Al was deposited to a thickness of 3 μm by vacuum evaporation and patterned by a known photoetching technique to form an Al pattern 46 in the first level of metalization. By repeating the procedure described above, an insulating layer and metalization layers were formed alternately in the order of a second-level polyimide film 47 (through-hole diameter, 70 μm; thickness, 7 μm), an Al pattern 48 in the second level of metalization (thickness, 3 μm), and a third-level polyimide film 49 (through-hole diameter, 70 μm; thickness, 7 μm). Thereafter, chromium and nickel-copper alloy were deposited successively in respective film thicknesses of 0.07 μm and 0.7 μm by vacuum evaporation and the Cr/Ni-Cu layer 50 having a diameter of 150 μm was patterned in the through-holes in the third-level polyimide film by a known photoetching technique. The top of the substrate was plated with a nickel layer and a gold layer in that order to form upper electrodes each composed of a composite Ni/Au film 51. With the thin-film multilevel wiring board being fabricated by the method described above, the bow of the substrate was negligibly small and there were no observable cracks and other defects in the polyimide films. Furthermore, the step coverage of the Al metalization layers above the through-holes was good enough to insure satisfactory electrical paths for all metalization layers.

Example 24

Figure 6:
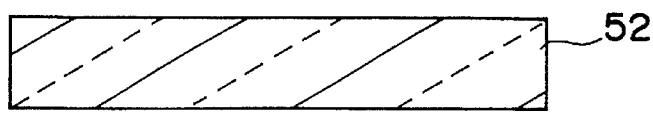
FIGS. 6(a)–(m) are cross-sectional views showing an example of the process for fabricating a copper-polyimide thin-film multilevel wiring board according to the present invention.
Figure 6:
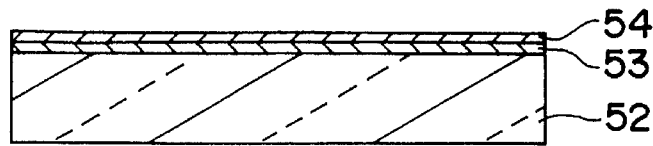
Figure 6:
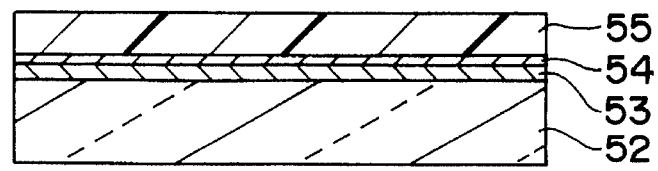
Figure 6:
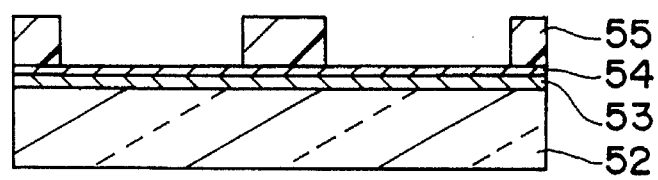
Figure 6:
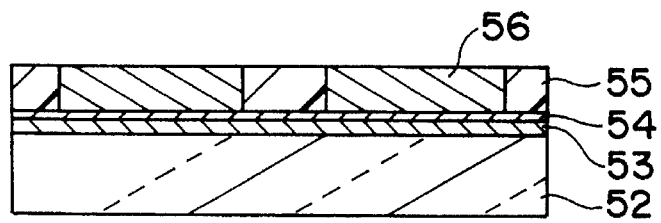
Figure 6:
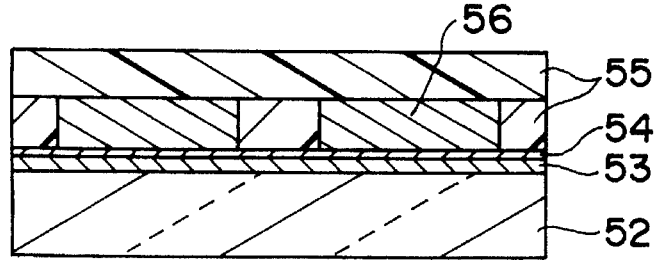
Figure 6:
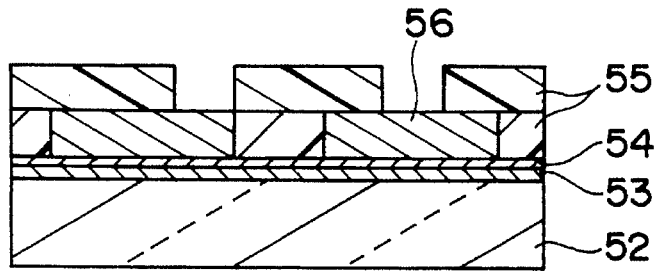
Figure 6:
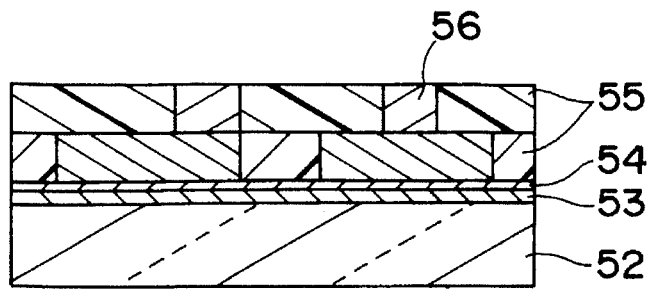
Figure 6:
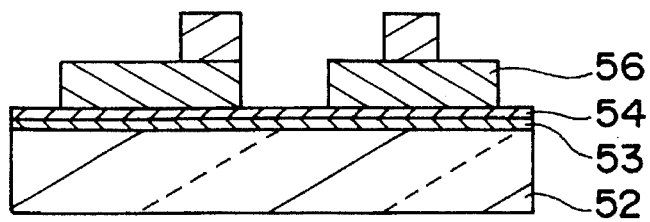
Figure 6:
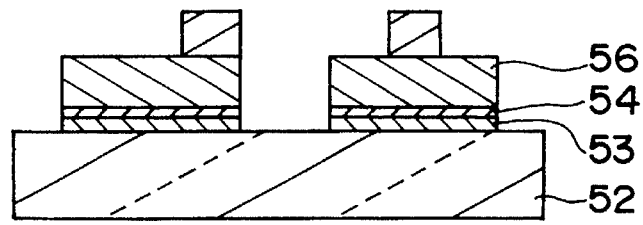
Figure 6:
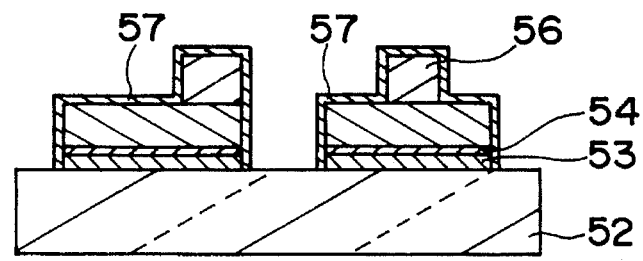
Figure 6:
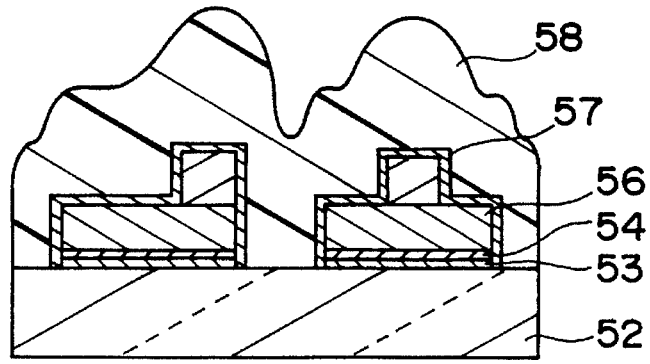
Figure 6:
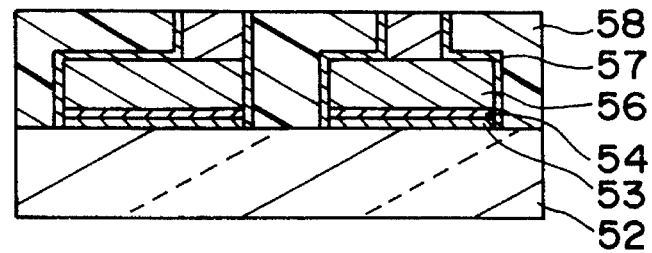

A copper-polyimide multilevel metalization structure was fabricated in accordance with the first aspect of the present invention by the following process, whose scheme is shown in FIGS. 6(a)–(m). A square ceramic substrate 52 (FIG. 6b) was provided with tungsten conductor paths through a mullite-base ceramic layer (100 mm per side; 5 mm thick); each tungsten conductor path had a chromium layer 53 (0.05 μm) and a copper layer 54 (0.5 μm) on its top that were sputter-formed as preplating films (FIG. 6b). A positive-acting resist 55 was whirl-coated over the substrate and heated at 90° C. for 30 min in a nitrogen atmosphere. The applied resist film 55 had a thickness of 10 μm (FIG. 6c). Then, the resist was exposed to light through a mask of predetermined pattern and subsequently developed and rinsed (FIG. 6d), followed by electroplating to form a copper plate 56. The plating bath consisted of $CuSO_4/5H_2O$ (70 g/L), $H_2SO_4$ (140 g/L) and HCl (50 ppm); the current density was 1.0 A/dm$^2$; and it took 40 min to produce a Cu plate 10 μm thick (FIG. 6e). After the end of copper plating, the substrate was washed with water and vacuum-dried at 80° C. for 1 h. The steps depicted in FIGS. 6c to 6e were repeated (FIGS. 6f–6h). The resist 55 was stripped with a stripper (FIG. 6i) and cleaned with an alcoholic organic solvent. Subsequently, those parts of the preplating Cu and Cr films which did not actually serve as the basis for the subsequent Cu plating were selectively removed using suitable etchants, namely ammonium chloride base etchant for the Cu film and a mixed solution of potassium ferricyanide/sodium hydroxide for the Cr film (FIG. 6j). After washing with water, nickel plating was conducted and the Ni plate was washed with water, followed by vacuum drying (FIG. 6k). By applying this protective Ni film to copper, the reaction between copper and the poly(amic acid) to be subsequently coated (i.e., copper oxidation) could be prevented. In the next step, poly(amic acid) varnish (No. 2) was whirl-coated and heated first at 200° C. for 30 min, then at 350° C. for 30 min in a nitrogen atmosphere. The polyimide film as the cured product had a thickness of 10 μm (FIG. 6L). The polyimide layer was rendered smooth by polishing with a tape carrying alumina particles (#500–#4000) on the surface, and the polished layer was cleaned with acetone (FIG. 6m). By repeating the steps depicted in FIGS. 6b–6m ten times, a copper-polyimide multilevel metalization structure having ten levels of metalization was produced (total thickness of thin films: 400 μm). With the multilevel metalization structure completed in the manner described above, the final bow of the substrate was as small as 9 μm and the polyimide films experienced no observable delamination or cracking, nor was there found any corrosion or other defects in the metalization layers. Hence, satisfactory electrical paths were insured for all metalization layers.

Examples 25–27 and 147–150

Additional copper-polyimide multilevel metalization structures containing ten levels of metalization were produced by repeating the procedure of Example 24 except that the poly(amic acid) varnish was prepared from the components listed as Nos. 5, 8, 10 and 147–150 in Table 1. In all of the completed multilevel metalization structures, the final bow of the substrate was as small as 16 μm and below and the polyimide films experienced no observable delamination or cracking, nor was there found any corrosion or other defects in the metalization layers. Hence, satisfactory electrical paths were insured for all metalization layers.

Comparative Example 1

Poly(amic acid) varnish was synthesized from the components listed for No. 13 in Table 2 by the same method as used in Synthesis 1. The varnish was whirl coated on a glass substrate and heated first at 200° C. for 30 min, then at 350° C. for 30 min to prepare a polyimide film 8 μm thick. The film was extremely brittle and the elongation was no more than 1%. A DRAM was fabricated by repeating the procedure of Example 1 except that varnish No. 13 was used. After forming particle shield (polyimide film 8 in FIG. 2c), the processed substrate was sliced into individual chips by cutting in the scribing regions (FIG. 2d). External terminals 12 supported on polyimide films 13 having a polyamideimide ether adhesive layer on the underside were thermocompressed onto the surface of each chip at 400° C. (FIG. 2e). However, so many cracks developed in the polyimide film 8 that a completed device could not be fabricated.

Comparative Example 2

Poly(amic acid) varnish was synthesized from the components listed for No. 14 in Table 2 (in which "BPDA" stands for biphenyl-3,3',4,4'-tetracarboxylic dianhydride) by the same method as used in Synthesis 1. The varnish was whirl-coated on a glass substrate and heated first at 200° C. for 30 min, then at 350° C. for 30 min to prepare a polyimide film 8 μm thick. The film was extremely brittle and the elongation was no more than 3%. An attempt was made to fabricate a linear IC by repeating the procedure of Example 12 except that varnish No. 14 was used. When the pattern of second-level Al metalization was formed, so many cracks developed in the underlying polyimide layer that a complete device could not be fabricated.

Comparative Example 3

Poly(amic acid) varnish was synthesized from the components listed for No. 15 in Table 2 by the same method as used in Synthesis 1. The varnish was whirl-coated on a glass substrate and heated first at 200° C. for 30 min, then at 350° C. for 30 min to prepare a polyimide film 8 μm thick. The film was extremely brittle and the elongation was no more than 2%. An attempt was made to fabricate a discrete transistor by repeating the procedure of Example 17 except that varnish No. 15 was used. After forming the polyimide pattern, the device was subjected to a heat cycle test in which it was subjected to alternate cycles of exposure to −55° C. and 150° C. The interior of the device was examined by ultrasonic probing and so many cracks were found to have developed that a complete device could not be fabricated.

Comparative Example 4

Poly(amic acid) varnish was synthesized from the components listed for No. 16 in Table 2 by the same method as used in Synthesis 1. The varnish was whirl-coated on a glass substrate and heated first at 200° C. for 30 min, then at 350° C. for 30 min to prepare a polyimide film 8 μm thick. The film was highly flexible and the elongation was 50% or more; however, the thermal expansion coefficient α was as high as 42 ppm/°C. where the glass transition point Tg was as low as 325° C. Using this poly(amic acid) varnish, an attempt was made to fabricate a copper-polyimide multilevel metalization structure by the same method as used in Example 24. When the number of metalization levels was increased to five, a polyimide layer was debonded from the ceramic substrate and a complete device could not be fabricated. The bow of the substrate as measured when four levels of metalization were established was found to be 66 μm. As a further problem, no complete adhesion could be achieved between the mask and the topmost layer on the substrate in the step where a photoresist was used for copper plating, and there were great variations in pattern size. In addition, cracking and excessive curvature occurred in part of the second to fourth levels of copper metalization.

Comparative Examples 5–7

Additional samples of poly(amic acid) varnish were synthesized from the components listed for Nos. 17–19 in Table 2 by the same method as used in Synthesis 1. Those varnish samples were whirl-coated on glass substrates and heated first at 200° C. for 30 min, then at 350° C. for 30 min to prepare polyimide films 8 μm thick. The films were highly flexible and the elongation was at least 20% in all films; however, the thermal expansion coefficient α was as high as 40 ppm/°C. whereas the glass transition point Tg was as low as 330° C. and less. Using these samples of poly(amic acid) varnish, an attempt was made to fabricate copper-polyimide multilever metalization structures by the same method as used in Example 24. When the number of metalization levels was increased to five, a polyimide layer was debonded from the ceramic substrate and a complete device could not be fabricated. The bow of the substrate as measured when four levels of metalization were established was found to be 64 μm, 75 μm and 68 μm for the respective cases where varnish sample Nos. 17, 18 and 19 were used. As a further problem, strong adhesion could not be achieved between the mask and the topmost layer on the substrate in the step where a photoresist was used for copper plating, and there were great variations in pattern size. In addition, cracking and excessive curvature occurred in part of the second to fourth levels of copper metalization.

TABLE 2

Polymer Composition for Comparative Examples 1–7

| Varnish No. | Acid dianhydride component | Diamine component | | Solvent | Solids content (final viscosity in parentheses) |
|---|---|---|---|---|---|
| 13 | TPDA 7.340 g (19.82 mmol) | 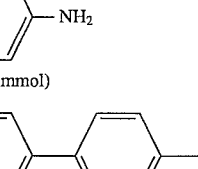 5.160 g (19.82 mmol) | | Mixture of NMP (30.5 g) DMAc (30.5 g) | 17.0% (49.9 P) |
| 14 | BPDA 8.0 g (27.19 mmol) | 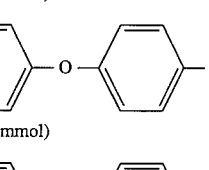 2.940 g (27.19 mmol) | | Mixture of NMP (30.0 g) DMAc (30.0 g) | 15.4% (68.8 P) |
| 15 | BPDA 5.0 g (16.99 mmol) | 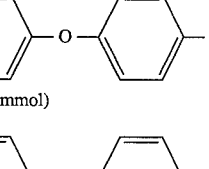 4.424 g (16.99 mmol) | | Mixture of NMP (28.0 g) DMAc (28.0 g) | 15.9% (47.6 P) |
| 16 | TPDA 5.025 g (13.57 mmol) | 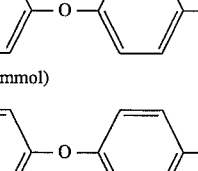 5.216 g (13.57 mmol) | | Mixture of NMP (29.0 g) DMAc (29.0 g) | 15.0% (41.7 P) |
| 17 | TPDA 5.134 g (13.86 mmol) | 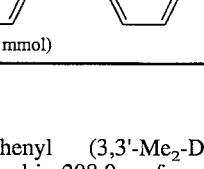 5.107 g (13.86 mmol) | | Mixture of NMP (29.0 g) DMAc (29.0 g) | 15.0% (40.4 P) |
| 18 | TPDA 5.025 g (13.57 mmol) | 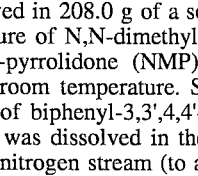 5.571 g (13.57 mmol) | | Mixture of NMP (29.0 g) DMAc (29.0 g) | 15.4% (41.7 P) |
| 19 | BPDA 8.000 g (27.19 mmol) | 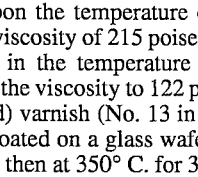 5.445 g (27.19 mmol) | | Mixture of NMP (35.0 g) DMAc (35.0 g) | 16.1% (87.5 P) |

Synthesis 21

3,3'-Dimethyl-4,4'-diaminobiphenyl (3,3'-Me$_2$-DABP; 13.0 g, 61.24 mmol) was dissolved in 208.0 g of a solvent system composed of a 1:1 mixture of N,N-dimethylacetamide (DMAc) and N-methyl-2-pyrrolidone (NMP) with stirring in a nitrogen stream at room temperature. Subsequently, 18.02 g (61.24 mmol) of biphenyl-3,3',4,4'-tetracarboxylic dianhydride (BPDA) was dissolved in the prepared solution with stirring in a nitrogen stream (to a total solids content of 13%), whereupon the temperature of the solution rose to about 30° C. at a viscosity of 215 poises. The solution was given further heat in the temperature range 55°–65° C. for about 6 h to adjust the viscosity to 122 poises. The thus prepared poly(amic acid) varnish (No. 13 in Table 3 to be given below) was whirl coated on a glass wafer and heated first at 200° C. for 30 min, then at 350° C. for 30 min to produce a polyimide film. The film had the following characteristics: $\epsilon$=2.8 (10 kHz at 25° C.); Tg>400° C.; $\alpha$=7 ppm/°C.; and elongation: 11%.

Synthesis 22

3,3'-Me$_2$-DABP (8.0 g, 37.7 mmol) and bis[4-(4-aminophenoxy) phenyl] ether (BAPE; 2.67 g, 6.94 mmol) were dissolved in 146.0 g of a solvent system composed of a 1:1 (by weight) mixture of N,N-dimethylacetamide (DMAc) and N-methyl-2-pyrrolidone (NMP) with stirring in a nitrogen stream at room temperature. Subsequently, 13.13 g (44.64 mmol) of BPDA was dissolved in the prepared solution with stirring in a nitrogen stream (to a total solids content of 14%), whereupon the temperature of the solution rose to about 30° C. at a viscosity of 208 poises. The solution was given further heat in the temperature range 55°–65° C. for about 5 h to adjust the viscosity to 88 poises. The prepared poly(amic acid) varnish (No. 22 in Table 3) was whirl-coated on a glass wafer and heated first at 200° C. for 30 min, then at 350° C. for 30 min to produce a polyimide film. The film had the following characteristics: $\epsilon$=2.8 (10 kHz at 25° C.); Tg=390° C.; $\alpha$=12 ppm/°C.; and elongation: 16%.

Synthesis 23

3,3'-Me$_2$-DABP (12.0 g, 56.52 mmol) and 1,3-bis(3-aminopropyl)tetramethyl disiloxane (BAMS; 0.6 g, 2.41 mmol) were dissolved in 170.0 g of a solvent system composed of a 1:1 (by weight) mixture of N,N-dimethylacetamide (DMAc) and N-methyl-2-pyrrolidone (NMP) with stirring in a nitrogen stream at room temperature. Subsequently, 17.34 g (58.93 mmol) of BPDA was dissolved in the prepared solution with stirring in a nitrogen stream (to a total solids content of 15%), whereupon the temperature of the solution rose to about 30° C. at a viscosity of 220 poises. The solution was given further heat in the temperature range 55°–65° C. for about 5 h to adjust the viscosity to 103 poises. The prepared poly(amic acid) varnish (No. 23 in Table 3) was whirl-coated on a glass wafer and heated first at 200° C. for 30 min, then at 350° C. for 30 min to produce a polyimide film. The film had the following characteristics:

Using the components listed in Tables 3 and 4, additional samples of poly(amic acid) varnish were synthesized by the same method as used in Syntheses 21–23 (the samples are designated as Nos. 24–38 in Tables 3 and 4). The relevant data of solids content and viscosity are also given in Tables 3 and 4. Polyimide films were produced from those samples of poly(amic acid) varnish by the same method as used in Synthesis 21 and they had the following characteristics: $\epsilon=2.8–3.2$; $Tg \geq 380°$ C.; $\alpha=7–18$ ppm/°C.; and elongation= 10–18%. The abbreviations that appear in the column of "Amine Component" and which are yet to be defined have the following meanings: TPE, 1,4-bis(4-aminophenoxy)benzene; AEMS, 3-aminopropyldiethoxymethylsilane; HFBAPP, 2,2-bis[4-(4-aminophenoxy)phenyl]hexafluoropropane.

TABLE 3

Polymer Composition for Syntheses 21–38

| Varnish No. | Acid dianhydride component | Amine Component | Solvent | Solids content (final viscosity in parentheses) |
|---|---|---|---|---|
| 21 | BPDA | 3,3'-Me$_2$—DABP | DMAc:NMP = 1:1 (by weight) | 13% by weight (122 P) |
| 22 | BPDA | 3,3'-Me$_2$—DABP:BAPE = 3:1 (by weight) | DMAc:NMP = 1:1 (by weight) | 14% by weight (88 P) |
| 23 | BPDA | 3,3'-Me$_2$—DABP:BAMS = 20:1 (by weight) | DMAc:NMP = 1:1 (by weight) | 15% by weight (103 P) |
| 24 | BPDA | 2,2'-Me$_2$—DABP | DMAc:NMP = 1:1 (by weight) | 13% by weight (92 P) |
| 25 | BPDA | 2,2'-Me$_2$—DABP:TPE = 1:2 (by weight) | DMAc:NMP = 1:1 (by weight) | 14% by weight (83 P) |
| 26 | BPDA | 2,2'-Me$_2$—DABP:AEMS = 20:1 (by weight) | DMAc:NMP = 1:1 (by weight) | 16% by weight (76 P) |
| 27 | BPDA | 3,5,3',5'-Me$_4$—DABP | DMAc:NMP = 1:1 (by weight) | 13% by weight (68 P) |
| 28 | BPDA | TSN:HFBAPP = 3:1 (by weight) | DMAc:NMP = 1:1 (by weight) | 14% by weight (76 P) |
| 29 | BPDA | 3,3''-Me$_2$—DATP | DMAc:NMP = 1:1 (by weight) | 12% by weight (56 P) |

TABLE 4

Polymer Composition for Syntheses 21–38

| Varnish No. | Acid dianhydride component | Amine Component | Solvent | Solids content (final viscosity in parentheses) |
|---|---|---|---|---|
| 30 | BPDA | 2-Me—PDA | DMAc:NMP = 1:1 (by weight) | 14% by weight (89 P) |
| 31 | PMDA | 3,3'-Me$_2$—DABP:BAPE = 3:1 (by weight) | DMAc:NMP = 1:1 (by weight) | 13% by weight (74 P) |
| 32 | PMDA | 3,3'-Me$_2$—DABP:BAMS = 20:1 (by weight) | DMAc:NMP = 1:1 (by weight) | 15% by weight (96 P) |
| 33 | PMDA | 2,2'-Me$_2$—DABP | DMAc:NMP = 1:1 (by weight) | 13% by weight (67 P) |
| 34 | PMDA | 2,2'-Me$_2$—DABP:TPE = 3:1 (by weight) | DMAc:NMP = 1:1 (by weight) | 14% by weight (76 P) |
| 35 | PMDA | 2,2'-Me$_2$—DABP:AEMS = 20:1 (by weight) | DMAc:NMP = 1:1 (by weight) | 16% by weight (71 P) |
| 36 | PMDA | 3,5,3',5'-Me$_4$—DABP | DMAc:NMP = 1:1 (by weight) | 13% by weight (66 P) |
| 37 | PMDA | TSN:HFBAPP = 3:1 (by weight) | DMAc:NMP = 1:1 (by weight) | 14% by weight (62 P) |
| 38 | PMDA | 2,5'-Me$_2$-DATP | DMAc:NMP = 1:1 (by weight) | 12% by weight (58 P) |

$\epsilon=2.8$ (10 kHz at 25° C.); $Tg \cong 400°$ C.; $\alpha=10$ ppm/°C.; and elongation: 10%.

Syntheses 24–38

Example 28

Figure 8:
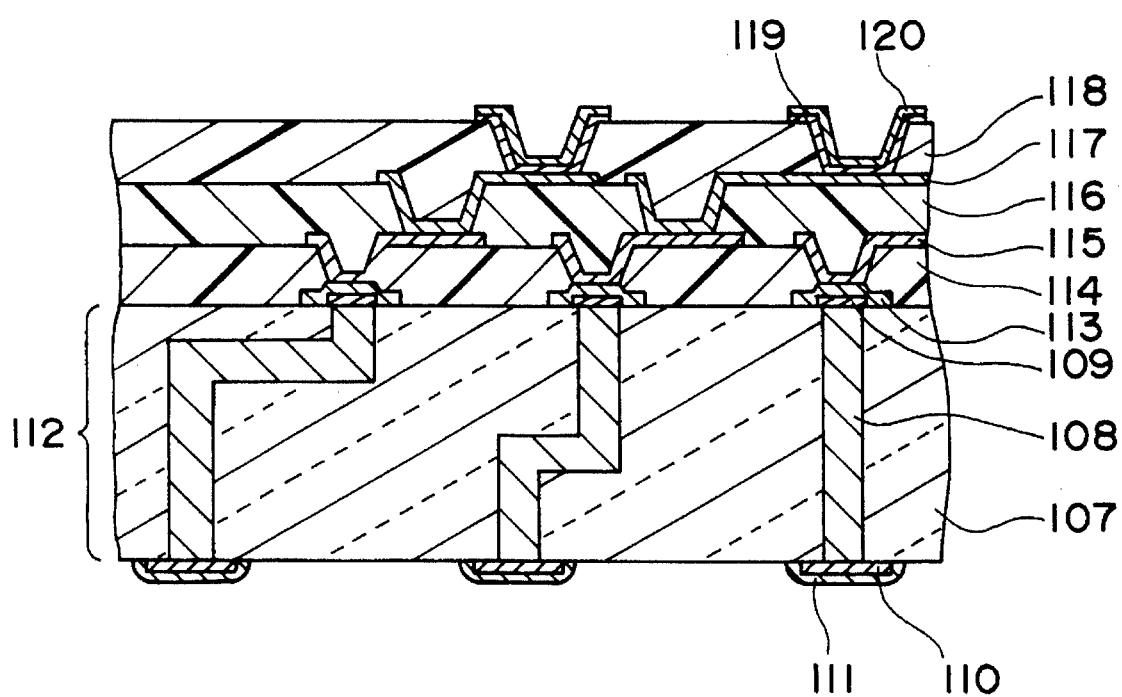
FIG. 8 is a sectional view showing a cross-sectional structure of another thin-film multilevel wiring board according to the present invention.

FIG. 8 shows schematically a cross section of a thin-film multilevel wiring board for computers that was fabricated as a multilevel metalization structure in accordance with the second aspect of the present invention. The fabrication process is described below on the basis of FIGS. 7(a)–(f). A square ceramic substrate 112 (10 mm per side and 2 mm thick) was provided with tungsten conductor paths 108 through the ceramic layer 107; each tungsten conductor path had a nickel layer 109 plated on its top provided as an upper electrode whereas it had a nickel layer 110 and a gold layer 111 plated on the bottom provided as lower electrodes. A conductive Al layer was deposited to a thickness of 3 µm by vacuum evaporation on the ceramic substrate 112 and processed by a known photoetching technique to produce a predetermined Al pattern 113 covering the nickel layer 109. (1) Then, in order to enhance the strength of adhesion between polyimide layer and the underlying layer, a solution of 1% aluminum monoethyl acetate diisopropylate was applied and given a heat treatment at 350° C. for 10 min in an oxygen atmosphere. (2) Subsequently, poly(amic acid) varnish (No. 21 in Table 3) was whirl-coated on the substrate and heated in an oven first at 200° C. for 30 min, then at 350° C. for 30 min to be cured to a polyimide film 114. This polyimide film (inter-level insulator) had a thickness of 75 µm. (3) Then, the polyimide resin layer 114 was overlaid with a mask of predetermined pattern and exposed to pulsed light from an excimer laser (LNDEX 200K of Lumonics Inc.; KrF, 248 nm; pulse width, 16 ns) to form through-holes 70 µm in diameter. The energy density of laser beam was 0.4 J/cm$^2$ and 60 pulses were applied at the "just etch" time (neither overetch nor underetch). (4) Thereafter, Al was deposited to a thickness of 3 µm by vacuum evaporation and patterned by a known photoetching technique to form an Al pattern 115 in the first level of metalization. (5) The surface of that pattern was subjected to 3-min ashing with oxygen gas at a pressure of 0.5 Torr, with RF energy being applied at a frequency of 13.56 MHz for a power of 300 W. By repeating steps (2)–(5) above, an insulating layer and metalization layers were formed alternately in the order of a second-level polyimide film 116 (through-hole diameter, 70 µm; thickness, 7.5 µm), an Al pattern 117 in the second level of metalization (thickness, 3 µm), and a third-level polyimide film 118 (through-hole diameter, 70 µm; thickness, 7.5 µm). Thereafter, chromium and nickel-copper alloy were deposited successively in respective film thicknesses of 0.07 µm and 0.7 µm by vacuum evaporation and the Cr/Ni-Cu layer 119 having a diameter of 150 µm was patterned in the through-holes in the third-level polyimide film by a known photoetching technique. The top of the substrate was plated with a nickel layer and a gold layer in that order to form upper electrodes each composed of a composite Ni/Au film 120. With the thin-film multilevel wiring board being fabricated by the method described above, the bow of the substrate was negligibly small. None of the devices involved separation of polyimide films from the substrate or separation between adjacent polyimide films, and there were no observable cracks or other defects in the polyimide films. Furthermore, the step coverage of the Al metalization layers above the through-holes was good enough to insure satisfactory electrical paths for all metalization layers.

Examples 29–35

Additional thin-film multilevel wiring boards were fabricated by the same method as used in Example 28 except that the poly(amic acid) varnish No. 21 was replaced by Nos. 22, 24, 27–29 (see Table 3), as well as Nos. 30 and 33 (see Table 4). The bow of the substrate in each of the wiring boards was negligibly small. None of the devices involved separation of polyimide film from the substrate or separation between adjacent polyimide films, and there were no observable cracks or other defects in the polyimide films. Furthermore, the step coverage of the Al metalization layers above the through-holes was good enough to insure satisfactory electrical paths for all metalization layers.

Examples 36–39

Additional thin-film multilevel wiring boards were fabricated by the same method as used in Example 28 except that the poly(amic acid) varnish No. 21 was replaced by Nos. 23 and 26 (see Table 3), as well as Nos. 22 and 35 (see Table 4) and that step (1) was omitted. The bow of the substrate in each of the wiring boards was negligibly small. None of the devices involved separation of polyimide film from the substrate or separation between adjacent polyimide films, and there were no observable cracks or other defects in the polyimide films. Furthermore, the step coverage of the Al metalization layers above the through-holes was good enough to insure satisfactory electrical paths for all metalization layers.

Example 40

Figure 9:
FIGS. 9(a)–(m) are cross-sectional views showing another example of the process for fabricating a copper-polyimide thin-film multilevel wiring board according to the present invention.
Figure 9:
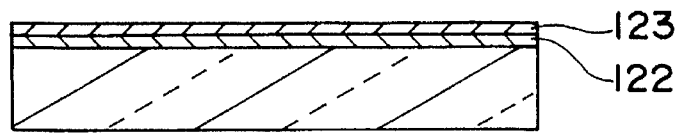
Figure 9:
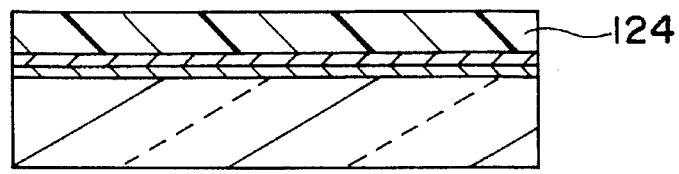
Figure 9:
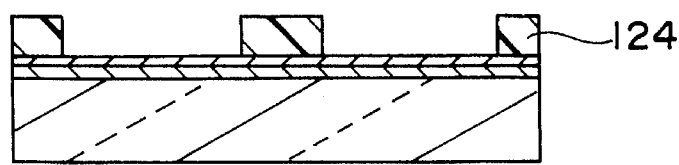
Figure 9:
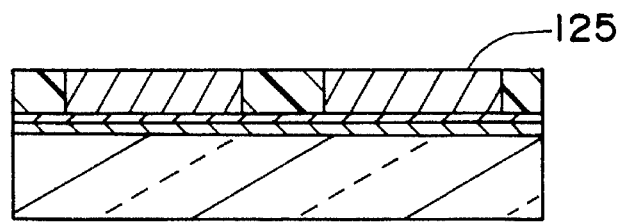
Figure 9:
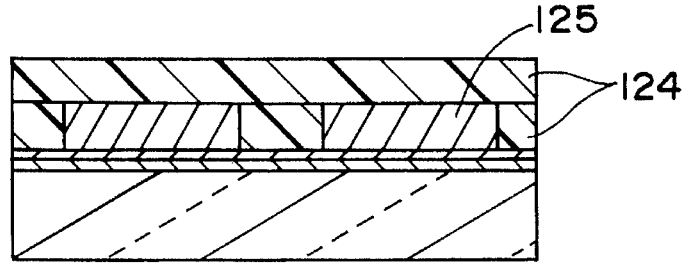
Figure 9:
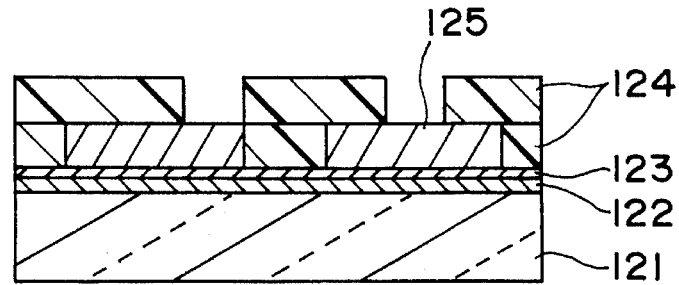
Figure 9:
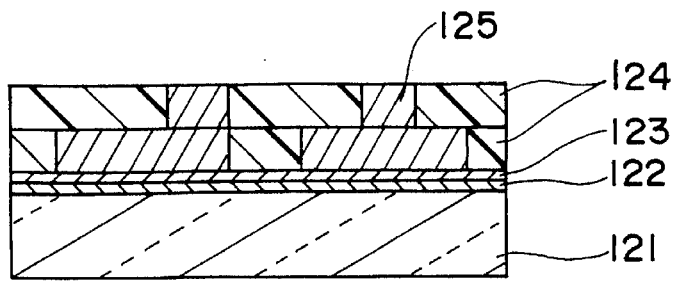
Figure 9:
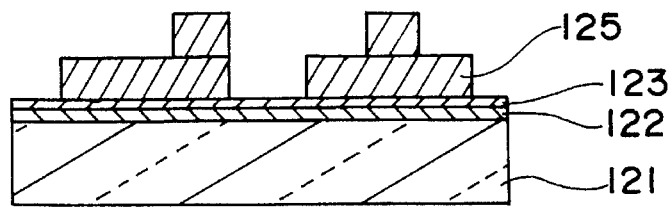
Figure 9:
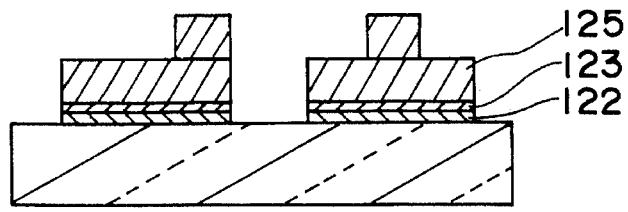
Figure 9:
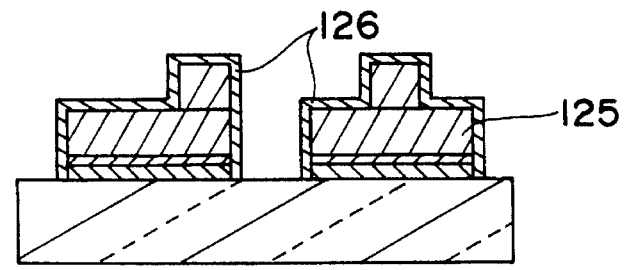
Figure 9:
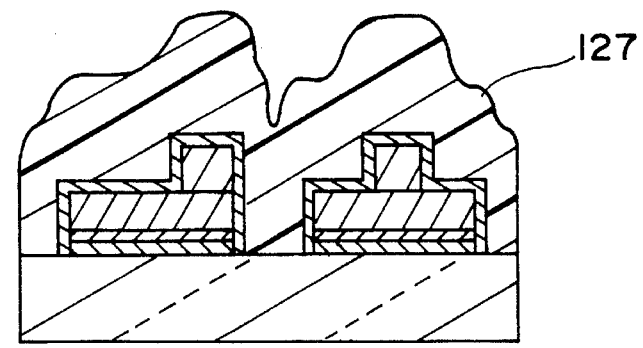
Figure 9:
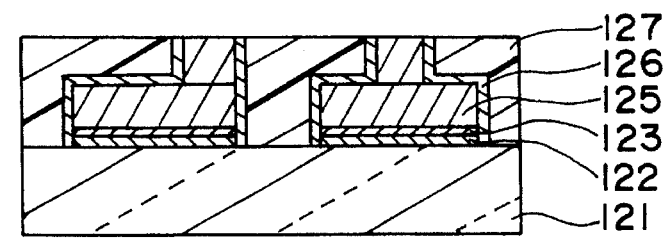

A copper-polyimide multilevel metalization structure was fabricated in accordance with the second aspect of the present invention by the following process, whose scheme is shown in FIG. 9. A square ceramic substrate 121 (FIG. 9b) was provided with tungsten conductor paths through a mullite-base ceramic layer (100 mm per side; 5 mm thick); each tungsten conductor path had a chromium layer 122 (0.05 µm) and a copper layer 123 (0.5 µm) on its top that were sputter-formed as preplating films (FIG. 9b). A positive-acting resist 124 was whirl-coated over the substrate and heated at 90° C. for 30 min in a nitrogen atmosphere. The applied resist film 124 had a thickness of 10 µm (FIG. 9c). Then, the resist was exposed to light through a mask of predetermined pattern and subsequently developed and rinsed (FIG. 9d), followed by electroplating to form a copper plate 125. The plating bath consisted of $CuSO_4/5H_2O$ (70 g/L), $H_2SO_4$ (140 g/L) and HCl (50 ppm); the current density was 1.0 A/dm$^2$; and it took 40 min to produce a Cu plate 10 µm thick (FIG. 9e). After the end of copper plating, the substrate was washed with water and vacuum-dried at 80° C. for 1 h. The steps depicted in FIGS. 9c to 9e were repeated (FIGS. 9f–9h). The resist 124 was stripped with a stripper (FIG. 9i) and cleaned with an alcoholic organic solvent. Subsequently, those parts of the preplating Cu and Cr films which did not actually serve as the basis for the subsequent Cu plating were selectively removed using suitable etchants, namely ammonium chloride base etchant for the Cu film and a mixed solution of potassium ferricyanide/ sodium hydroxide for the Cr film (FIG. 9j). After washing with water, nickel plating was conducted and the Ni plate was washed with water, followed by vacuum drying (FIG. 9k). By applying this protective Ni film to copper, the reaction between copper and the poly(amic acid) to be subsequently coated (i.e., copper oxidation) could be prevented. In the next step, poly(amic acid) varnish (No. 21) was whirl-coated and heated first at 200° C. for 30 min, then at 350° C. for 30 min in a nitrogen atmosphere. The polyimide film as the cured product had a thickness of 10 µm (FIG. 9L). The polyimide layer was rendered smooth by polishing with a tape carrying alumina particles (#500–#4000) on the surface, and the polished layer was cleaned with acetone. Thereafter, the surface of the polyimide layer was subjected to 3-min ashing with oxygen gas at a pressure of 0.5 Torr, with RF energy being applied at a frequency of 13.56 MHz for a power of 300 MHz (FIG. 9m). By repeating the steps depicted in FIGS. 9b–9m nine more times, a copper-polyimide multilevel metalization structure having ten levels of metalization was produced (total thickness of thin films: 400 µm). With the multilevel metalization structure completed in the manner described above, the final bow of the substrate was as small as 9 μm. There occurred neither separation of polyimide films from the substrate nor separation between adjacent polyimide films. Nor was there found any cracks or other defects in the films or corrosion in the metalization layers. Hence, satisfactory electrical paths were insured for all metalization layers.

Examples 41–47

Additional copper-polyimide multilevel metalization structures containing ten levels of metalization were produced by repeating the procedure of Example 40 except that the poly(amic acid) varnish was replaced by Nos. 23 and 25 (see Table 3), as well as Nos. 31, 34, 36–38 (see Table 4). In all of the completed multilevel metalization structures, the final bow of the substrate was as small as 16 μm and below. None of the devices involved separation of polyimide film from the substrate or separation between adjacent polyimide films, and there were no observable cracks or other defects in the polyimide films or corrosion in the metalization layers. Hence, satisfactory electrical paths were insured for all metalization layers.

Comparative Example 8

Poly(amic acid) varnish was synthesized from the components listed for No. 39 in Table 5 by the same method as used in Synthesis 21 (DABP: 4,4'-diaminobiphenyl). The varnish was whirl coated on a glass substrate and heated first at 200° C. for 30 min, then at 350° C. for 30 min to prepare a polyimide film 8 μm thick. The film was brittle and the elongation was no more than 2%. A multilevel wiring board was fabricated by repeating the procedure of Example 28 except that varnish No. 39 was used. Examination of the completed device revealed that separation occurred between polyimide films 114 and 116 and between polyimide films 116 and 118, demonstrating insufficient adhesion between the polyimide films. Furthermore, cracks were found to have developed around through-holes in polyimide films 114 and 116.

Comparative Example 9

Poly(amic acid) varnish was synthesized from the components listed for No. 40 in Table 5 by the same method as used in Synthesis 22. The varnish was whirl-coated on a glass substrate and heated first at 200° C. for 30 min, then at 350° C. for 30 min to prepare a polyimide film 8 μm thick. The film was not highly flexible and the elongation was no more than 4%. A multilevel wiring board was fabricated by repeating the procedure of Example 28 except that varnish No. 40 was used. Examination of the completed device revealed that although no cracking occurred in the polyimide films, separation occurred between polyimide films 114 and 116 and between polyimide films 116 and 118, demonstrating the lack of reliability in the device.

Comparative Example 10

Poly(amic acid) varnish was synthesized from the components listed for No. 41 in Table 5 by the same method as used in Synthesis 21 (DATP: 4,4"-diamino-p-terphenyl). The varnish was whirl-coated on a glass substrate and heated first at 200° C. for 30 min, then at 350° C. for 30 min to prepare a polyimide film 8 μm thick. The film was brittle and the elongation was no more than 1%. A multi level wiring board was fabricated by repeating the procedure of Example 28 except that varnish No. 41 was used. Examination of the completed device revealed that separation occurred between polyimide films 114 and 116 and between polyimide films 116 and 118, demonstrating insufficient adhesion between the polyimide films. Furthermore, cracks were found to have developed around through-holes in polyimide films 114 and 116.

Comparative Example 11

Poly(amic acid) varnish was synthesized from the components listed for No. 41 in Table 5 by the same method as used in Synthesis 23 (DATP: 4,4"-diamino-p-terphenyl). The varnish was whirl-coated on a glass substrate and heated first at 200° C. for 30 min, then at 350° C. for 30 min to prepare a polyimide film 8 μm thick. The film was brittle and the elongation was no more than 1%. A multilevel wiring board was fabricated by repeating the procedure of Example 36 except that varnish No. 41 was used. Examination of the completed device revealed that separation occurred between polyimide films 114 and 116 and between polyimide films 116 and 118, demonstrating insufficient adhesion between the polyimide films.

Comparative Examples 12 and 13

Poly(amic acid) varnish was synthesized from the components listed for No. 43 in Table 5 by the same method as used in Synthesis 21. In addition, poly(amic acid) varnish was synthesized from the components listed for No. 44 in Table 5 by the same method as used in Synthesis 22 (PDA: p-phenylenediamine; DDE: 4,4'-diaminodiphenylether). The two samples of varnish were whirl-coated on glass substrates and heated first at 200° C. for 30 min, then at 350° C. for 30 min to prepare polyimide films 8 μm thick. The films were both brittle and the elongation was no more than 3%. An attempt was made to fabricate multilevel wiring boards by repeating the procedure of Example 40 except that varnish sample Nos. 43 and 44 were used. Whichever varnish was used, separation occurred between the second and third polyimide films when the fourth level of metalization was established in the process of fabrication; thus, a complete device could not be produced.

Comparative Examples 14 and 15

Poly(amic acid) varnish was synthesized from the components listed for No. 45 in Table 5 by the same method as used in Synthesis 23. In addition, poly(amic acid) varnish was synthesized from the components listed for No. 46 in Table 5 by the same method as used in Synthesis 21. The two samples of varnish were whirl coated on glass substrates and heated first at 200° C. for 30 min, then at 350° C. for 30 min to prepare polyimide films 8 μm thick. The films would permit high elongation ($\geq 20\%$). However, the thermal expansion coefficient $\alpha$ was as high as 42 ppm/°C. for the case where varnish No. 45 was used, and 67 ppm/°C. for the case where varnish No. 46 was used; accordingly, the glass transition point Tg was as low as 265° C. and 235° C. in the respective cases. Using these samples of varnish, an attempt was made to fabricate copper-polyimide multilevel metalization structures by the same method as used in Example 40. In the process of fabrication, the bow of the substrate taken as a whole increased when the fifth level of metalization was established and the measured values of the bow were 64 μm and 78 μm in the respective cases. In addition, no complete adhesion could be achieved between the mask and the topmost layer on the substrate in the step where a photoresist was used for copper plating prior to the establishment of the fifth level of metalization, and there were great variations in pattern size. As a further problem, excessive curvature occurred in part of the third and fourth levels of copper metalization in the case where poly(amic acid) varnish No. 45 was used. In the case where poly(amic acid) varnish No. 46 was used, separation occurred between the second and third polyimide films and between the third and fourth polyimide films. Thus, a complete device could not be produced when varnish sample Nos. 45 and 46 were used.

TABLE 5

Polymer Composition for Comparative Examples 8–15

| Varnish No. | Acid dianhydride component | Amine Component | Solvent | Solids content (final viscosity in parentheses) |
|---|---|---|---|---|
| 39 | BPDA | DABP | DMAc:NMP = 1:1 (by weight) | 17% by weight (51 P) |
| 40 | BPDA | DABP:BAPE = 3:1 (by weight) | DMAc:NMP = 1:1 (by weight) | 15% by weight (56 P) |
| 41 | BPDA | DATP | DMAc:NMP = 1:1 (by weight) | 17% by weight (44 P) |
| 42 | BPDA | DATP:BAMS = 20:1 (by weight) | DMAc:NMP = 1:1 (by weight) | 16% by weight (42 P) |
| 43 | BPDA | PDA | DMAc:NMP = 1:1 (by weight) | 15% by weight (66 P) |
| 44 | PMDA | DATP:DDE = 2:1 (by weight) | DMAc:NMP = 1:1 (by weight) | 16% by weight (43 P) |
| 45 | BPDA | DDE:AEMS = 20:1 (by weight) | DMAc:NMP = 1:1 (by weight) | 14% by weight (57 P) |
| 46 | PMDA | HFBAPP | DMAc:NMP = 1:1 (by weight) | 18% by weight (52 P) |

What is claimed is:

1. A metalization structure selected from the group consisting of a semiconductor integrated circuit device, a discrete transistor device and a thin-film multilevel wiring board which uses a surface protective film formed of a polyimide that is produced by heating and dehydrating a polyimide precursor that comprises recurring units represented by the following general formula (1) and recurring units represented by the following general formula (2):

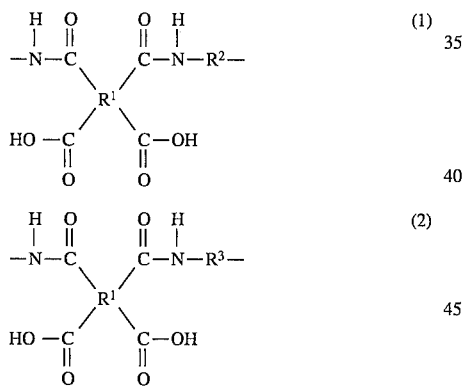

where $R^1$ is at least one tetravalent organic group having the formula

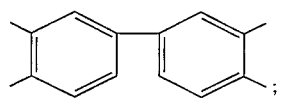

$R^2$ is at least one divalent organic group of a linear structure selected from the group consisting of

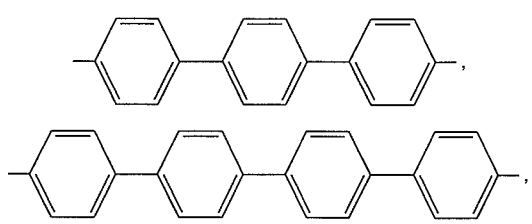

-continued

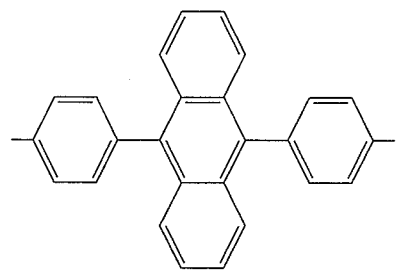

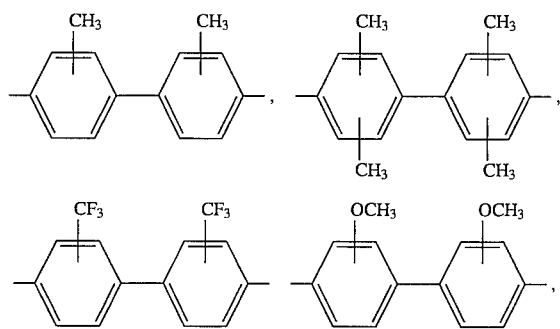

and

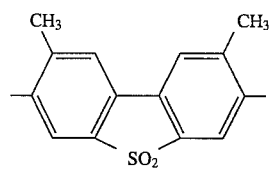

and $R^3$ is a divalent organic group of a crooked structure that has at least two aromatic rings.

2. A metalization structure according to claim 1 which uses a surface protective film made of a polyimide that is produced by heating and dehydrating a polyimide precursor in which the number of divalent groups with a linear structure that are represented by $R^2$ in general formula (1) and that of divalent organic groups with a crooked structure that are represented by $R^3$ in general formula (2) are respectively in the ranges 30–80 and 70–20, provided that the total number of the two kinds of organic groups is 100.

3. A metalization structure selected from the group consisting of a semiconductor integrated circuit device, a discrete transistor device and a thin-film multilevel wiring board which uses a surface protective film formed of a polyimide that is produced by heating and dehydrating a polyimide precursor that comprises recurring units represented by the following general formula (1), recurring units represented by the following general formula (2) and recurring units represented by the following general formula (5):

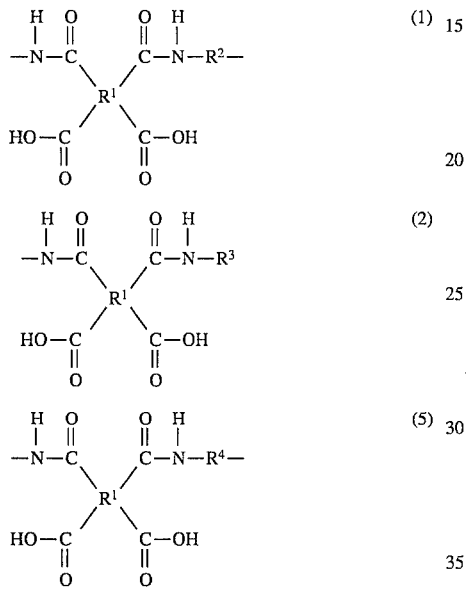

where $R^1$ is at least one tetravalent organic group having the formula

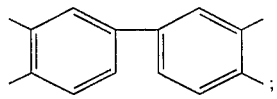

$R^2$ is at least one divalent organic group of a linear structure selected from the group consisting of

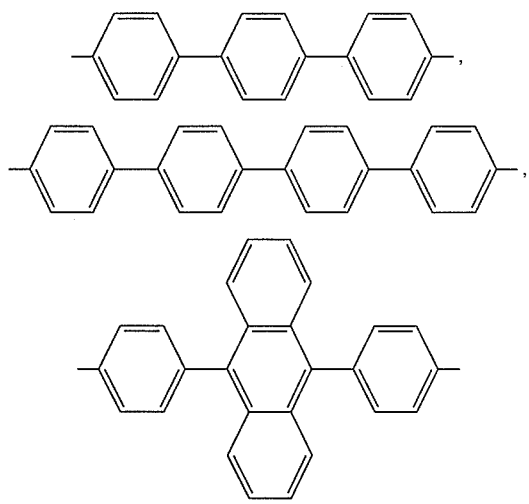

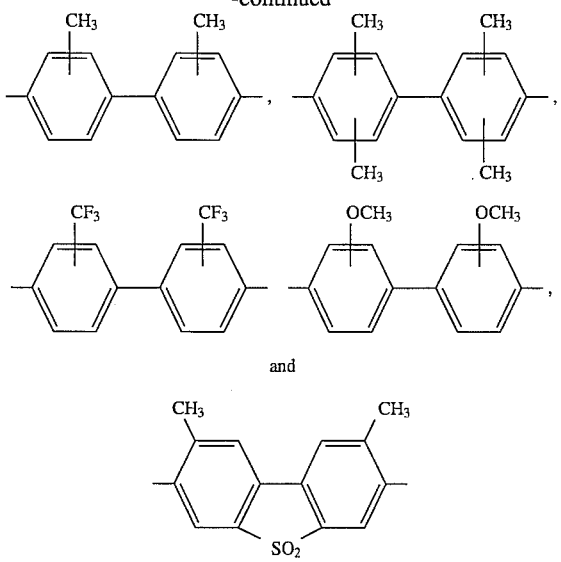

and

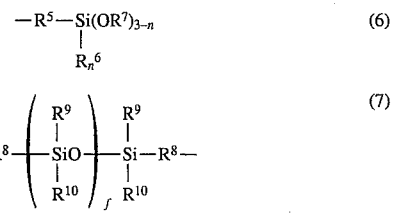

$R^3$ is a divalent organic group of a crooked structure that has at least two aromatic rings; and $R^4$ is a hydrocarbon group containing one or more silicon atoms that is represented by the following general formula (6) when it is at a terminal end of the polymer or by the following general formula (7) when it is in the polymer backbone:

$$-R^5-\underset{R_n^6}{Si(OR^7)_{3-n}} \qquad (6)$$

$$-R^8-\left(\underset{R^{10}}{\overset{R^9}{\underset{|}{|}}}SiO\right)_f\underset{R^{10}}{\overset{R^9}{\underset{|}{|}}}Si-R^8- \qquad (7)$$

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one organic group selected from the group consisting of alkyl, alkoxyalkyl and trialkylsilyl groups that have 1–5 carbon atoms; $R^9$ and $R^{10}$ are each at least one organic group selected from the group consisting of alkyl groups having 1–3 carbon atoms and aryl groups having 1–9 carbon atoms; n is an integer of 0–3; and f is 1 or 2.

4. A metalization structure according to claim 3 which uses a surface protective film made of a polyimide that is produced by heating and dehydrating a polyimide precursor in which the number of divalent organic groups with a linear structure that are represented by $R^2$ in general formula (1), the number of divalent organic groups with a crooked structure that are represented by $R^3$ in general formula (2), and the number of silicon-containing hydrocarbon groups represented by $R^4$ in general formula (2) are in the respectively ranges 30–80, 70–20 and 0.1–10, provided that the total number of the three kinds of groups is 100.

5. A metalization structure according to claim 1 which uses a surface protective film made of a polyimide that is produced by heating and dehydrating a polyimide precursor in which the divalent organic group having a crooked structure that is represented by $R^3$ in general formula (2) is at least one divalent organic group selected from the group consisting of

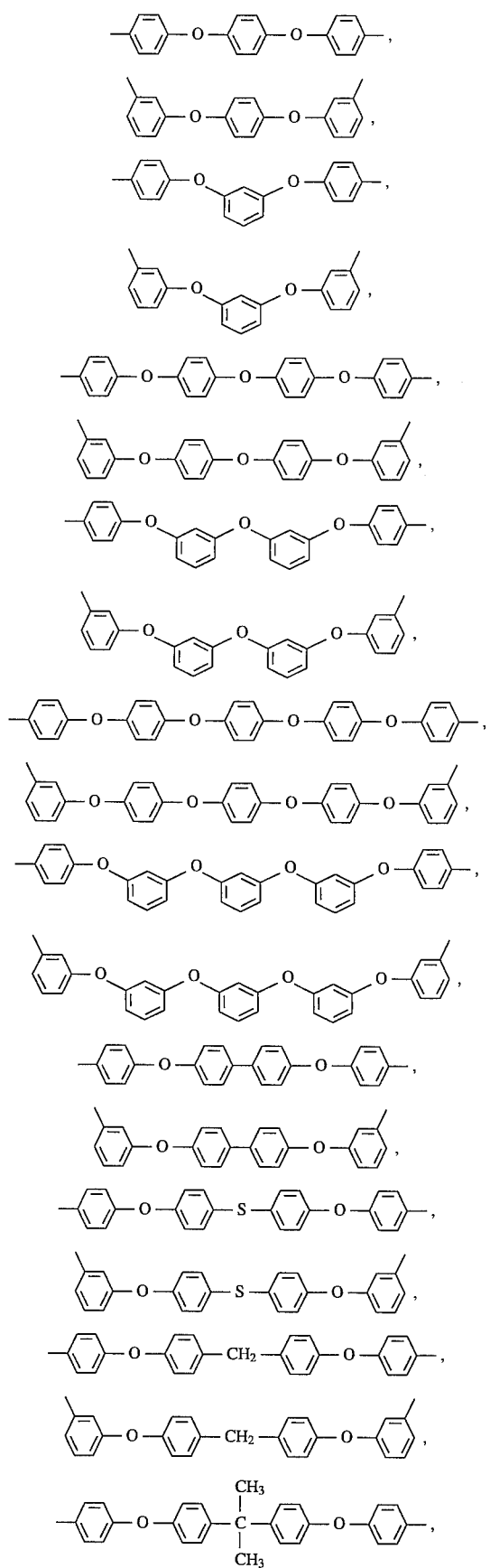

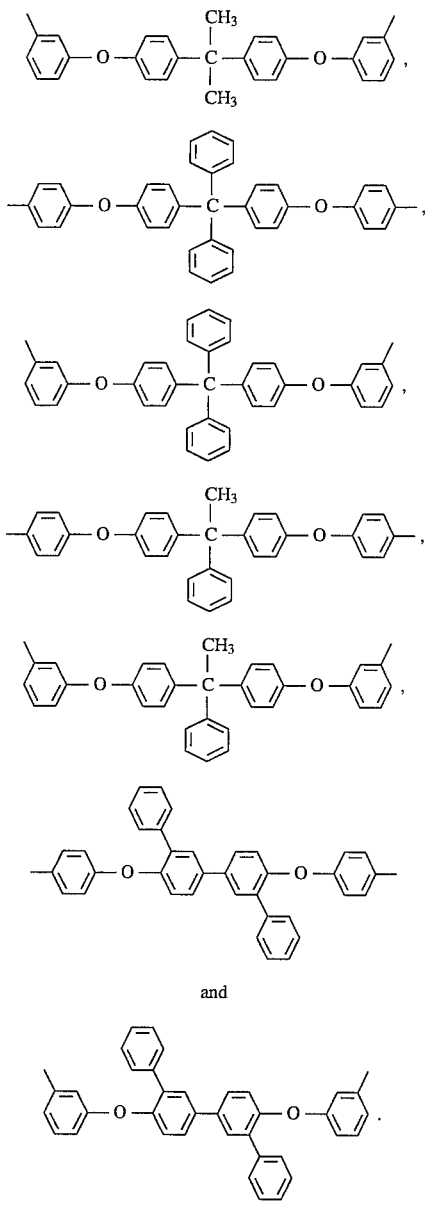

and

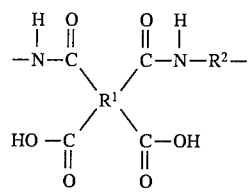

6. A metalization structure selected from the group consisting of a semiconductor integrated circuit device, a discrete transistor device and a thin-film multilevel wiring board, said structure using an α-particle shield film that is made of a polyimide produced by heating an dehydrating a polyimide precursor that comprises recurring units represented by the following general formula (1) and recurring units represented by the following general formula (2):

$$\begin{matrix} H & O & & O & H \\ | & \| & & \| & | \\ -N-C & & & C-N-R^2- \\ & \diagdown & R^1 & \diagup & \\ & HO-C & & C-OH & \\ & \| & & \| & \\ & O & & O & \end{matrix} \quad (1)$$

-continued

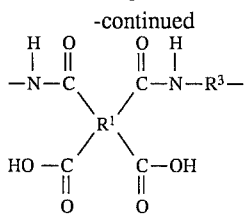  (2)

where R¹ is at least one tetravalent organic group having the formula

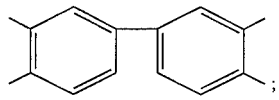;

R² is at least one divalent organic group of a linear structure selected from the group consisting of

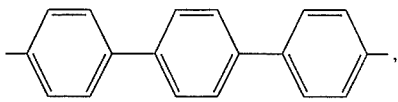,

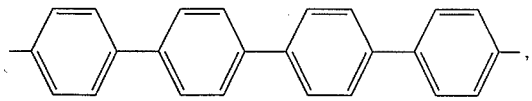,

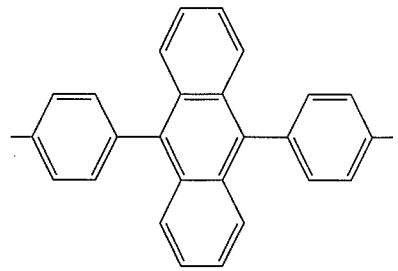

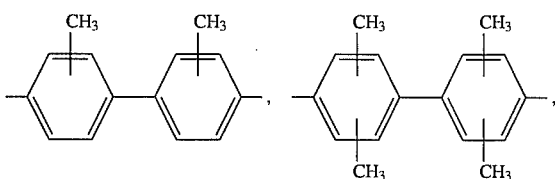

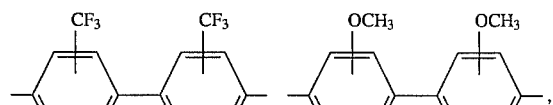

and

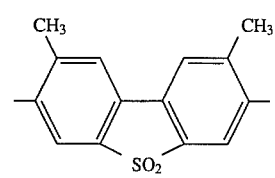

and R³ is a divalent organic group of a crooked structure that has at least two aromatic rings.

7. A metalization structure according to claim 6 which uses an α-particle shield film made of a polyimide that is produced by heating and dehydrating a polyimide precursor in which the number of divalent groups with a linear structure that are represented by R² in general formula (1) and that of divalent organic groups with a crooked structure that are represented by R³ in general formula (2) are respectively in the ranges 30–80 and 70–20, provided that the total number of the two kinds of organic groups is 100.

8. A metalization structure selected from the group consisting of a semiconductor integrated circuit device, a discrete transistor device and a thin-film multilevel wiring board, said structure using an α-particle shield film that is made of a polyimide produced by heating and dehydrating a polyimide precursor that comprises recurring units represented by the following general formula (1), recurring units represented by the following general formula (2) and recurring units represented by the following general formula (5):

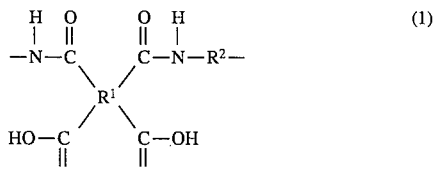  (1)

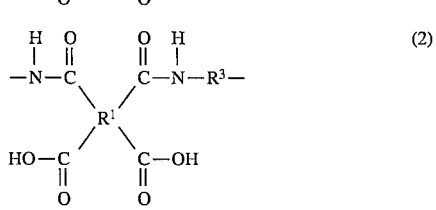  (2)

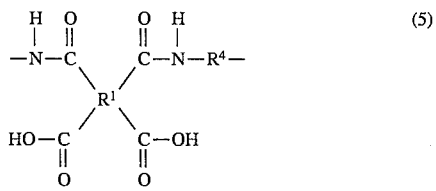  (5)

where R¹ is at least one tetravalent organic group having the formula

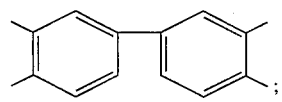;

R² is at least one divalent organic group of a linear structure selected from the group consisting of

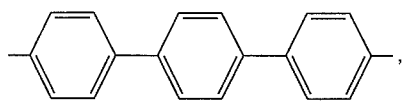,

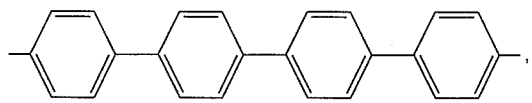,

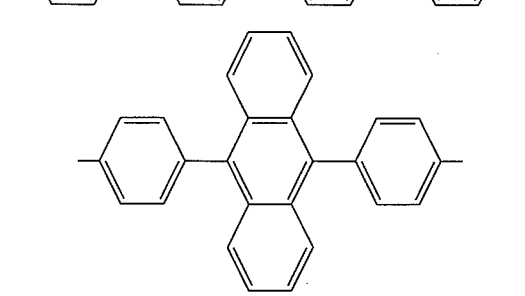

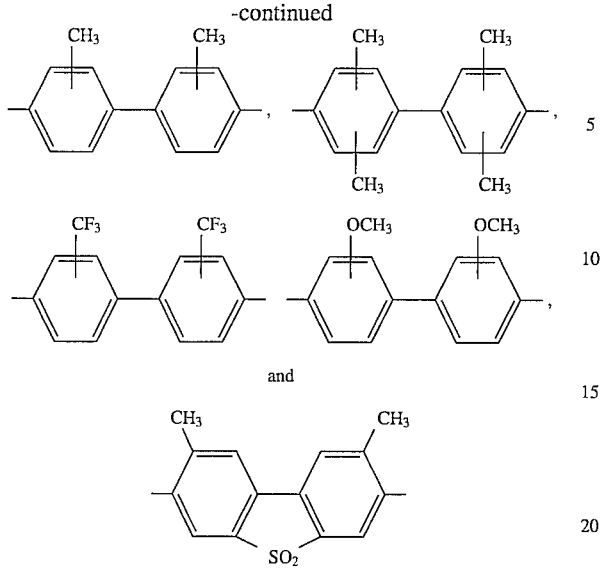

and

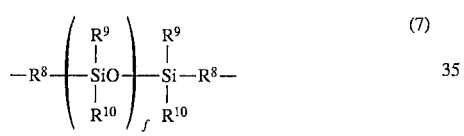

$R^3$ is a divalent organic group of a crooked structure that has at least two aromatic rings; and $R^4$ is a hydrocarbon group containing one or more silicon atoms that is represented by the following general formula (6) when it is at a terminal end of the polymer or by the following general formula (7) when it is in the polymer backbone:

  (6)

$$-R^8 \left( \begin{array}{c} R^9 \\ | \\ SiO \\ | \\ R^{10} \end{array} \right)_f \begin{array}{c} R^9 \\ | \\ Si-R^8- \\ | \\ R^{10} \end{array}$$  (7)

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one organic group selected from the group consisting of alkyl, alkoxyalkyl and trialkylsilyl groups that have 1–5 carbon atoms; $R^9$ and $R^{10}$ are each at least one organic group selected from the group consisting of alkyl groups having 1–3 carbon atoms and aryl groups having 1–9 carbon atoms; n is an integer of 0–3; and f is 1 or 2.

9. A metalization structure according to claim 8 which uses an α-particle shield film made of a polyimide that is produced by heating and dehydrating a polyimide precursor in which the number of divalent organic groups with a linear structure that are represented by $R^2$ in general formula (1), the number of divalent organic groups with a crooked structure that are represented by $R^3$ in general formula (2), and the number of silicon-containing hydrocarbon groups represented by $R^4$ in general formula (2) are respectively in the ranges of 30–80, 70–20 and 0.1–10, provided that the total number of the three kinds of groups is 100.

10. A metalization structure according to claim 6 which uses an insulating layer made of a polyimide that is produced by heating and dehydrating a polyimide precursor in which the divalent organic group having a crooked structure that is represented by $R^3$ in general formula (2) is at least one divalent organic group selected from the group consisting of

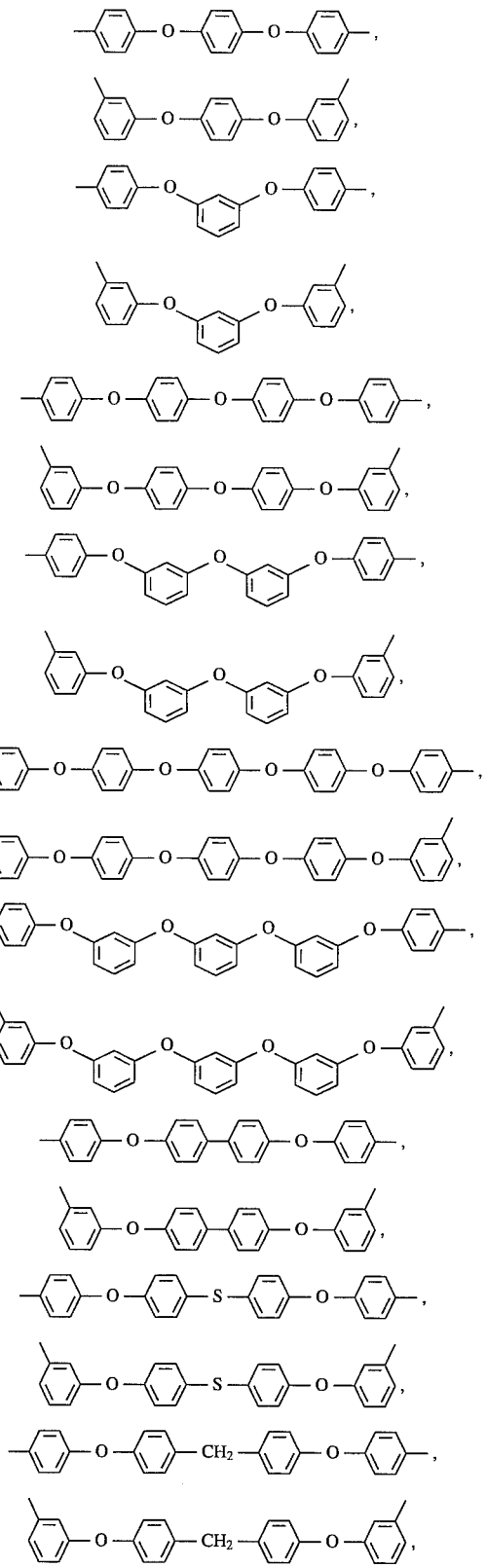

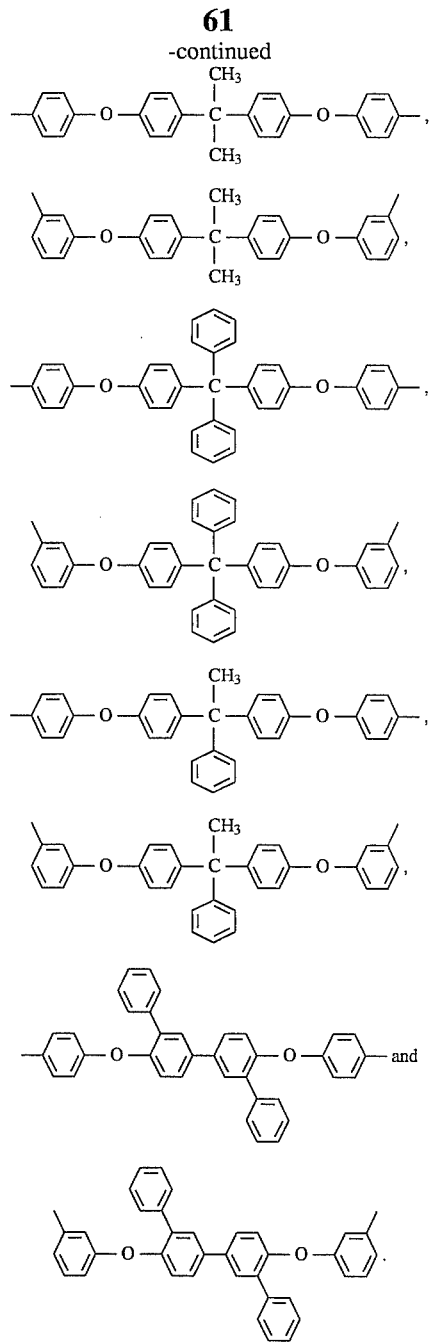

11. A metalization structure selected from the group consisting of a semiconductor integrated circuit device, a discrete transistor device and a thin-film multilevel wiring board, said structure using a metalization insulating film that is made of a polyimide produced by heating and dehydrating a polyimide precursor that comprises recurring units represented by the following general formula (1) and recurring units represented by the following general formula (2):

$$\begin{array}{c} \text{H} \quad \text{O} \qquad \text{O} \quad \text{H} \\ | \quad \| \qquad \| \quad | \\ -\text{N}-\text{C} \qquad \text{C}-\text{N}-\text{R}^2- \\ \diagdown \text{R}^1 \diagup \\ \text{HO}-\text{C} \qquad \text{C}-\text{OH} \\ \| \qquad \| \\ \text{O} \qquad \text{O} \end{array} \quad (1)$$

$$\begin{array}{c} \text{H} \quad \text{O} \qquad \text{O} \quad \text{H} \\ | \quad \| \qquad \| \quad | \\ -\text{N}-\text{C} \qquad \text{C}-\text{N}-\text{R}^3- \\ \diagdown \text{R}^1 \diagup \\ \text{HO}-\text{C} \qquad \text{C}-\text{OH} \\ \| \qquad \| \\ \text{O} \qquad \text{O} \end{array} \quad (2)$$

where $R^1$ is at least one tetravalent organic group having the formula

[structure];

$R^2$ is at least one divalent organic group of a linear structure selected from the group consisting of

[structures]

and

[structure]

and $R^3$ is a divalent organic group of a crooked structure that has at least two aromatic rings.

12. A metalization structure according to claim 11 which uses an insulating film made of a polyimide that is produced by heating and dehydrating a polyimide precursor in which the number of divalent groups with a linear structure that are represented by $R^2$ in general formula (1) and that of divalent organic groups with a crooked structure that are represented by $R^3$ in general formula (2) are respectively in the ranges 30–80 and 70–20, provided that the total number of the two kinds of organic groups is 100.

13. A metalization structure selected from the group consisting of a semiconductor integrated circuit device, a discrete transistor device and a thin-film multilevel wiring board which uses a metalization insulating film that is made of a polyimide produced by heating and dehydrating a polyimide precursor that comprises recurring units represented by the following general formula (1), recurring units represented by the following general formula (2) and recurring units represented by the following general formula (5):

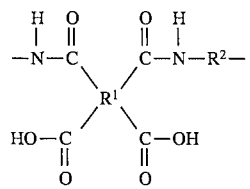  (1)

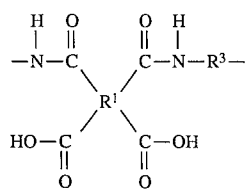  (2)

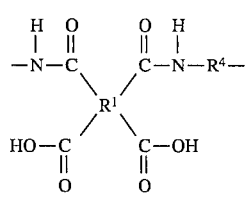  (5)

where $R^1$ is at least one tetravalent organic group having the formula

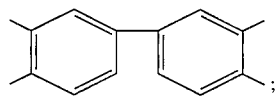;

$R^2$ is at least one divalent organic group of a linear structure selected from the group consisting of

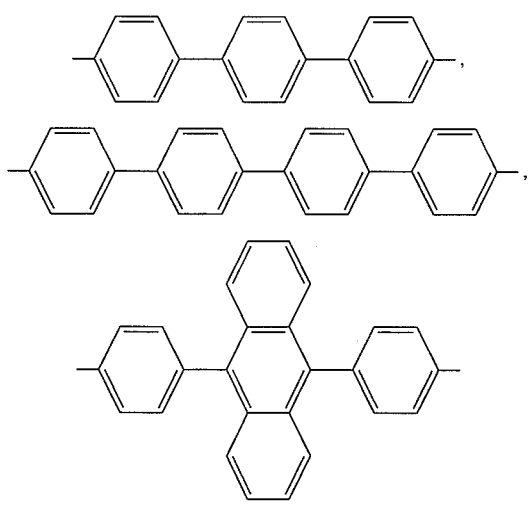

-continued

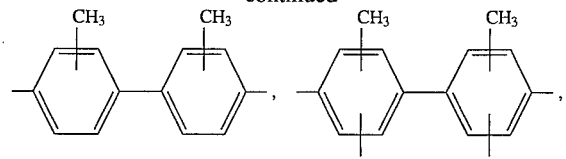

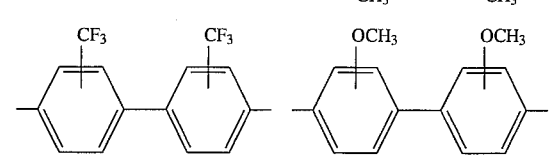

and

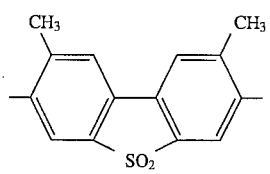

$R^3$ is a divalent organic group of a crooked structure that has at least two aromatic rings; and $R^4$ is a hydrocarbon group containing one or more silicon atoms that is represented by the following general formula (6) when it is at a terminal end of the polymer or by the following general formula (7) when it is in the polymer backbone:

  (6)

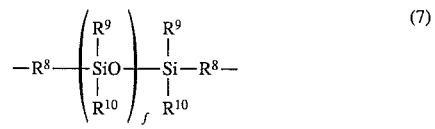  (7)

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one organic group selected from the group consisting of alkyl, alkoxyalkyl and trialkylsilyl groups that have 1–5 carbon atoms; $R^9$ and $R^{10}$ are each at least one organic group selected from the group consisting of alkyl groups having 1–3 carbon atoms and aryl groups having 1–9 carbon atoms; n is an integer of 0–3; and f is 1 or 2.

14. A metalization structure according to claim 13 which uses an insulating film made of a polyimide that is produced by heating and dehydrating a polyimide precursor in which the number of divalent organic groups with a linear structure that are represented by $R^2$ in general formula (1), the number of divalent organic groups with a crooked structure that are represented by $R^3$ in general formula (2), and the number of silicon-containing hydrocarbon groups represented by $R^4$ in general formula (2) are respectively in the ranges of 30–80, 70–20 and 0.1–10, provided that the total number of the three kinds of groups is 100.

15. A metalization structure according to claim 11 which uses an insulating layer made of a polyimide that is produced by heating and dehydrating a polyimide precursor in which the divalent organic group having a crooked structure that is represented by $R^3$ in general formula (2) is at least one divalent organic group selected from the group consisting of

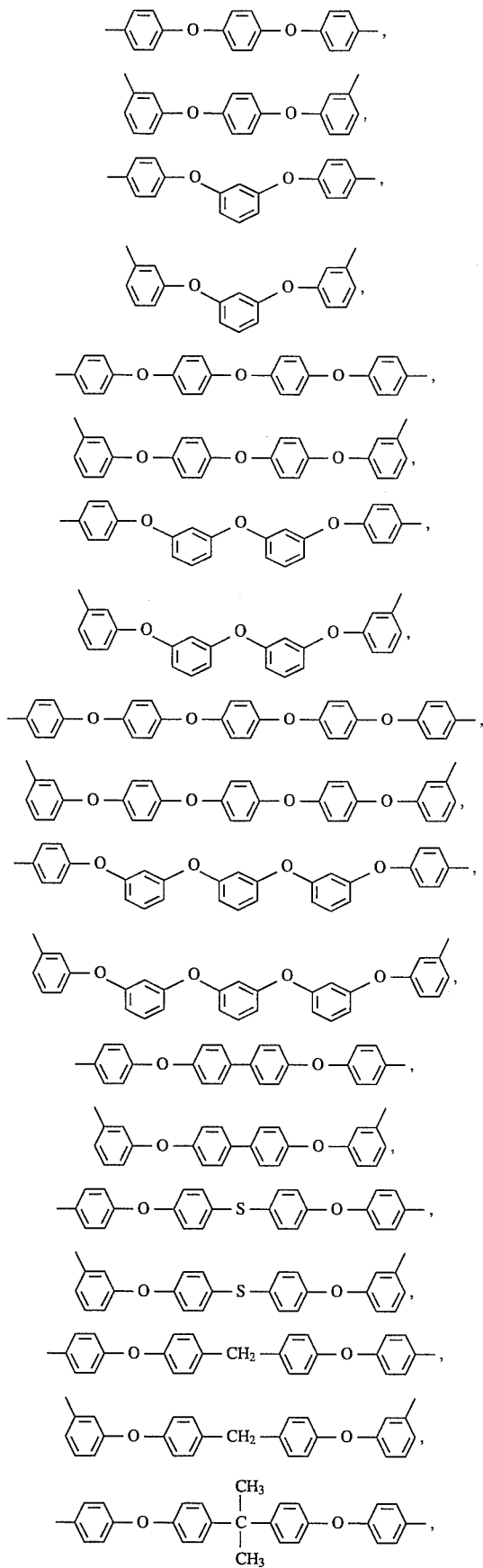

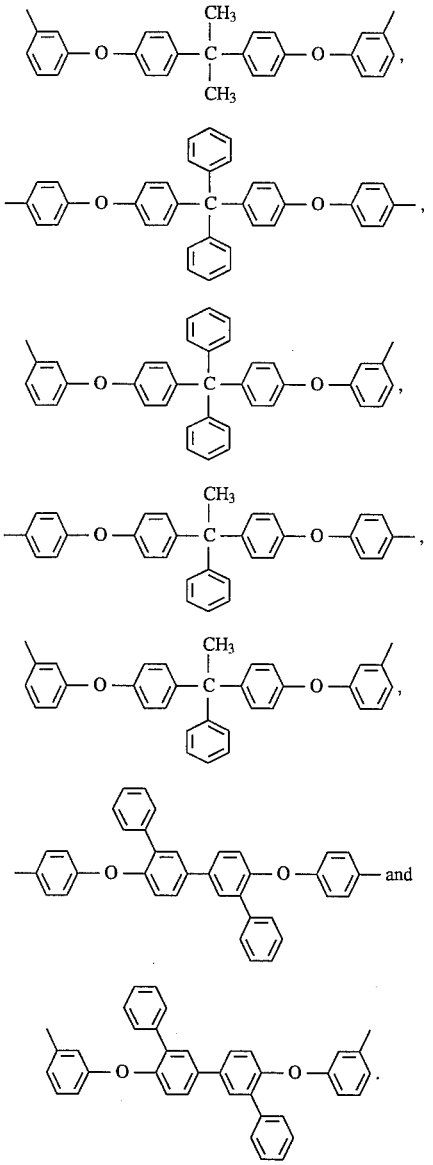

16. A metalization structure according to any one of claims 1–15 is a semiconductor integrated circuit device.

17. A metalization structure according to any one of claims 1–5 which is a discrete transistor device.

18. A metalization structure according to any one of claims 11–15 which is a thin-film multilevel wiring board.

19. A metalization structure according to claim 1, wherein said structure comprises a substrate, a conductor layer formed in a pattern on the substrate and said protective film overlying the conductor layer and the substrate.

20. A metalization structure according to claim 11, wherein said structure comprises a multilevel metalization structure including a substrate, a conductor layer formed in a pattern on the substrate, said insulating film overlying the conductor layer and the substrate and another conductor layer formed in a pattern over the insulating film.

21. A metalization structure according to claim 19, wherein said structure comprises a multilevel metalization structure including a substrate, a conductor layer formed in a pattern on the substrate and the inner-level insulating film overlying the conductor layer and the substrate and another conductor layer formed in a pattern over said insulating film.

22. A metalization structure selected from the group consisting of a semiconductor integrated circuit device, a discrete transistor device and a thin-film multilevel wiring board which uses an inter-level insulating film made of a polyimide that is produced by heating and dehydrating a polyimide precursor which contains in the molecular chain a plurality of recurring units that are represented by the following formula (21):

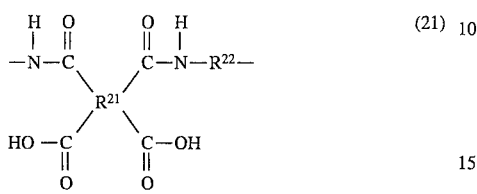
(21)

wherein $R^{21}$ is a tetravalent organic group; $R^{22}$ is at least one divalent organic group selected consisting of:

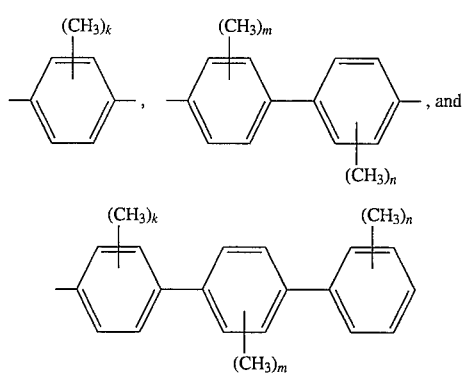

where k, m and n are each an integer of 0–4, provided that k, m and n are not zero at the same time, the surface of said polyimide being then subjected to ashing.

23. A metalization structure according to claim 22, wherein the recurring units represented by the general formula (21) are contained in an amount of at least 10% by weight of the total molecular chain of said polyimide precursor.

24. A metalization structure selected from the group consisting of a semiconductor integrated circuit device, a discrete transistor device and a thin-film multilevel wiring board which uses a surface protective film formed of a polyimide that is produced by heating and dehydrating a polyimide precursor that comprises recurring units represented by the following general formula (1) and recurring units represented by the following general formula (2):

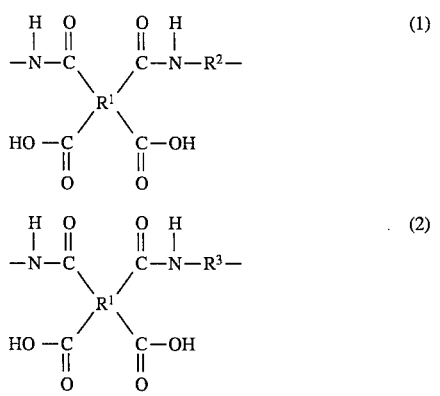
(1)

(2)

where $R^1$ is at least one tetravalent organic group selected from the group consisting of

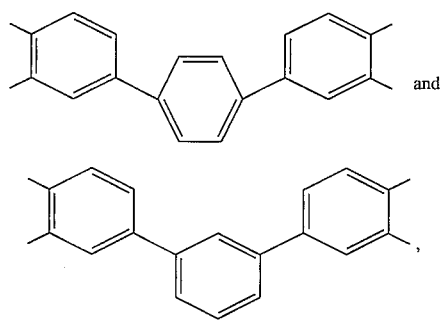
and $R^2$ is at least one divalent organic group of a linear structure selected from the group consisting of

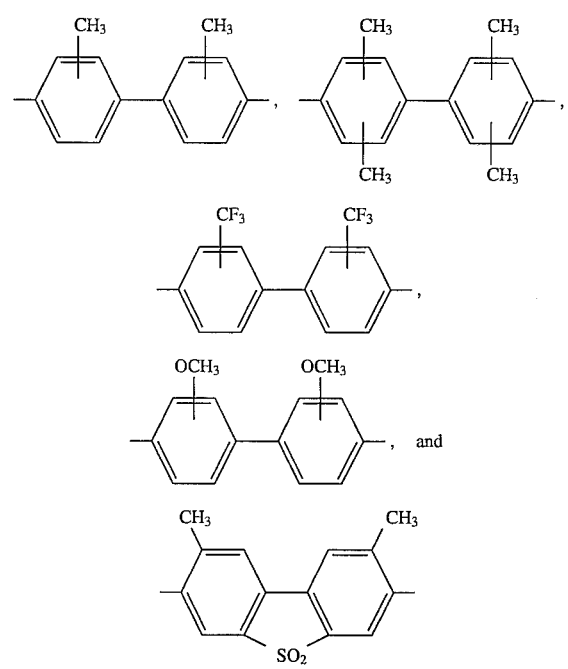
, and and $R^3$ is a divalent organic group of a crooked structure that has at least two aromatic rings.

25. A metalization structure according to claim 24 which uses a surface protective film made of a polyimide that is produced by heating and dehydrating a polyimide precursor in which the number of divalent groups with a linear structure that are represented by $R^2$ in general formula (1) and that of divalent organic groups with a crooked structure that are represented by $R^3$ in general formula (2) are respectively in the ranges 30–80 and 70–20, provided that the total number of the two kinds of organic groups is 100.

26. A metalization structure selected from the group consisting of a semiconductor integrated circuit device, a discrete transistor device and a thin-film multilevel wiring board which uses a surface protective film formed of a polyimide that is produced by heating and dehydrating a polyimide precursor that comprises recurring units represented by the following general formula (1), recurring units represented by the following general formula (2) and recurring units represented by the following general formula (5):

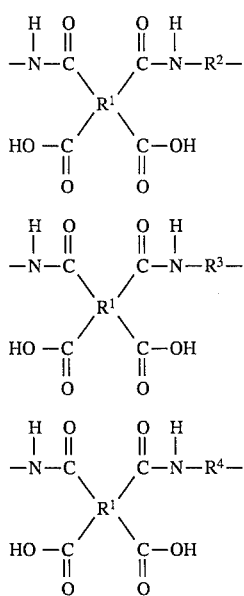

(1)

(2)

(5)

where $R^1$ is at least one tetravalent organic group selected from the group consisting of

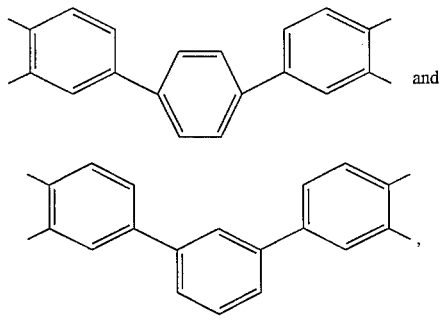

and $R^2$ is at least one divalent organic group of a linear structure selected from the group consisting of

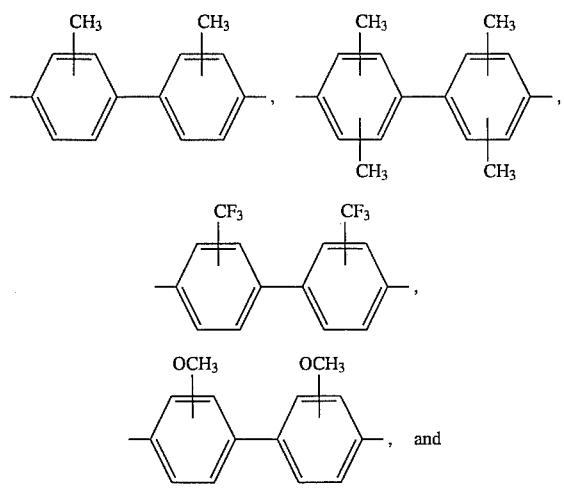

and

-continued

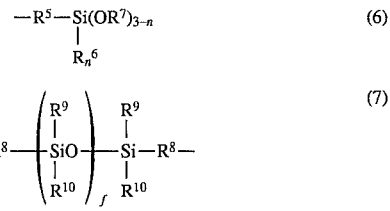

$R^3$ is a divalent organic group of a crooked structure that has at least two aromatic rings; and $R^4$ is a hydrocarbon group containing one or more silicon atoms that is represented by the following general formula (6) when it is at a terminal end of the polymer or by the following general formula (7) when it is in the polymer backbone:

$$-R^5-\underset{R_n^6}{Si(OR^7)_{3-n}} \quad (6)$$

$$-R^8-\left(\underset{R^{10}}{\overset{R^9}{\underset{|}{SiO}}}\right)_f \underset{R^{10}}{\overset{R^9}{\underset{|}{Si}}}-R^8- \quad (7)$$

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one organic group selected from the group consisting of alkyl, alkoxyalkyl and trialkylsilyl groups that have 1–5 carbon atoms; $R^9$ and $R^{10}$ are each at least one organic group selected from the group consisting of alkyl groups having 1–3 carbon atoms and aryl groups having 1–9 carbon atoms; n is an integer of 0–3; and f is 1 or 2.

27. A metalization structure according to claim 26 which uses a surface protective film made of a polyimide that is produced by heating and dehydrating a polyimide precursor in which the number of divalent organic groups with a linear structure that are represented by $R^2$ in general formula (1), the number of divalent organic groups with a crooked structure that are represented by $R^3$ in general formula (2), and the number of silicon-containing hydrocarbon groups represented by $R^4$ in general formula (2) are respectively in the ranges 30–80, 70–20 and 0.1–10, provided that the total number of the three kinds of organic groups is 100.

28. A metalization structure according to claim 24 which uses a surface protective film made of a polyimide that is produced by heating and dehydrating a polyimide precursor in which the divalent organic group having a crooked structure that is represented by $R^3$ in general formula (2) is at least one divalent organic group selected from the group consisting of:

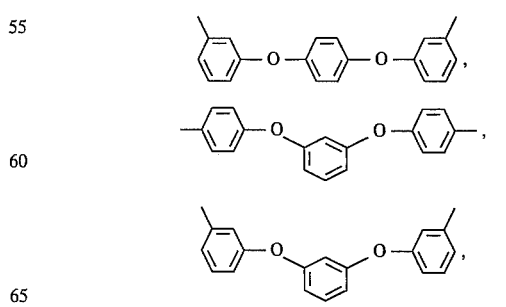

71
-continued

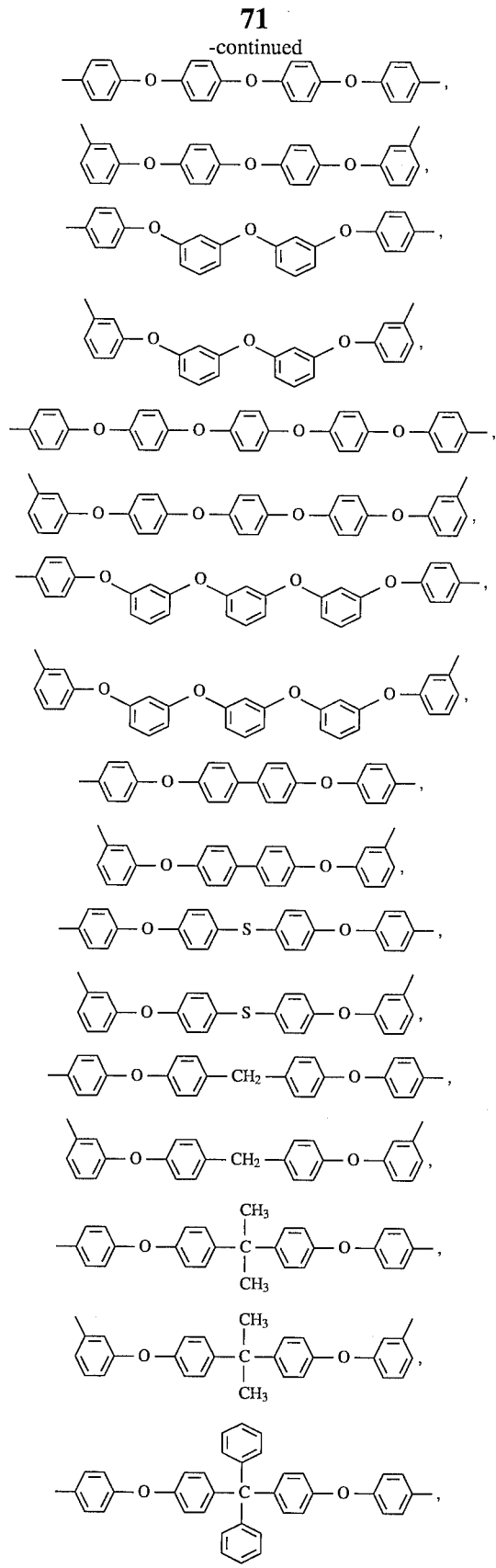

72
-continued

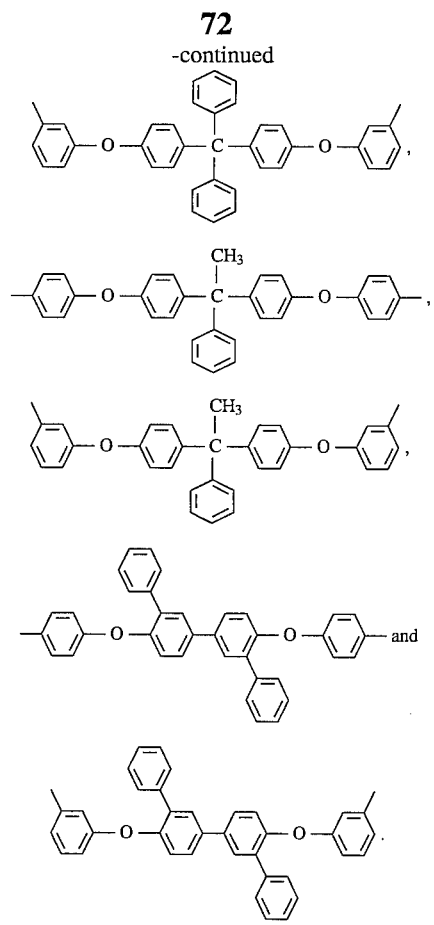

29. A metalization structure selected from the group consisting of a semiconductor integrated circuit device, a discrete transistor device and a thin-film multilevel wiring board, said structure using an α-particle shield film that is made of a polyimide produced by heating and dehydrating a polyimide precursor that comprises recurring units represented by the following general formula (1) and recurring units represented by the following general formula (2):

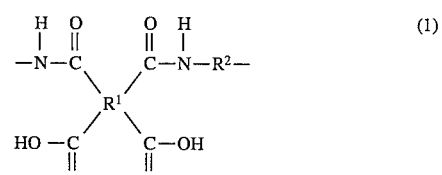 (1)

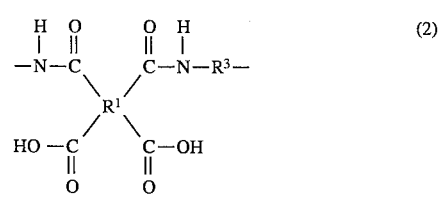 (2)

where $R^1$ is at least one tetravalent organic group selected from the group consisting of

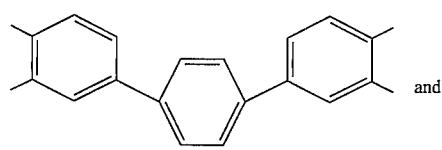 and

-continued

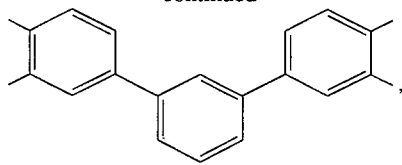

$R^2$ is at least one divalent organic group of a linear structure selected from the group consisting of

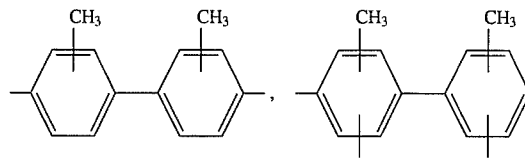

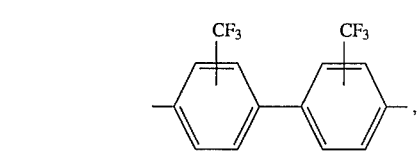

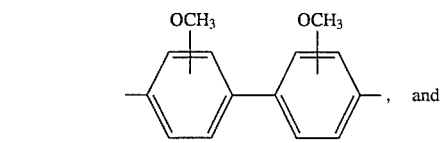

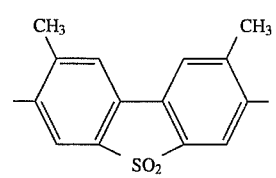

and $R^3$ is a divalent organic group of a crooked structure that has at least two aromatic rings.

30. A metalization structure according to claim 29 which uses an α-particle shield film made of a polyimide that is produced by heating and dehydrating a polyimide precursor in which the number of divalent groups with a linear structure that are represented by $R^2$ in general formula (1) and that of divalent organic groups with a crooked structure that are represented by $R^3$ in general formula (2), are respectively in the ranges 30–80 and 70–20, provided that the total number of the two kinds of organic groups is 100.

31. A metalization structure selected from the group consisting of a semiconductor integrated circuit device, a discrete transistor device and a thin-film multilevel wiring board, said structure using an α-particle shield film that is made of a polyimide produced by heating and dehydrating a polyimide precursor that comprises recurring units represented by the following general formula (1), recurring units represented by the following general formula (2) and recurring units represented by the following general formula (5):

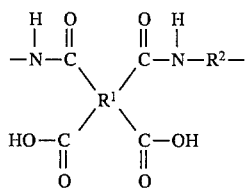

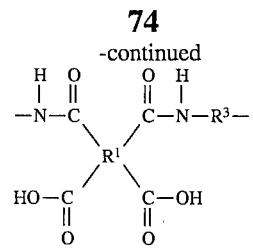

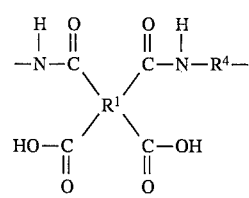

where $R^1$ is at least one tetravalent organic group selected from the group consisting of

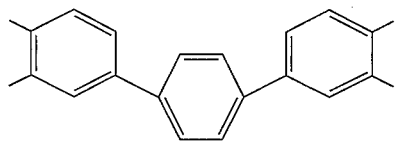

and

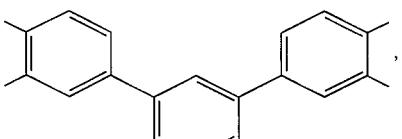

$R^2$ is at least one divalent organic group of a linear structure selected from the group consisting of

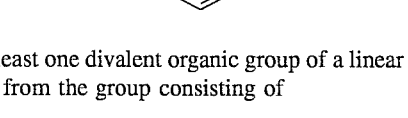

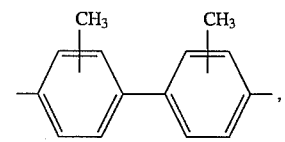

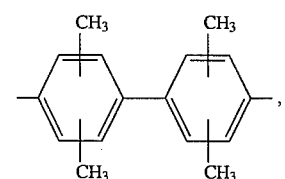

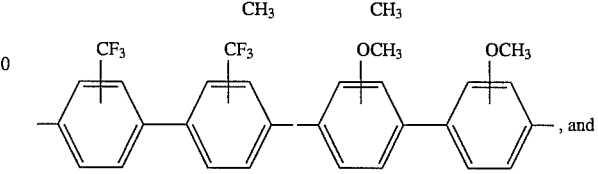

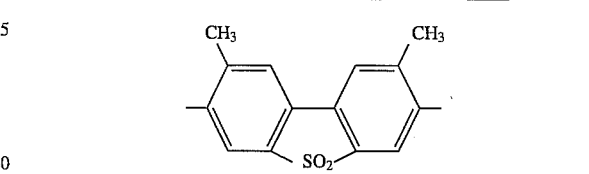

$R^3$ is a divalent organic group of a crooked structure that has at least two aromatic rings; and $R^4$ is a hydrocarbon group containing one or more silicon atoms that is represented by the following general formula (6) when it is at a terminal end of the polymer or by the following general formula (7) when it is in the polymer backbone:

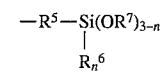  (6)

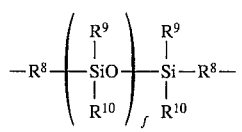  (7)

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one organic group selected from the group consisting of alkyl, alkoxyalkyl and trialkylsilyl groups that have 1–5 carbon atoms; $R^9$ and $R^{10}$ are each at least one organic group selected from the group consisting of alkyl groups having 1–3 carbon atoms and aryl groups having 1–9 carbon atoms; n is an integer of 0–3; and f is 1 or 2.

32. A metalization structure according to claim 31 which uses an α-particle shield film made of of a polyimide that is produced by heating and dehydrating a polyimide precursor in which the number of divalent organic groups with a linear structure that are represented by $R^2$ in general formula (1), the number of divalent organic groups with a crooked structure that are represented by $R^3$ in general formula (2), and the number of silicon-containing hydrocarbon groups represented by $R^4$ in general formula (2) are respectively in the ranges 30–80, 70–20 and 0.1–10, provided that the total number of the three kinds of organic groups is 100.

33. A metalization structure according to claim 29 which uses an insulating layer made of a polyimide that is produced by heating and dehydrating a polyimide precursor in which the divalent organic group having a crooked structure that is represented by $R^3$ in general formula (2) is at least one divalent organic group selected from the group consisting of:

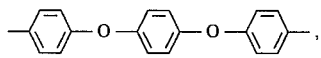

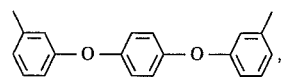

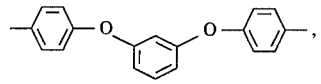

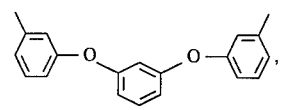

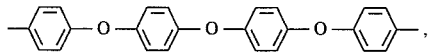

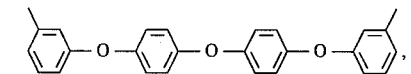

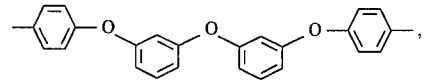

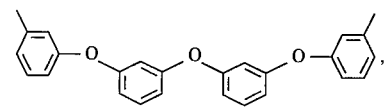

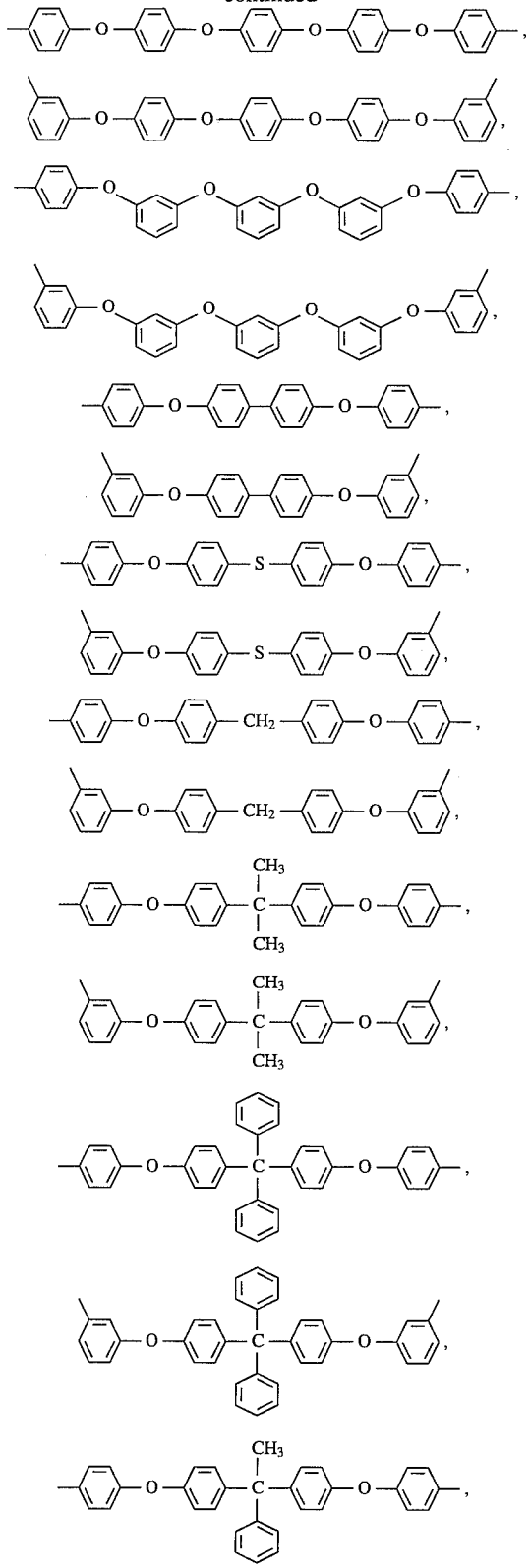

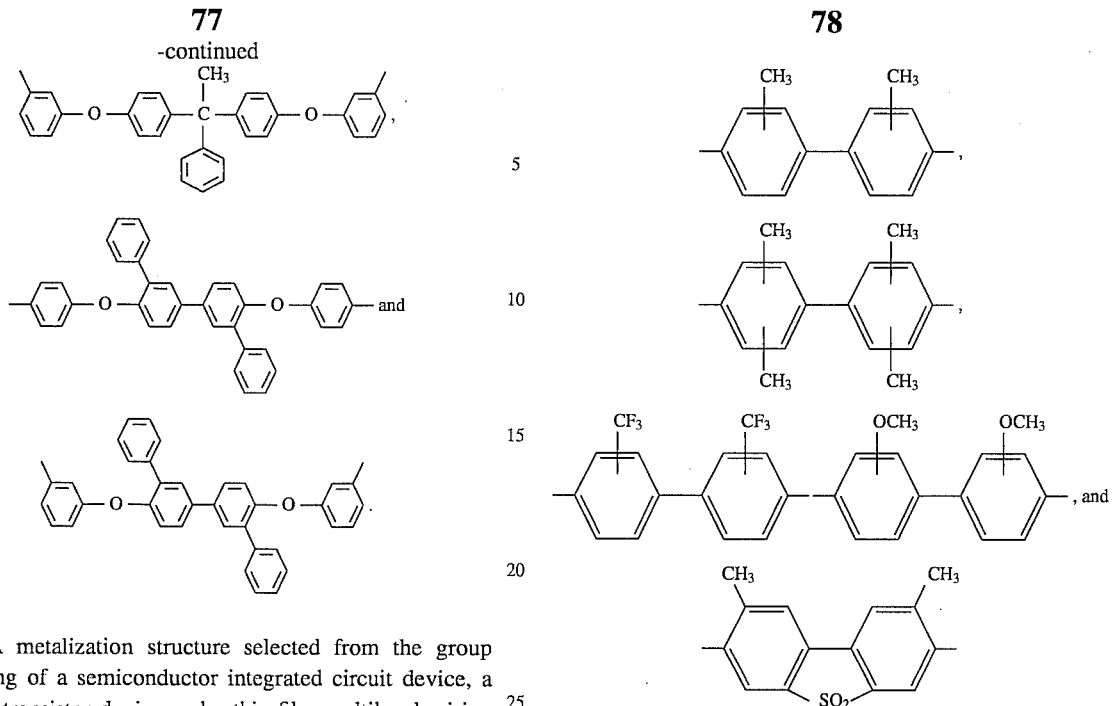

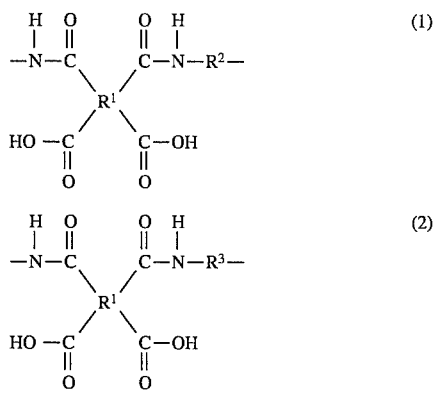

34. A metalization structure selected from the group consisting of a semiconductor integrated circuit device, a discrete transistor device and a thin-film multilevel wiring board, said structure using a metalization insulating film that is made of a polyimide produced by heating and dehydrating a polyimide precursor that comprises recurring units represented by the following general formula (1) and recurring units represented by the following general formula (2):

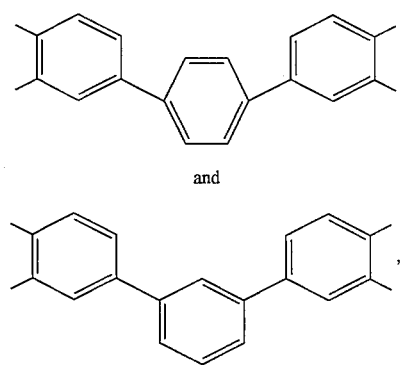

where $R^1$ is at least one tetravalent organic group selected from the group consisting of

[structures shown above]

and

[structure shown]

$R^2$ is at least one divalent organic group of a linear structure selected from the group consisting of and $R^3$ is a divalent organic group of a crooked structure that has at least two aromatic rings.

35. A metalization structure according to claim 34 which uses an insulating film made of a polyimide that is produced by heating and dehydrating a polyimide precursor in which the number of divalent groups with a linear structure that are represented by $R^2$ in general formula (1) and that of divalent organic groups with a crooked structure that are represented by $R^3$ in general formula (2), are respectively in the ranges 30–80 and 70–20, provided that the total number of the two kinds of organic groups is 100.

36. A metalization structure selected from the group consisting of a semiconductor integrated circuit device, a discrete transistor device and a thin-film multilevel wiring board which uses a metalization insulating film that is made of a polyimide produced by heating and dehydrating a polyimide precursor that comprises recurring units represented by the following general formula (1), recurring units represented by the following general formula (2) and recurring units represented by the following general formula (5):

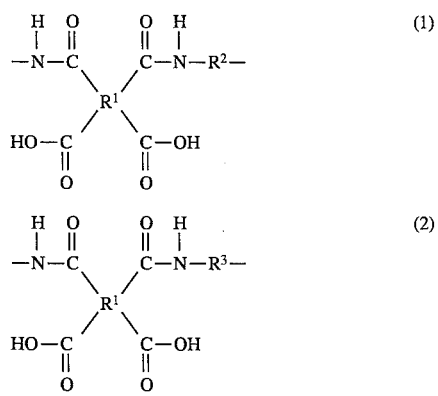

-continued

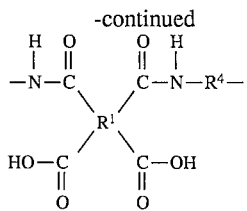
(5)

where $R^1$ is at least one tetravalent organic group selected from the group consisting of

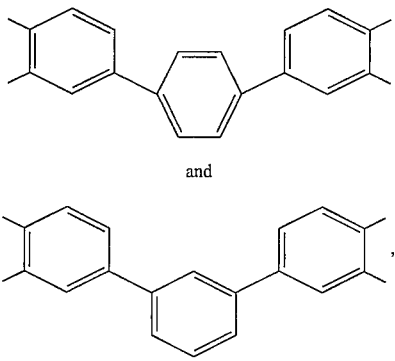

and $R^2$ is at least one divalent organic group of a linear structure selected from the group consisting of

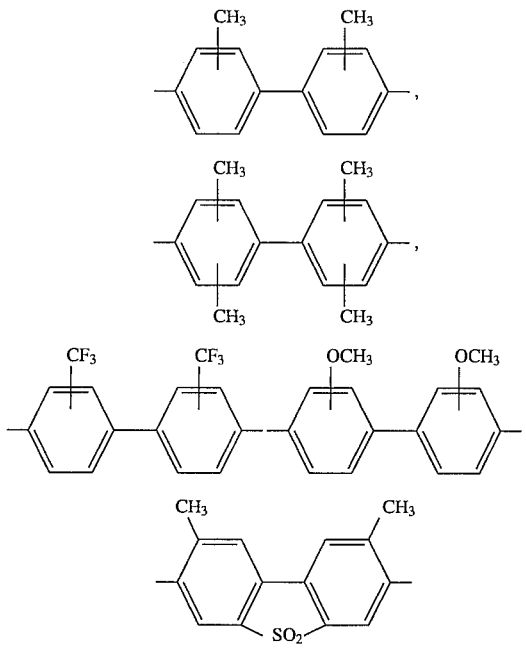

$R^3$ is a divalent organic group of a crooked structure that has at least two aromatic rings; and $R^4$ is a hydrocarbon group containing one or more silicon atoms that is represented by the following general formula (6) when it is at a terminal end of the polymer or by the following general formula (7) when it is in the polymer backbone:

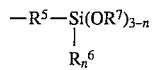
(6)

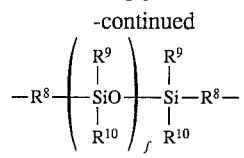
(7)

where $R^5$ and $R^8$ are each a hydrocarbon group having 1–9 carbon atoms or a saturated alkyl group of 1–7 carbon atoms that contains an ether bond; $R^6$ is a hydrocarbon group having 1–3 carbon atoms; $R^7$ is at least one organic group selected from the group consisting of alkyl, alkoxyalkyl and trialkylsilyl groups that have 1–5 carbon atoms; $R^9$ and $R^{10}$ are each at least one organic group selected from the group consisting of alkyl groups having 1–3 carbon atoms and aryl groups having 1–9 carbon atoms; n is an integer of 0–3; and f is 1 or 2.

37. A metalization structure according to claim 36 which uses an insulating film made of a polyimide that is produced by heating and dehydrating a polyimide precursor in which the number of divalent groups with a linear structure that are represented by $R^2$ in general formula (1), the number of divalent organic groups with a crooked structure that are represented by $R^3$ in general formula (2), and the number of silicon-containing hydrocarbon groups represented by $R^4$ in general formula (2) are respectively in the ranges of 30–80, 70–20 and 0.1–10, provided that the total number of the three kinds of organic groups is 100.

38. A metalization structure according to claim 34 which uses an insulating layer made of a polyimide that is produced by heating and dehydrating a polyimide precursor in which the divalent organic group having a crooked structure that is represented by $R^3$ in general formula (2) is at least one divalent organic group selected from the group consisting of:

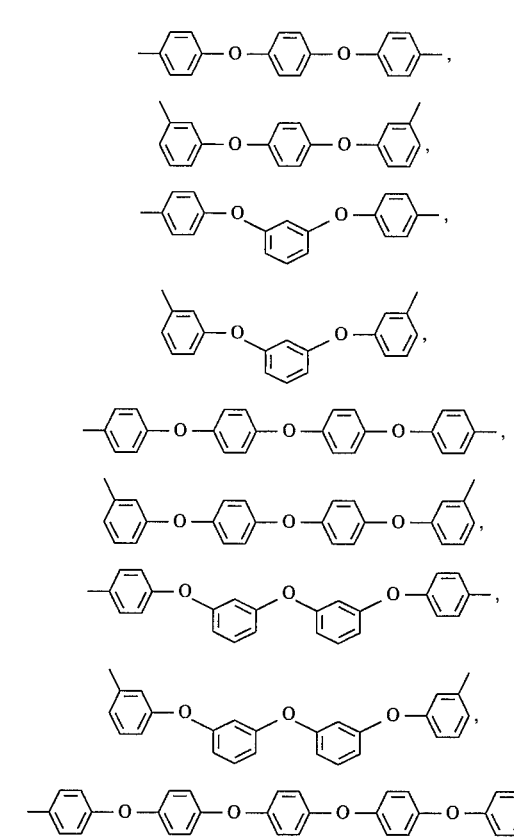

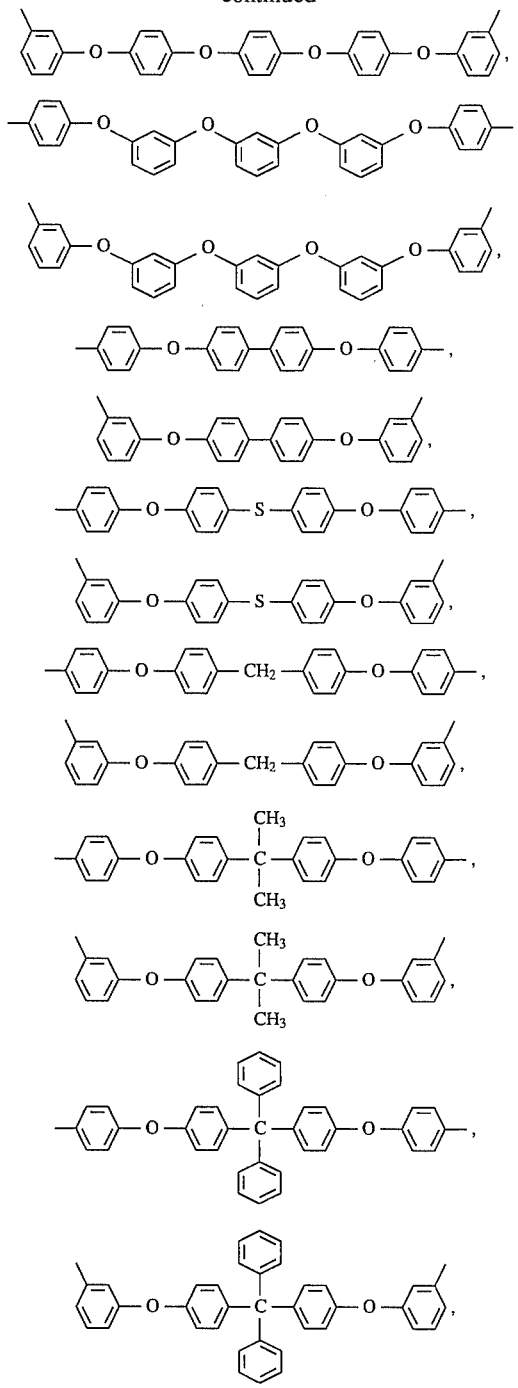

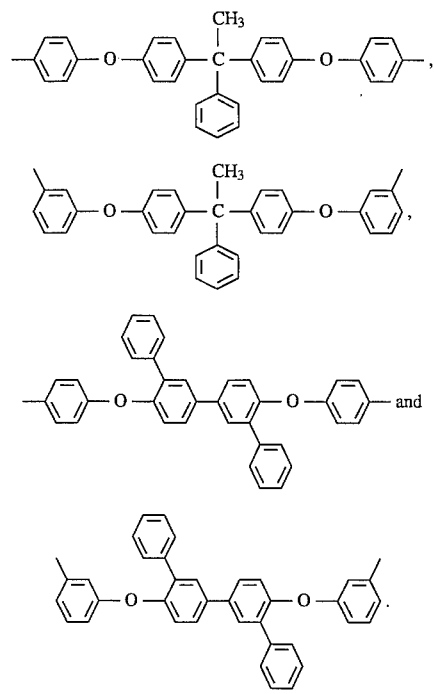

39. A metalization structure according to any one of claims 24–38 is a semiconductor integrated circuit device.

40. A metalization structure according to any one of claims 24–38 which is a discrete transistor device.

41. A metalization structure according to any one of claims 34–38 which is a thin-film multilevel wiring board.

42. A metalization structure according to claim 24, wherein said structure comprises a substrate, a conductor layer formed in a pattern on the substrate and said protective film overlying the conductor layer and the substrate.

43. A metalization structure according to claim 34, wherein said structure comprises a multilevel metalization structure including a substrate, a conductor layer formed in a pattern on the substrate, said insulating film overlying the conductor layer and the substrate and another conductor layer formed in a pattern over the insulating film.

* * * * *